US012765012B2

(12) United States Patent
Liaw

(10) Patent No.: US 12,765,012 B2
(45) Date of Patent: Oct. 13, 2026

(54) SEMICONDUCTOR DEVICES WITH NANOSTRUCTURES ARRANGED END-TO-END

(71) Applicant: Taiwan Semiconductor Manufacturing Co., Ltd., Hsinchu (TW)

(72) Inventor: Jhon Jhy Liaw, Zhudong Township (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 586 days.

(21) Appl. No.: 18/193,445

(22) Filed: Mar. 30, 2023

(65) Prior Publication Data

US 2024/0332356 A1 Oct. 3, 2024

(51) Int. Cl.

| | |
|---|---|
| ***H10D 62/10*** | (2025.01) |
| ***H10D 30/01*** | (2025.01) |
| ***H10D 30/43*** | (2025.01) |
| ***H10D 30/67*** | (2025.01) |
| ***H10D 64/01*** | (2025.01) |

(Continued)

(52) U.S. Cl.

CPC ......... *H10D 62/121* (2025.01); *H10D 30/014* (2025.01); *H10D 30/43* (2025.01); *H10D 30/6735* (2025.01); *H10D 30/6757* (2025.01); *H10D 62/115* (2025.01); *H10D 64/017* (2025.01); *H10D 84/0167* (2025.01); *H10D 84/038* (2025.01); *H10D 84/83* (2025.01)

(58) Field of Classification Search

CPC ............... H10D 62/121; H10D 30/014; H10D 30/6757; H10D 64/017; H10D 84/0167; H10D 30/6735; H10D 30/43; H10D 84/038; H10D 84/83; H10D 62/115

See application file for complete search history.

(56) References Cited

U.S. PATENT DOCUMENTS

| | | | |
|---|---|---|---|
| 9,209,247 | B2 | 12/2015 | Colinge et al. |
| 9,236,267 | B2 | 1/2016 | De et al. |

(Continued)

FOREIGN PATENT DOCUMENTS

| | | | |
|---|---|---|---|
| TW | 202125820 | A | 7/2021 |
| TW | 202139296 | A | 10/2021 |
| TW | 202238935 | A | 10/2022 |

*Primary Examiner* — Norman D Richards
*Assistant Examiner* — Sean Ayers Winters
(74) *Attorney, Agent, or Firm* — Cooper Legal Group, LLC

(57) ABSTRACT

A device includes a stack of first nanostructures, wherein each first nanostructure includes a channel region with a first width; a first gate on the stack of first nanostructures, wherein each first nanostructure is surrounded by the first gate, wherein a distance from a first end of the first gate to an adjacent first nanostructure is a first distance; a stack of second nanostructures, wherein each second nanostructure includes a channel region with a second width greater than the first width; a second gate on the stack of second nanostructures, wherein each second nanostructure is surrounded by the second gate, wherein a second distance from a first end of the second gate to an adjacent second nanostructure is greater than the first distance; and a first isolation structure extending continuously from the first end of the first gate to the first end of the second gate.

20 Claims, 54 Drawing Sheets

(51) Int. Cl.

*H10D 84/01* (2026.01)
*H10D 84/03* (2025.01)
*H10D 84/83* (2025.01)

(56) References Cited

U.S. PATENT DOCUMENTS

| | | | | |
|---|---|---|---|---|
| 9,412,817 | B2 | 8/2016 | Yang et al. | |
| 9,412,828 | B2 | 8/2016 | Ching et al. | |
| 9,472,618 | B2 | 10/2016 | Oxland | |
| 9,502,265 | B1 | 11/2016 | Jiang et al. | |
| 9,520,482 | B1 | 12/2016 | Chang et al. | |
| 9,536,738 | B2 | 1/2017 | Huang et al. | |
| 9,576,814 | B2 | 2/2017 | Wu et al. | |
| 9,608,116 | B2 | 3/2017 | Ching et al. | |
| 2019/0189771 | A1* | 6/2019 | Dasgupta | H10D 8/051 |
| 2020/0006340 | A1* | 1/2020 | Lilak | H10D 30/43 |
| 2020/0066725 | A1* | 2/2020 | Bhuwalka | H10D 84/0172 |
| 2021/0134949 | A1* | 5/2021 | Xie | H10D 30/6735 |
| 2021/0202498 | A1* | 7/2021 | Liaw | H01L 21/02603 |
| 2022/0302136 | A1 | 9/2022 | Wang et al. | |
| 2022/0336453 | A1* | 10/2022 | Ju | H10D 30/014 |
| 2023/0005910 | A1 | 1/2023 | Park et al. | |
| 2023/0084182 | A1* | 3/2023 | Hasan | H10D 62/121<br>257/213 |

* cited by examiner

SEMICONDUCTOR DEVICES WITH NANOSTRUCTURES ARRANGED END-TO-END

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
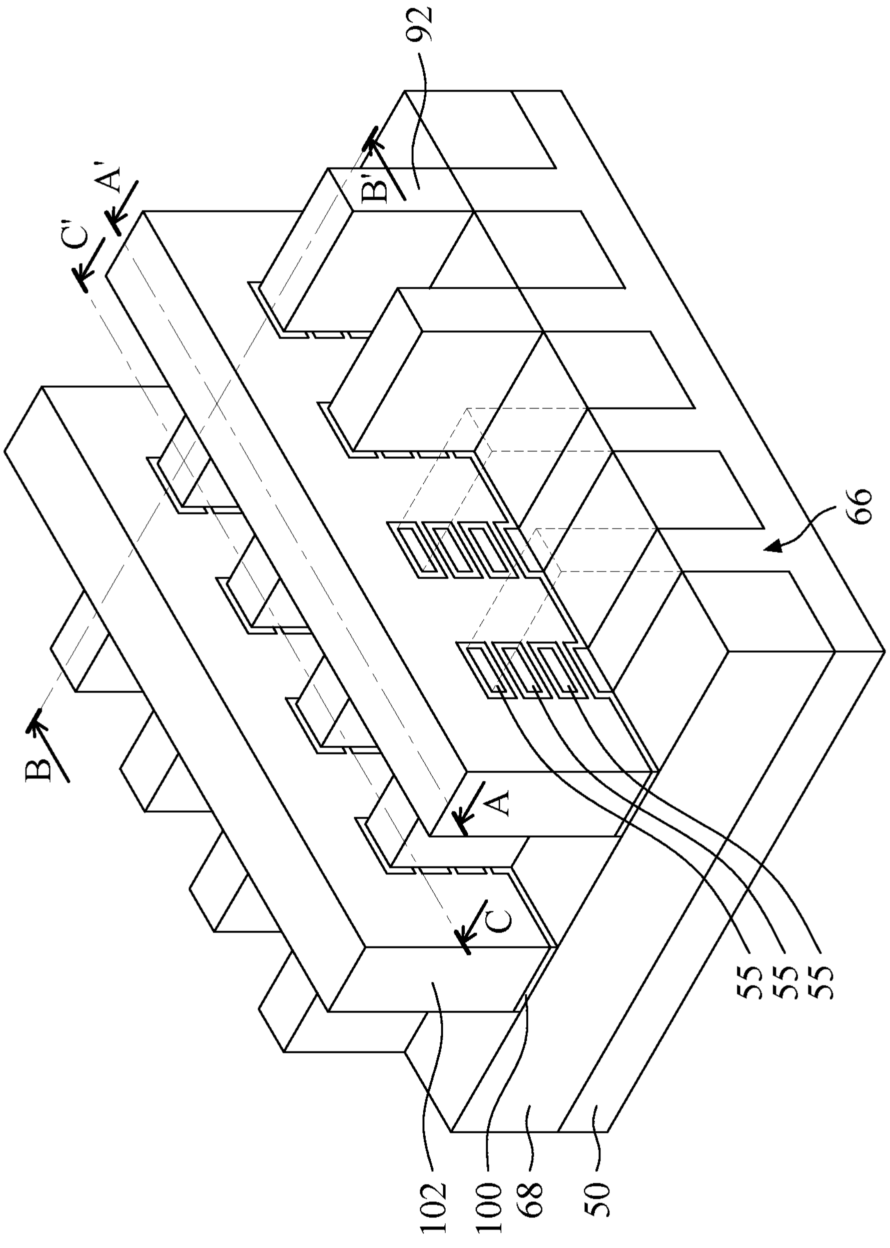
FIG. 1 illustrates an example of a nanostructure field-effect transistor (nano-FET) in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as “beneath,” “below,” “lower,” “above,” “upper” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments describe the formation of a device comprising multiple nano-FETs having various channels of various widths and gate structures of various sizes. For example, a device may have first nano-FETs having a smaller channel width and second nano-FETs having a larger channel width. In some embodiments, the nano-FETs are in a CMOS configuration in which an n-type nano-FET and a p-type nano-FET share a single continuous gate structure. The gate end distance between the channel and the end of the gate structure of a nano-FET may be controlled according to the channel width of the nano-FET. For example, a nano-FET having a smaller channel width may be formed having a smaller gate end distance to reduce capacitance, and a nano-FET having a larger channel width may be formed having a larger gate end distance to reduce resistance. The gate end distance may be controlled by controlling the size and placement of gate cut isolation regions. Embodiments herein describe the formation of a device comprising different nano-FETs having different gate end distances, which can allow for improved device performance.

Embodiments are described below in a particular context, a die comprising nano-FETs. Various embodiments may be applied, however, to dies comprising other types of transistors (e.g., fin field effect transistors (FinFETs), planar transistors, or the like) in lieu of or in combination with the nano-FETs.

FIG. 1 illustrates an example of nano-FETs (e.g., nanowire FETs, nanosheet FETs (Nano-FETs), gate-all-around (“GAA”) FETs, or the like) in a three-dimensional view, in accordance with some embodiments. The nano-FETs comprise nanostructures 55 (e.g., nanosheets, nanowires, or the like) over fins 66 on a substrate 50 (e.g., a semiconductor substrate), wherein the nanostructures 55 act as channel regions for the nano-FETs. The nanostructure 55 may include p-type nanostructures, n-type nanostructures, or a combination thereof. Isolation regions 68 are disposed between adjacent fins 66, which may protrude above and from between neighboring isolation regions 68. Although the isolation regions 68 are described/illustrated as being separate from the substrate 50, as used herein, the term “substrate” may refer to the semiconductor substrate alone or a combination of the semiconductor substrate and the isolation regions. Additionally, although a bottom portion of the fins 66 are illustrated as being single, continuous materials with the substrate 50, the bottom portion of the fins 66 and/or the substrate 50 may comprise a single material or a plurality of materials. In this context, the fins 66 refer to the portion extending between the neighboring isolation regions 68.

Gate dielectric layers 100 are over top surfaces of the fins 66 and along top surfaces, sidewalls, and bottom surfaces of the nanostructures 55. Gate electrodes 102 are over the gate dielectric layers 100. Epitaxial source/drain regions 92 are disposed on the fins 66 on opposing sides of the gate dielectric layers 100 and the gate electrodes 102. Source/drain region(s) 92 may refer to a source or a drain, individually or collectively dependent upon the context.

FIG. 1 further illustrates reference cross-sections that are used in later figures. Cross-section A-A' is along a longitudinal axis of a gate electrode 98 and in a direction, for example, perpendicular to the direction of current flow between the epitaxial source/drain regions 92 of a nano-FET. Cross-section B-B' is perpendicular to cross-section A-A' and is parallel to a longitudinal axis of a fin 66 of the nano-FET and in a direction of, for example, a current flow between the epitaxial source/drain regions 92 of the nano-FET. Cross-section C-C' is parallel to cross-section A-A' and extends through epitaxial source/drain regions of the nano-FETs. Subsequent figures refer to these reference cross-sections for clarity.

Some embodiments discussed herein are discussed in the context of nano-FETs formed using a gate-first process. In other embodiments, a gate-last process may be used. An example embodiment manufactured using a gate-last process is described below for FIG. 36. Also, some embodiments contemplate aspects used in planar devices, such as planar FETs or in fin field-effect transistors (FinFETs).

FIGS. 2 through 24C are cross-sectional views of intermediate stages in the manufacturing of nano-FETs, in accordance with some embodiments. FIGS. 2 through 5, 6A, 13A, 14A, 15A, 16A, 17A, 18A, 19A, 20A, 21A, 22A, 23A, and 24A illustrate reference cross-section A-A' illustrated in FIG. 1. FIGS. 6B, 7B, 8B, 9B, 10B, 11B, 11C, 12B, 12D, 13B, 14B, 15B, 16B, 17B, 18B, 19B, 20B, 21B, 22B, 23B, and 24B illustrate reference cross-section B-B' illustrated in FIG. 1. FIGS. 7A, 8A, 9A, 10A, 11A, 12A, 12C, 13C, 22C, 23C, and 24C illustrate reference cross-section C-C' illustrated in FIG. 1.

Figure 2:
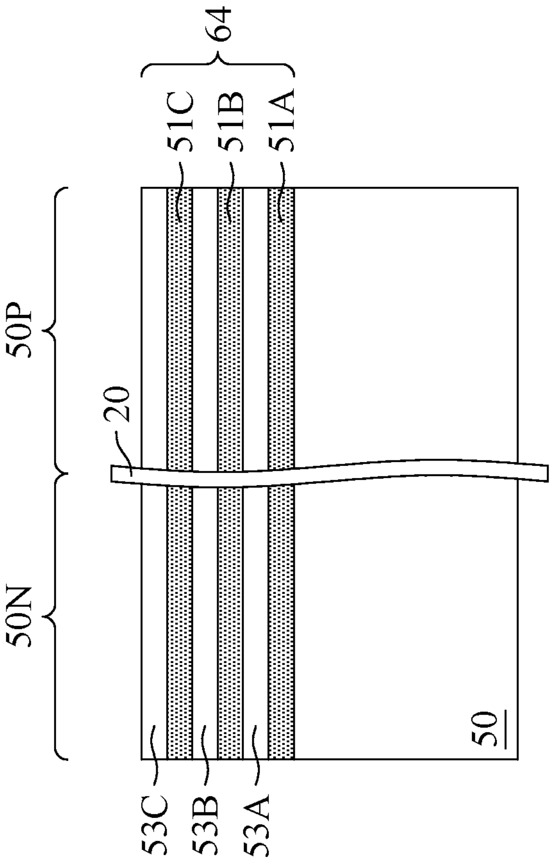
FIGS. 2, 3, 4, 5, 6A, 6B, 7A, 7B, 8A, 8B, 9A, 9B, 10A, 10B, 11A, 11B, 11C, 12A, 12B, 12C, 12D, 13A, 13B, 13C, 14A, 14B, 15A, 15B, 16A, 16B, 17A, 17B, 18A, 18B, 19A, 19B, 20A, 20B, 21A, 21B, 22A, 22B, 22C, 23A, 23B, 23C, 24A, 24B, and 24C are cross-sectional views of intermediate stages in the manufacturing of nano-FETs, in accordance with some embodiments.

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

The substrate 50 has an n-type region 50N and a p-type region 50P. The n-type region 50N can be for forming n-type devices, such as NMOS transistors, e.g., n-type nano-FETs, and the p-type region 50P can be for forming p-type devices, such as PMOS transistors, e.g., p-type nano-FETs. The n-type region 50N may be physically separated from the p-type region 50P (as illustrated by divider 20), and any number of device features (e.g., other active devices, doped regions, isolation structures, etc.) may be disposed between the n-type region 50N and the p-type region 50P. In other cases, the n-type region 50N may be adjacent or contiguous with the p-type region 50P. Although one n-type region 50N and one p-type region 50P are illustrated, any number of n-type regions 50N and p-type regions 50P may be provided.

Further in FIG. 2, a multi-layer stack 64 is formed over the substrate 50. The multi-layer stack 64 includes alternating layers of first semiconductor layers 51A-C (collectively referred to as first semiconductor layers 51) and second semiconductor layers 53A-C (collectively referred to as second semiconductor layers 53). For purposes of illustration and as discussed in greater detail below, the first semiconductor layers 51 will be removed and the second semiconductor layers 53 will be patterned to form channel regions of nano-FETs in the n-type region 50N and channel regions of nano-FETs in the p-type region 50P. In other embodiments, the second semiconductor layers 53 may be removed and the first semiconductor layers 51 may be patterned to form channel regions of nano-FETs in the n-type region 50N and/or channel regions of nano-FETs in the p-type region 50P. In some embodiments, the channel regions in both the n-type region 50N and the p-type region 50P may have a same material composition (e.g., silicon, or another semiconductor material) and be formed simultaneously.

The multi-layer stack 64 is illustrated as including three layers of each of the first semiconductor layers 51 and the second semiconductor layers 53 for illustrative purposes. In other embodiments, the multi-layer stack 64 may include any number of the first semiconductor layers 51 and the second semiconductor layers 53. Each of the layers of the multi-layer stack 64 may be epitaxially grown using a process such as chemical vapor deposition (CVD), atomic layer deposition (ALD), vapor phase epitaxy (VPE), molecular beam epitaxy (MBE), or the like. Other deposition processes, such as low pressure CVD (LPCVD), atomic layer CVD (ALCVD), ultrahigh vacuum CVD (UHVCVD), reduced pressure CVD (RPCVD), a combination thereof, or the like, may also be utilized. In various embodiments, the first semiconductor layers 51 may be formed of a first semiconductor material, such as silicon-germanium, or the like, and the second semiconductor layers 53 may be formed of a second semiconductor material, such as silicon, silicon carbon, or the like. Other semiconductor materials or combinations thereof are possible. In some embodiments, the layers of the multi-layer stack 64 may have a thickness in the range of about 4 nm to about 20 nm, though other thicknesses are possible. Different layers of the multi-layer stack 64 may have different thicknesses, in some embodiments.

The first semiconductor materials and the second semiconductor materials may be materials having a high-etch selectivity to one another. As such, the first semiconductor layers 51 of the first semiconductor material may be removed without significantly removing the second semiconductor layers 53 of the second semiconductor material, thereby allowing the second semiconductor layers 53 to be patterned to form channel regions of nano-FETs.

Figure 3:
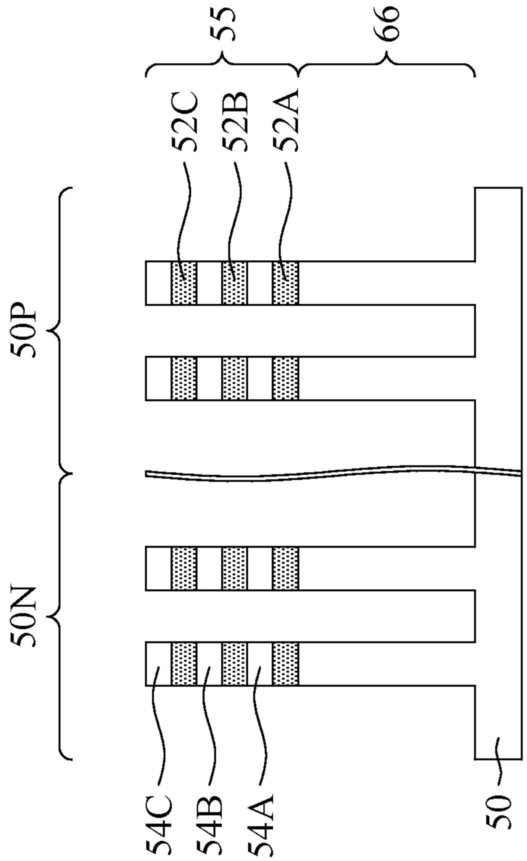

Referring now to FIG. 3, fins 66 are formed in the substrate 50 and nanostructures 55 are formed in the multi-layer stack 64, in accordance with some embodiments. In some embodiments, the nanostructures 55 and the fins 66 may be formed in the multi-layer stack 64 and the substrate 50, respectively, by etching trenches in the multi-layer stack 64 and the substrate 50. The etching may be any acceptable etch process, such as a reactive ion etch (RIE), neutral beam etch (NBE), the like, or a combination thereof. The etching may be anisotropic. Forming the nanostructures 55 by etching the multi-layer stack 64 may further define first nanostructures 52A-C (collectively referred to as the first nanostructures 52) from the first semiconductor layers 51 and define second nanostructures 54A-C (collectively referred to as the second nanostructures 54) from the second semiconductor layers 53. The first nanostructures 52 and the second nanostructures 54 may further be collectively referred to as nanostructures 55.

The fins 66 and the nanostructures 55 may be patterned by any suitable method. For example, the fins 66 and the nanostructures 55 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins 66.

FIG. 3 illustrates the fins 66 in the n-type region 50N and the p-type region 50P as having substantially equal widths for illustrative purposes. In some embodiments, widths of the fins 66 in the n-type region 50N may be greater or thinner than the fins 66 in the p-type region 50P. Further, while each of the fins 66 and the nanostructures 55 are illustrated as having a consistent width throughout, in other embodiments, the fins 66 and/or the nanostructures 55 may have tapered sidewalls such that a width of each of the fins 66 and/or the nanostructures 55 continuously increases in a direction towards the substrate 50. In such embodiments, each of the nanostructures 55 may have a different width and be trapezoidal in shape. In some embodiments, the fins 66 may have a width in the range of about 5 nm to about 100 nm, though other widths are possible.

Figure 4:
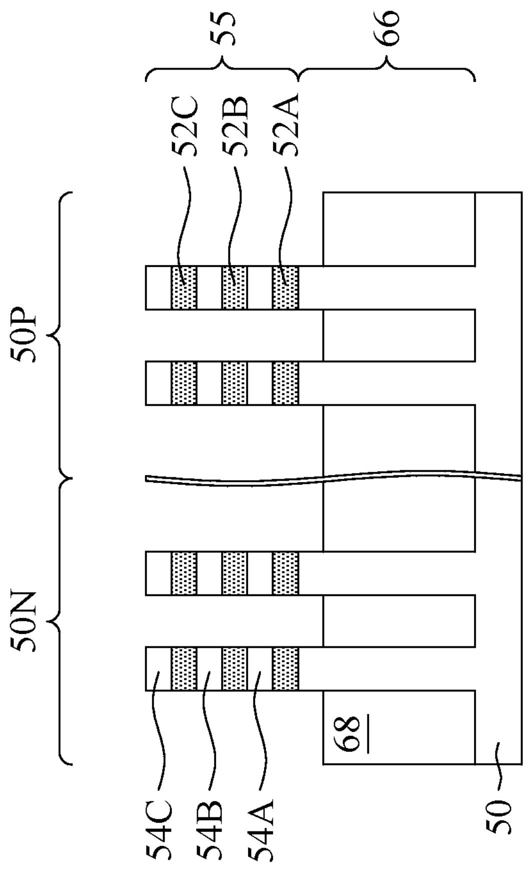

In FIG. 4, shallow trench isolation (STI) regions 68 are formed adjacent the fins 66. The STI regions 68 may be formed by depositing an insulation material over the substrate 50, the fins 66, and nanostructures 55, and between adjacent fins 66. The insulation material may be an oxide, such as silicon oxide, a nitride, the like, or a combination thereof, and may be formed by high-density plasma CVD (HDP-CVD), flowable CVD (FCVD), the like, or a combination thereof. Other insulation materials formed by any acceptable process may be used. In the illustrated embodiment, the insulation material is silicon oxide formed by an FCVD process. An anneal process may be performed once the insulation material is formed. In an embodiment, the insulation material is formed such that excess insulation material covers the nanostructures 55. Although the insulation material is illustrated as a single layer, some embodiments may utilize multiple layers. For example, in some embodiments a liner (not separately illustrated) may first be formed along a surface of the substrate 50, the fins 66, and the nanostructures 55. Thereafter, a fill material, such as those discussed above may be formed over the liner.

A removal process is then applied to the insulation material to remove excess insulation material over the nanostructures 55. In some embodiments, a planarization process such as a chemical mechanical polish (CMP), an etch-back process, combinations thereof, or the like may be utilized. The planarization process exposes the nanostructures 55 such that top surfaces of the nanostructures 55 and the insulation material are level after the planarization process is complete.

The insulation material is then recessed to form the STI regions 68. The insulation material is recessed such that upper portions of fins 66 in the n-type region 50N and the p-type region 50P protrude from between neighboring STI regions 68. Further, the top surfaces of the STI regions 68 may have a flat surface as illustrated, a convex surface, a concave surface (such as dishing), or a combination thereof. The top surfaces of the STI regions 68 may be formed flat, convex, and/or concave by an appropriate etch. The STI regions 68 may be recessed using an acceptable etching process, such as one that is selective to the material of the insulation material (e.g., etches the material of the insulation material at a faster rate than the material of the fins 66 and the nanostructures 55). For example, an oxide removal using, for example, dilute hydrofluoric (dHF) acid may be used.

The process described above with respect to FIGS. 2 through 4 is just one example of how the fins 66 and the nanostructures 55 may be formed. In some embodiments, the fins 66 and/or the nanostructures 55 may be formed using a mask and an epitaxial growth process. For example, a dielectric layer can be formed over a top surface of the substrate 50, and trenches can be etched through the dielectric layer to expose the underlying substrate 50. Epitaxial structures can be epitaxially grown in the trenches, and the dielectric layer can be recessed such that the epitaxial structures protrude from the dielectric layer to form the fins 66 and/or the nanostructures 55. The epitaxial structures may comprise the alternating semiconductor materials discussed above, such as the first semiconductor materials and the second semiconductor materials. In some embodiments where epitaxial structures are epitaxially grown, the epitaxially grown materials may be in situ doped during growth, which may obviate prior and/or subsequent implantations, although in situ and implantation doping may be used together.

Additionally, the first semiconductor layers 51 (and resulting nanostructures 52) and the second semiconductor layers 53 (and resulting nanostructures 54) are illustrated and discussed herein as comprising the same materials in the p-type region 50P and the n-type region 50N for illustrative purposes only. As such, in some embodiments one or both of the first semiconductor layers 51 and the second semiconductor layers 53 may be different materials or formed in a different order in the p-type region 50P and the n-type region 50N.

Further in FIG. 4, appropriate wells (not separately illustrated) may be formed in the fins 66, the nanostructures 55, and/or the STI regions 68. In embodiments with different well types, different implant steps for the n-type region 50N and the p-type region 50P may be achieved using a photoresist or other masks (not separately illustrated). For example, a photoresist may be formed over the fins 66 and the STI regions 68 in the n-type region 50N and the p-type region 50P. The photoresist is patterned to expose the p-type region 50P. The photoresist can be formed by using a spin-on technique and can be patterned using acceptable photolithography techniques. Once the photoresist is patterned, an n-type impurity implant is performed in the p-type region 50P, and the photoresist may act as a mask to substantially prevent n-type impurities from being implanted into the n-type region 50N. The n-type impurities may be phosphorus, arsenic, antimony, or the like implanted in the region to a concentration in a range from about $10^{13}$ atoms/cm$^3$ to about $10^{14}$ atoms/cm$^3$. After the implant, the photoresist is removed, such as by an acceptable ashing process.

Following or prior to the implanting of the p-type region 50P, a photoresist or other masks (not separately illustrated) is formed over the fins 66, the nanostructures 55, and the STI regions 68 in the p-type region 50P and the n-type region 50N. The photoresist is patterned to expose the n-type region 50N. The photoresist can be formed by using a spin-on technique and can be patterned using acceptable photolithography techniques. Once the photoresist is patterned, a p-type impurity implant may be performed in the n-type region 50N, and the photoresist may act as a mask to substantially prevent p-type impurities from being implanted into the p-type region 50P. The p-type impurities may be boron, boron fluoride, indium, or the like implanted in the region to a concentration in a range from about $10^{13}$ atoms/cm$^3$ to about $10^{14}$ atoms/cm$^3$. After the implant, the photoresist may be removed, such as by an acceptable ashing process.

After the implants of the n-type region 50N and the p-type region 50P, an anneal may be performed to repair implant damage and to activate the p-type and/or n-type impurities that were implanted. In some embodiments, the grown materials of epitaxial fins may be in situ doped during growth, which may obviate the implantations, although in situ and implantation doping may be used together. In other embodiments, some or all of the implants of the n-type region 50N and/or the p-type region 50P may be performed before formation of the multi-layer stack 64.

Figure 5:
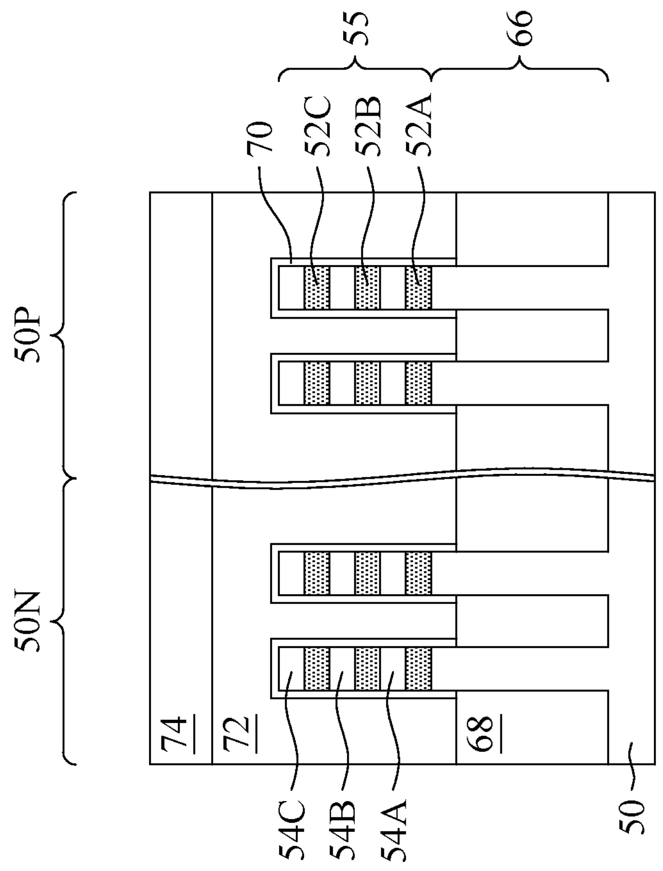

In FIG. 5, a dummy dielectric layer 70 is formed on the fins 66 and/or the nanostructures 55. The dummy dielectric layer 70 may be, for example, silicon oxide, silicon nitride, a combination thereof, or the like, and may be deposited or thermally grown according to acceptable techniques. A dummy gate layer 72 is formed over the dummy dielectric layer 70, and a mask layer 74 is formed over the dummy gate layer 72. The dummy gate layer 72 may be deposited over the dummy dielectric layer 70 and then planarized, such as by a CMP. The mask layer 74 may be deposited over the dummy gate layer 72. The dummy gate layer 72 may be a conductive or non-conductive material and may be selected from a group including amorphous silicon, polycrystalline-silicon (polysilicon), poly-crystalline silicon-germanium (poly-SiGe), metallic nitrides, metallic silicides, metallic oxides, and metals. The dummy gate layer 72 may be deposited by physical vapor deposition (PVD), CVD, sputter deposition, or other techniques for depositing the selected material. The dummy gate layer 72 may be made of other materials that have a high etching selectivity from the etching of isolation regions. The mask layer 74 may include, for example, silicon nitride, silicon oxynitride, or the like. In this example, a single dummy gate layer 72 and a single mask layer 74 are formed across the n-type region 50N and the p-type region 50P. It is noted that the dummy dielectric layer 70 is shown covering only the fins 66 and the nanostructures 55 for illustrative purposes only. In some embodiments, the dummy dielectric layer 70 may be deposited such that the dummy dielectric layer 70 covers the STI regions 68, such that the dummy dielectric layer 70 extends between the dummy gate layer 72 and the STI regions 68.

Figure 6A:
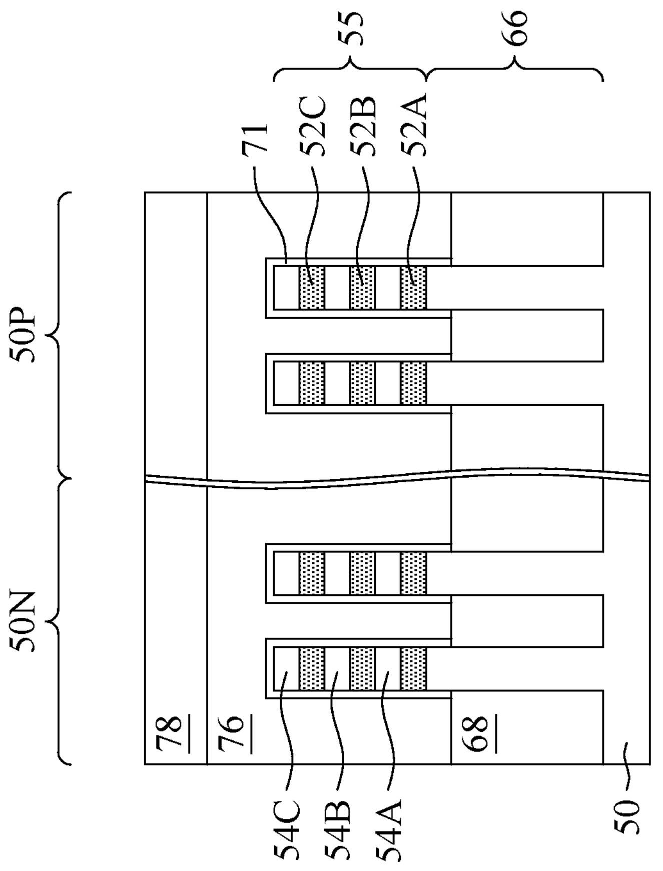
Figure 6B:
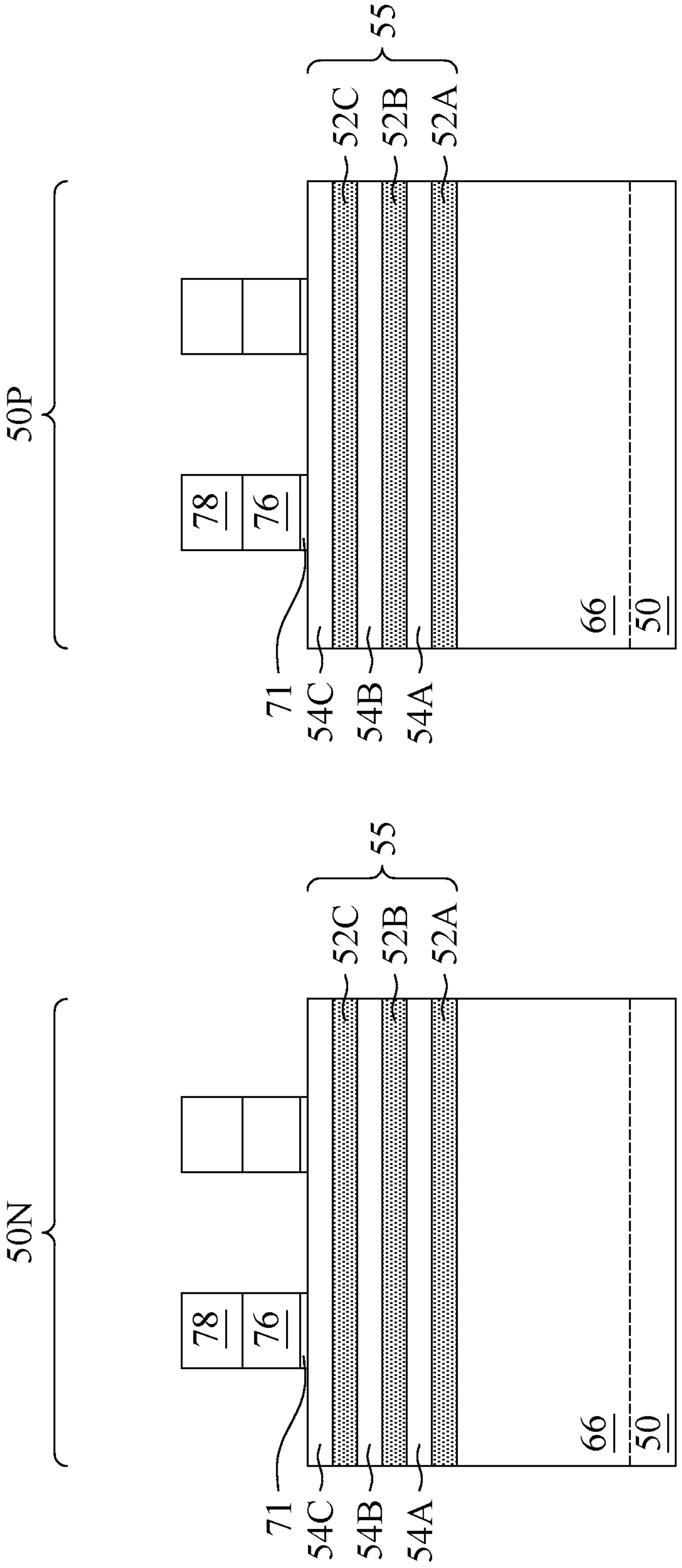

FIGS. 6A through 24C illustrate various additional steps in the manufacturing of embodiment devices. FIGS. 6A, 7A, 8A, 9A, 10A, 11A, 12A, 12C, 13A, 13C, 14A, 15A, 16A, 17A, 22C, 23C, and 24C illustrate features in either the regions 50N or the regions 50P. In FIGS. 6A and 6B, the mask layer 74 (see FIG. 5) may be patterned using acceptable photolithography and etching techniques to form masks 78. The pattern of the masks 78 then may be transferred to the dummy gate layer 72 and to the dummy dielectric layer 70 to form dummy gates 76 and dummy gate dielectrics 71, respectively. The dummy gates 76 cover respective channel regions of the fins 66. The pattern of the masks 78 may be used to physically separate each of the dummy gates 76 from adjacent dummy gates 76. The dummy gates 76 may also have a lengthwise direction substantially perpendicular to the lengthwise direction of respective fins 66.

Figure 7A:
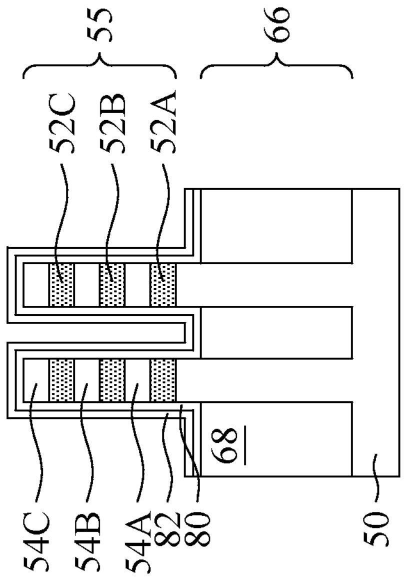
Figure 7B:
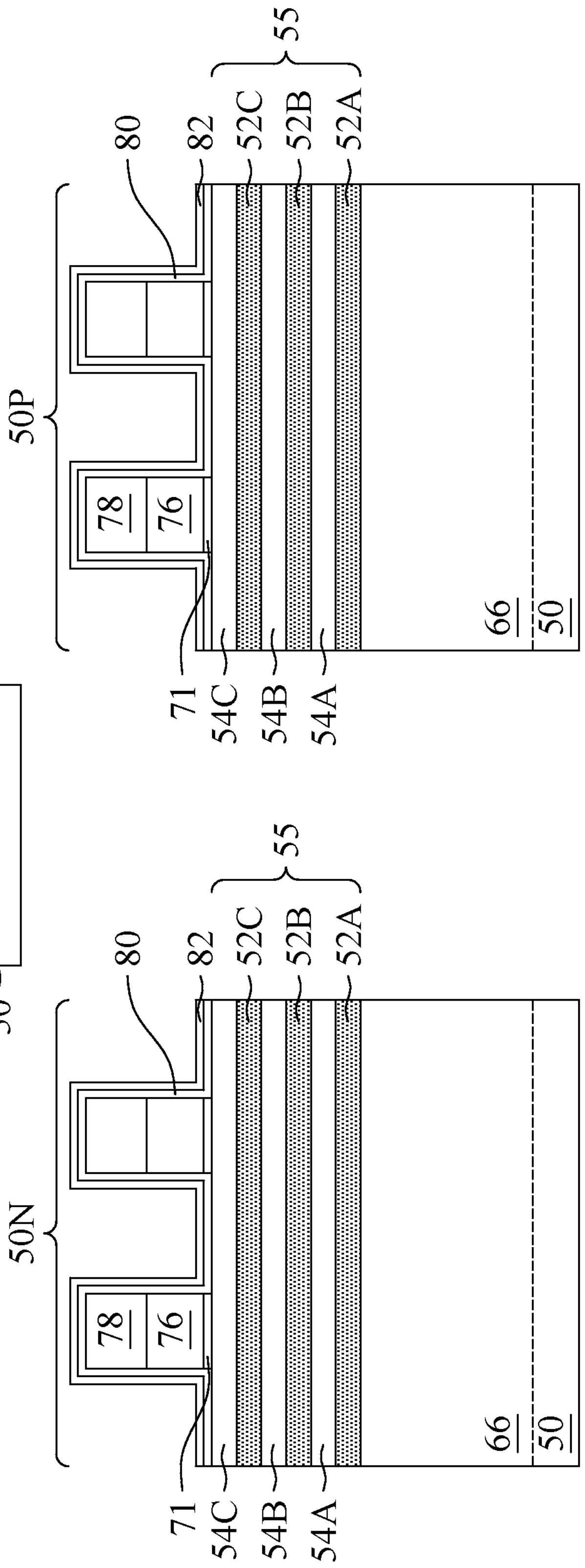

In FIGS. 7A and 7B, a first spacer layer 80 and a second spacer layer 82 are formed over the structures illustrated in FIGS. 6A and 6B, respectively. The first spacer layer 80 and the second spacer layer 82 will be subsequently patterned to act as spacers for forming self-aligned source/drain regions. In FIGS. 7A and 7B, the first spacer layer 80 is formed on top surfaces of the STI regions 68; top surfaces and sidewalls of the fins 66, the nanostructures 55, and the masks 78; and sidewalls of the dummy gates 76 and the dummy gate dielectric 71. The second spacer layer 82 is deposited over the first spacer layer 80. The first spacer layer 80 may be formed of silicon oxide, silicon nitride, silicon oxynitride, silicon oxycarbide, silicon oxycarbonitride, a combination thereof, or the like. In some embodiments, the first spacer layer 80 may comprise another suitable material, such as a low-dielectric constant (low-k) material having a k-value less than about 3.5. The first spacer layer 80 may be formed using techniques such as thermal oxidation or deposited by CVD, ALD, the like, or may be formed using any other suitable techniques. The second spacer layer 82 may be formed of a material having a different etch rate than the material of the first spacer layer 80, such as silicon oxide, silicon nitride, silicon oxynitride, or the like, and may be deposited by CVD, ALD, or the like.

After the first spacer layer 80 is formed and prior to forming the second spacer layer 82, implants for lightly doped source/drain (LDD) regions (not separately illustrated) may be performed. In embodiments with different device types, similar to the implants discussed above in FIG. 4, a mask, such as a photoresist, may be formed over the n-type region 50N, while exposing the p-type region 50P, and appropriate type (e.g., p-type) impurities may be implanted into the exposed fins 66 and nanostructures 55 in the p-type region 50P. The mask may then be removed. Subsequently, a mask, such as a photoresist, may be formed over the p-type region 50P while exposing the n-type region 50N, and appropriate type impurities (e.g., n-type) may be implanted into the exposed fins 66 and nanostructures 55 in the n-type region 50N. The mask may then be removed. The n-type impurities may be the any of the n-type impurities previously discussed, and the p-type impurities may be the any of the p-type impurities previously discussed. The lightly doped source/drain regions may have a concentration of impurities in a range from about $10^{15}$ atoms/cm$^3$ to about $10^{19}$ atoms/cm$^3$. An anneal may be used to repair implant damage and to activate the implanted impurities.

Figure 8A:
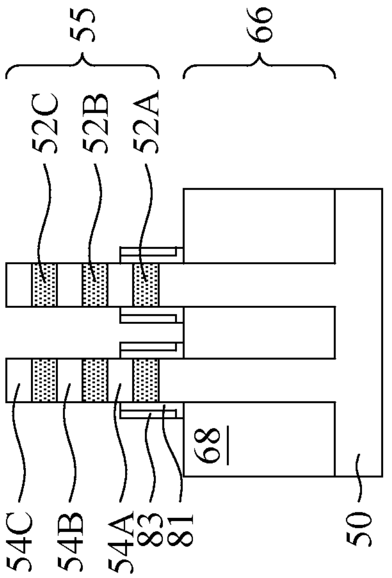
Figure 8B:
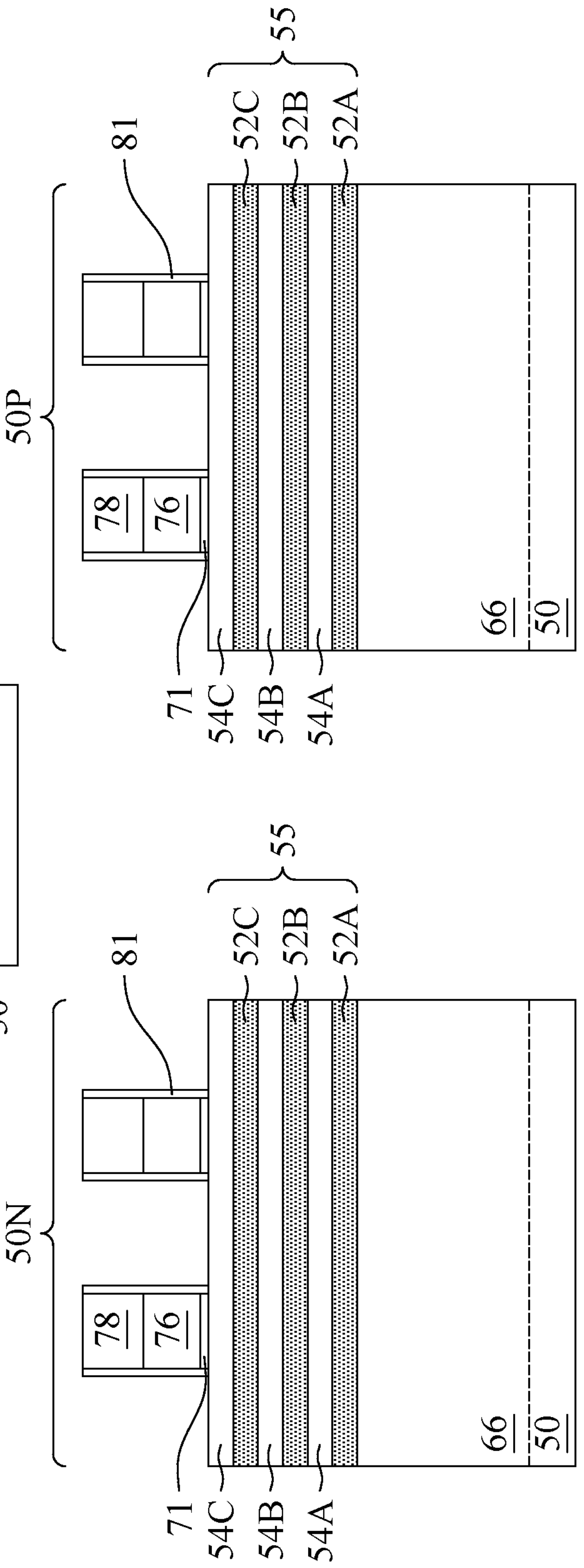

In FIGS. 8A and 8B, the first spacer layer 80 and the second spacer layer 82 are etched to form first spacers 81 and second spacers 83. As will be discussed in greater detail below, the first spacers 81 and the second spacers 83 act to self-aligned subsequently formed source drain regions, as well as to protect sidewalls of the fins 66 and/or nanostructure 55 during subsequent processing. The first spacer layer 80 and the second spacer layer 82 may be etched using a suitable etching process, such as an isotropic etching process (e.g., a wet etching process), an anisotropic etching process (e.g., a dry etching process), or the like. In some embodiments, the material of the second spacer layer 82 has a different etch rate than the material of the first spacer layer 80, such that the first spacer layer 80 may act as an etch stop layer when patterning the second spacer layer 82 and such that the second spacer layer 82 may act as a mask when patterning the first spacer layer 80. For example, the second spacer layer 82 may be etched using an anisotropic etch process wherein the first spacer layer 80 acts as an etch stop layer, wherein remaining portions of the second spacer layer 82 form second spacers 83 as illustrated in FIG. 8A. Thereafter, the second spacers 83 acts as a mask while etching exposed portions of the first spacer layer 80, thereby forming first spacers 81 as illustrated in FIG. 8A.

As illustrated in FIG. 8A, the first spacers 81 and the second spacers 83 are disposed on sidewalls of the fins 66 and/or nanostructures 55. As illustrated in FIG. 8B, in some embodiments, the second spacer layer 82 may be removed from over the first spacer layer 80 adjacent the masks 78, the dummy gates 76, and the dummy gate dielectrics 71, and the first spacers 81 are disposed on sidewalls of the masks 78, the dummy gates 76, and the dummy gate dielectrics 71. In other embodiments, a portion of the second spacer layer 82 may remain over the first spacer layer 80 adjacent the masks 78, the dummy gates 76, and the dummy gate dielectrics 71.

It is noted that the above disclosure generally describes a process of forming spacers and LDD regions. Other processes and sequences may be used. For example, fewer or additional spacers may be utilized, different sequence of steps may be utilized (e.g., the first spacers 81 may be patterned prior to depositing the second spacer layer 82), additional spacers may be formed and removed, air gaps may be formed, and/or the like. Furthermore, the n-type and p-type devices may be formed using different structures and steps.

Figures 9A, 9B:
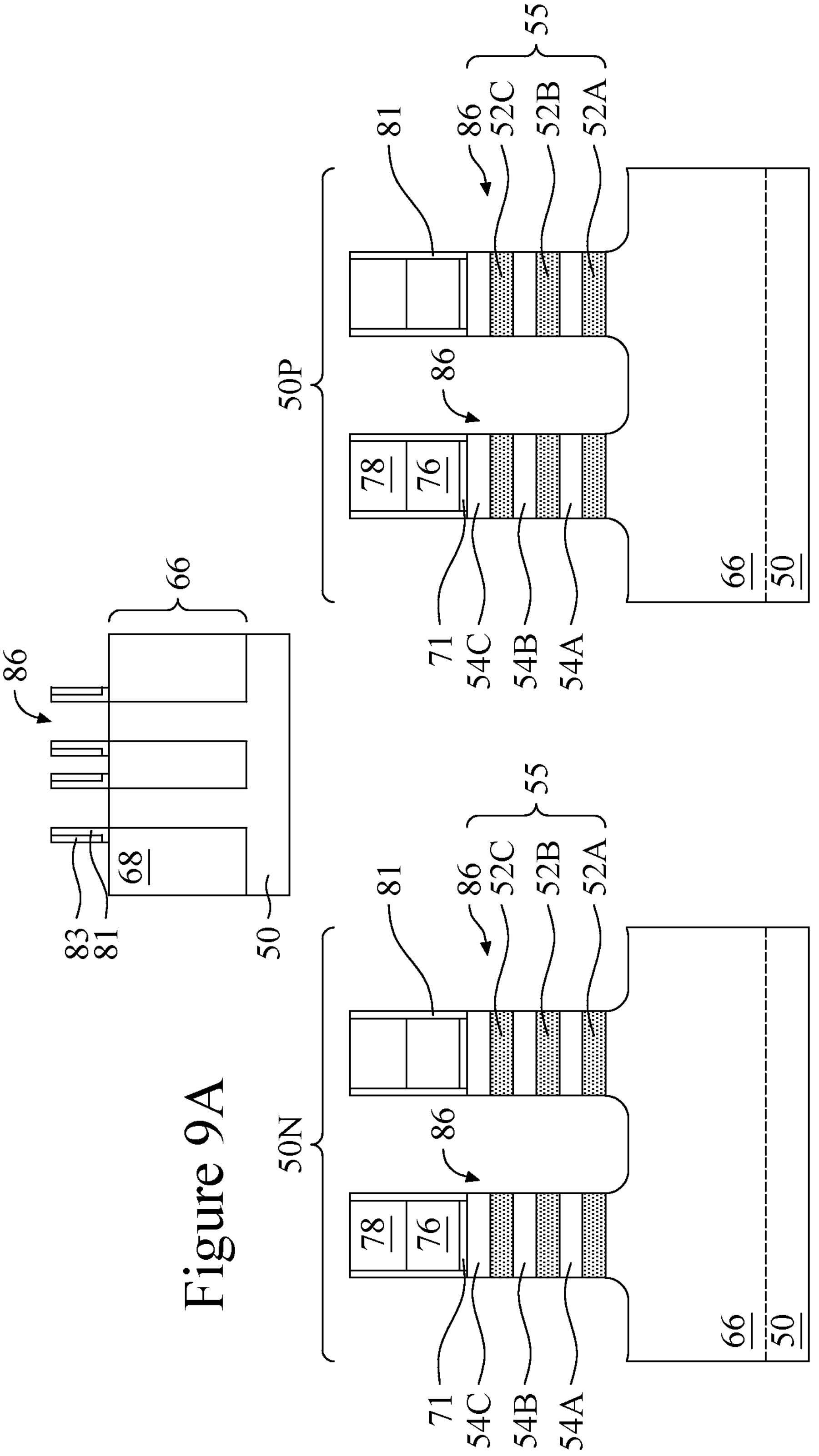

In FIGS. 9A and 9B, first recesses 86 are formed in the fins 66, the nanostructures 55, and the substrate 50, in accordance with some embodiments. Epitaxial source/drain regions will be subsequently formed in the first recesses 86. The first recesses 86 may extend through the first nanostructures 52 and the second nanostructures 54, and into the substrate 50. As illustrated in FIG. 9A, top surfaces of the STI regions 58 may be level with bottom surfaces of the first recesses 86. In various embodiments, the fins 66 may be etched such that bottom surfaces of the first recesses 86 are disposed below the top surfaces of the STI regions 68; or the like. The first recesses 86 may be formed by etching the fins 66, the nanostructures 55, and the substrate 50 using anisotropic etching processes, such as RIE, NBE, or the like. The first spacers 81, the second spacers 83, and the masks 78 mask portions of the fins 66, the nanostructures 55, and the substrate 50 during the etching processes used to form the first recesses 86. A single etch process or multiple etch processes may be used to etch each layer of the nanostructures 55 and/or the fins 66. Timed etch processes may be used to stop the etching of the first recesses 86 after the first recesses 86 reach a desired depth.

Figures 10A, 10B:
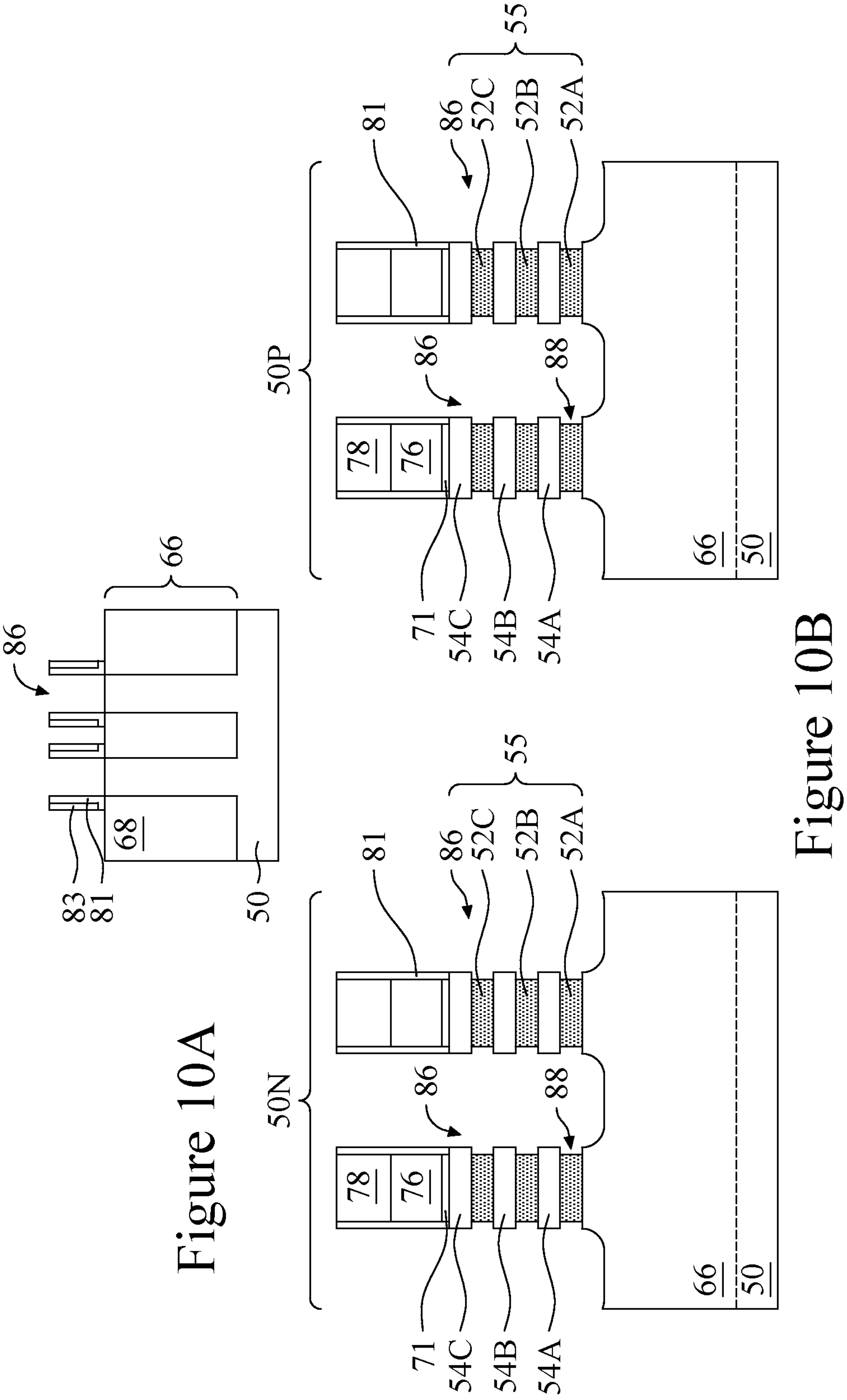

In FIGS. 10A and 10B, portions of sidewalls of the layers of the multi-layer stack 64 formed of the first semiconductor materials (e.g., the first nanostructures 52) exposed by the first recesses 86 are etched to form sidewall recesses 88 in the n-type region 50N and the p-type region 50P. Although sidewalls of the first nanostructures 52 and the second nanostructures 54 in sidewall recesses 88 are illustrated as being straight in FIG. 10B, the sidewalls may be concave or convex. The sidewalls may be etched using isotropic etching processes, such as wet etching or the like. Etchants selective to the first semiconductor materials may be used to etch the first nanostructures 52 such that the second nanostructures 54 and the substrate 50 remain relatively unetched as compared to the first nanostructures 52. In an embodiment in which the first nanostructures 52 include, e.g., silicon-germanium, and the second nanostructures 54 include, e.g., silicon or silicon carbide, a dry etch process with tetramethylammonium hydroxide (TMAH), ammonium hydroxide ($NH_4OH$), or the like may be used to etch sidewalls of the first nanostructures 52.

Figures 11A, 11B:
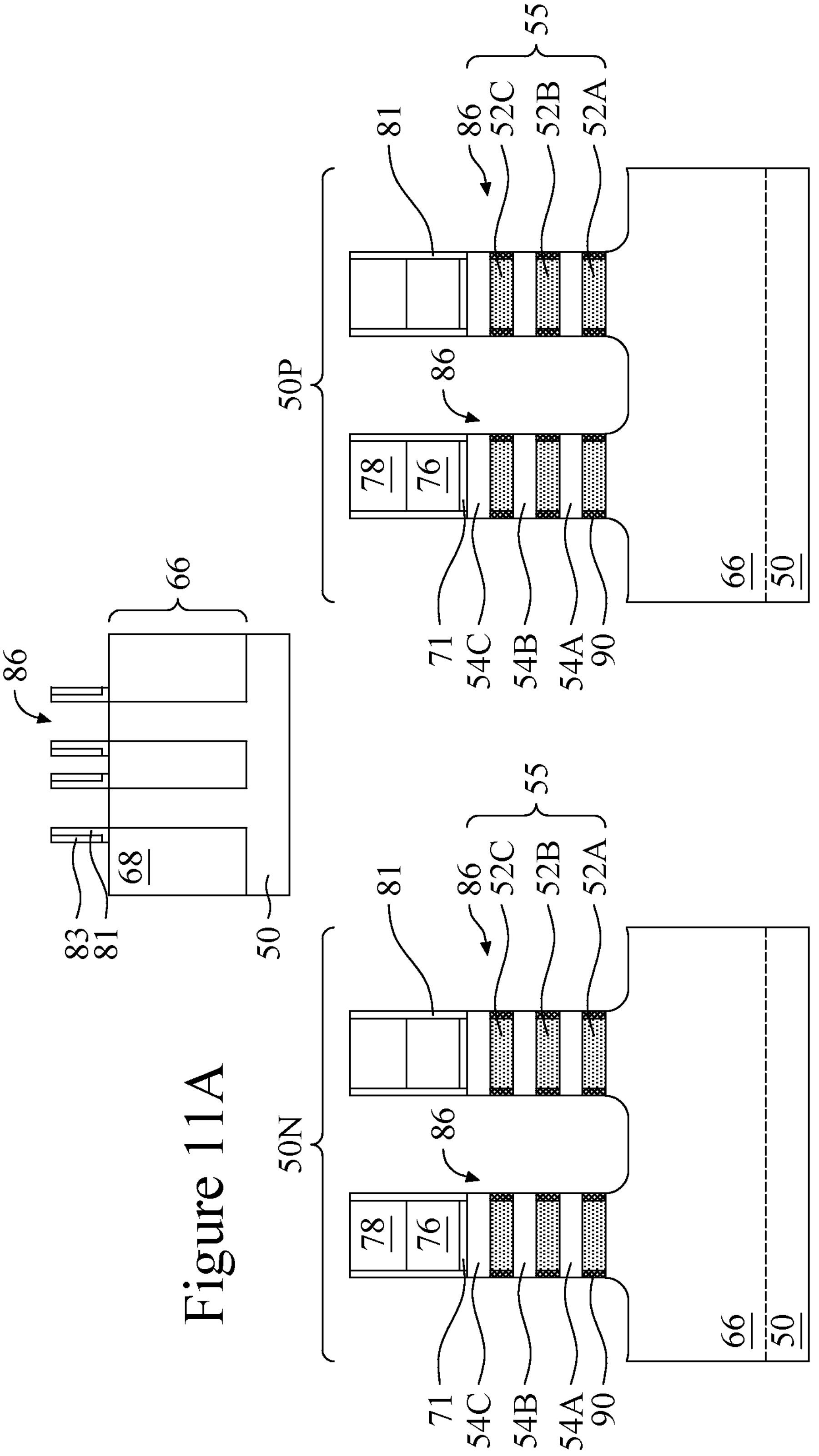
Figure 11C:
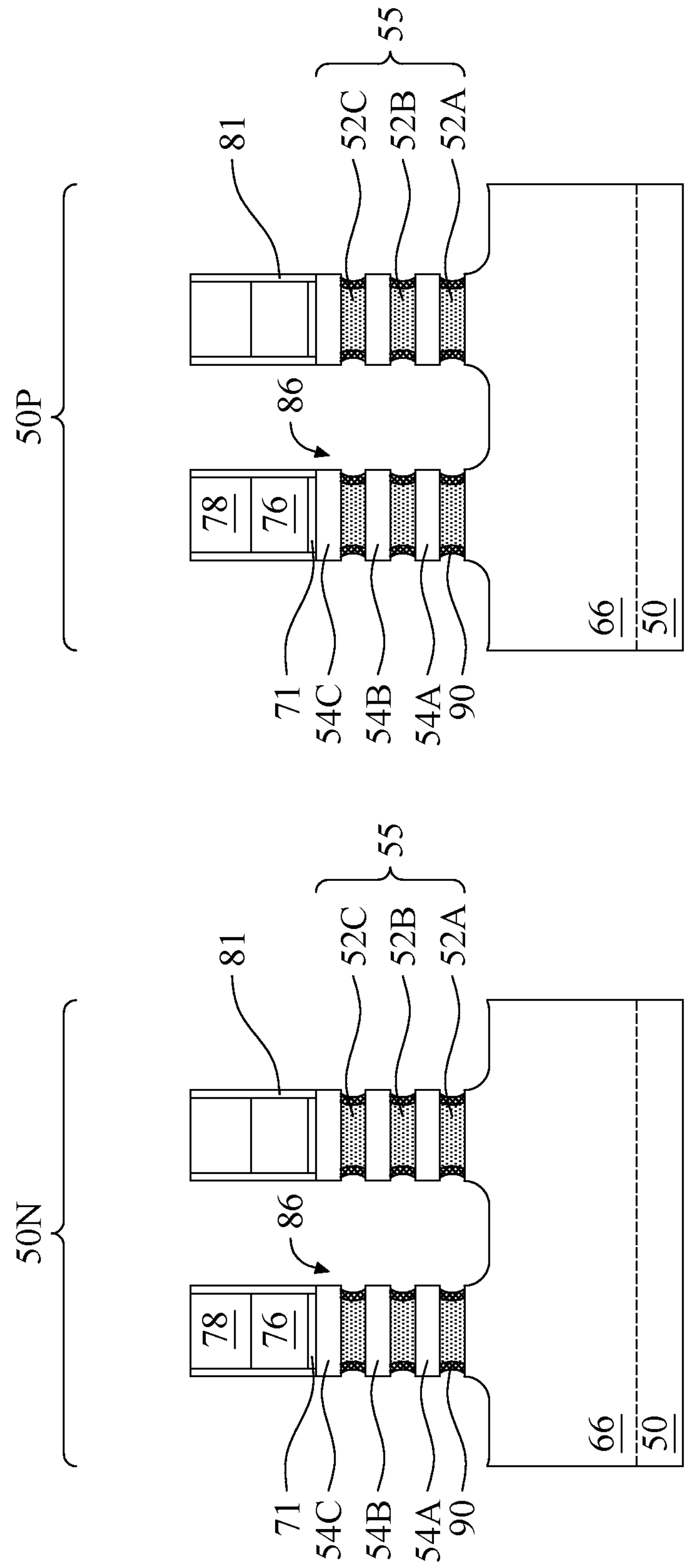

In FIGS. 11A-11C, first inner spacers 90 are formed in the sidewall recess 88. The first inner spacers 90 may be formed by depositing an inner spacer layer (not separately illustrated) over the structures illustrated in FIGS. 10A and 10B. The first inner spacers 90 act as isolation features between subsequently formed source/drain regions and a gate structure. As will be discussed in greater detail below, source/drain regions will be formed in the recesses 86, while the first nanostructures 52 will be replaced with gate structures.

The inner spacer layer may be deposited by a conformal deposition process, such as CVD, ALD, or the like. The inner spacer layer may comprise a material such as silicon nitride or silicon oxynitride, although any suitable material, such as low-dielectric constant (low-k) materials having a k-value less than about 3.5, may be utilized. The inner spacer layer may then be anisotropically etched to form the first inner spacers 90. Although outer sidewalls of the first inner spacers 90 are illustrated as being flush with sidewalls of the second nanostructures 54 in the n-type region 50N and flush with the sidewalls of the first nanostructures 52 in the p-type region 50P, the outer sidewalls of the first inner spacers 90 may extend beyond or be recessed from sidewalls of the second nanostructures 54 and/or the first nanostructures 52, respectively.

Moreover, although the outer sidewalls of the first inner spacers 90 are illustrated as being straight in FIG. 11B, the outer sidewalls of the first inner spacers 90 may be concave or convex. As an example, FIG. 11C illustrates an embodiment in which sidewalls of the first nanostructures 52 are concave, outer sidewalls of the first inner spacers 90 are concave, and the first inner spacers 90 are recessed from sidewalls of the second nanostructures 54 in the n-type region 50N. Also illustrated are embodiments in which sidewalls of the second nanostructures 54 are concave, outer sidewalls of the first inner spacers 90 are concave, and the first inner spacers 90 are recessed from sidewalls of the first nanostructures 52 in the p-type region 50P. The inner spacer layer may be etched by an anisotropic etching process, such as RIE, NBE, or the like. The first inner spacers 90 may be used to prevent damage to subsequently formed source/drain regions (such as the epitaxial source/drain regions 92, discussed below with respect to FIGS. 12A-12C) by subsequent etching processes, such as etching processes used to form gate structures.

Figures 12A, 12B:
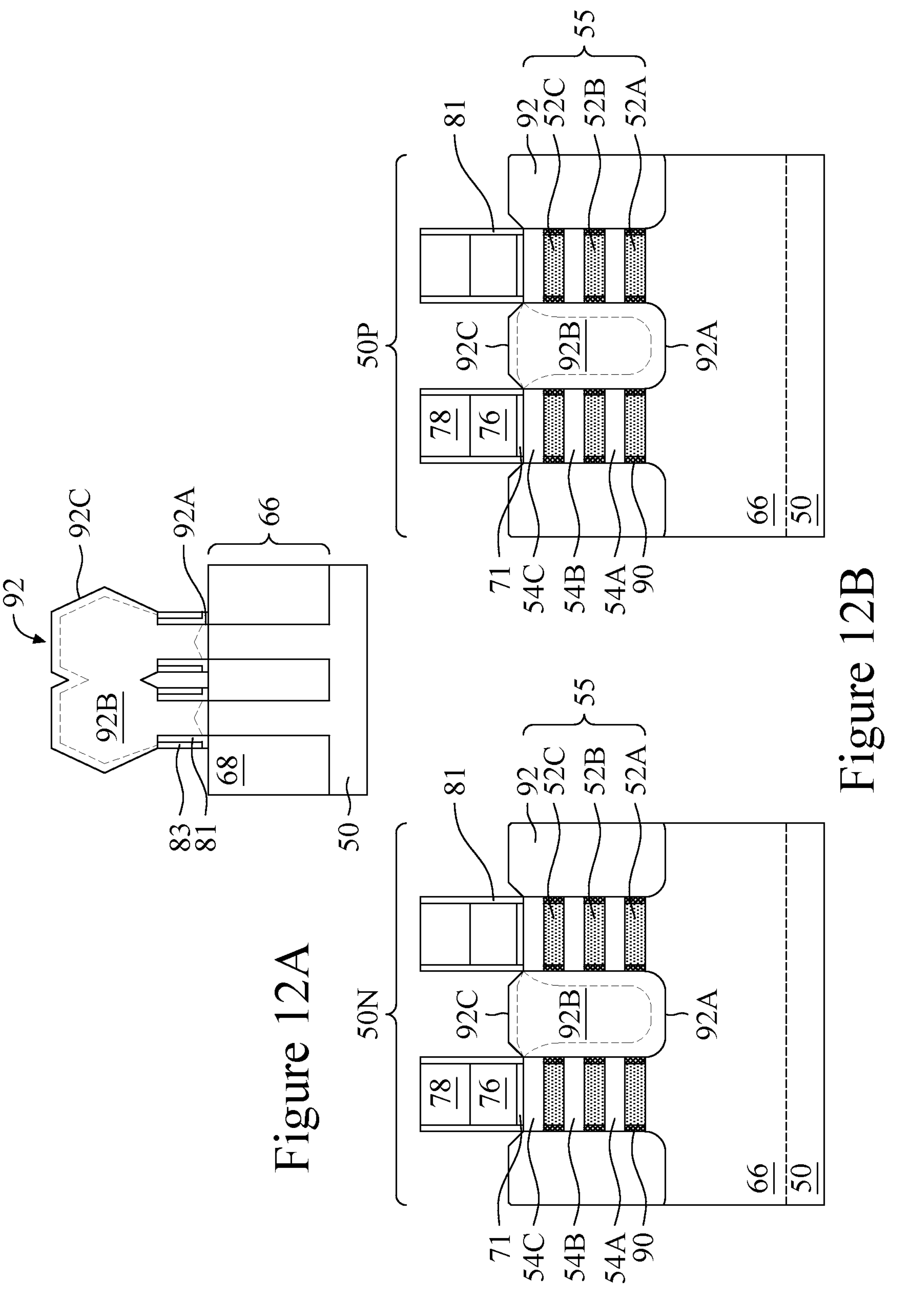
Figure 12C:
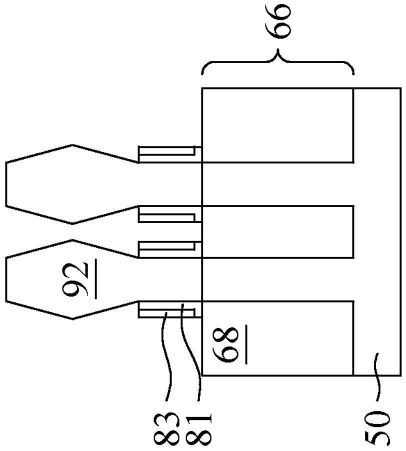

In FIGS. 12A-12C, epitaxial source/drain regions 92 are formed in the first recesses 86. In some embodiments, the source/drain regions 92 may exert stress on the second nanostructures 54 in the n-type region 50N and on the first nanostructures 52 in the p-type region 50P, thereby improving performance. As illustrated in FIG. 12B, the epitaxial source/drain regions 92 are formed in the first recesses 86 such that each dummy gate 76 is disposed between respective neighboring pairs of the epitaxial source/drain regions 92. In some embodiments, the first spacers 81 are used to separate the epitaxial source/drain regions 92 from the dummy gates 76 and the first inner spacers 90 are used to separate the epitaxial source/drain regions 92 from the nanostructures 55 by an appropriate lateral distance so that the epitaxial source/drain regions 92 do not short out with subsequently formed gates of the resulting nano-FETs. In some embodiments, the epitaxial source/drain regions 92 have a height in the range of about 30 nm to about 80 nm, though other heights are possible.

The epitaxial source/drain regions 92 in the n-type region 50N, e.g., the NMOS region, may be formed by masking the p-type region 50P, e.g., the PMOS region. Then, the epitaxial source/drain regions 92 are epitaxially grown in the first recesses 86 in the n-type region 50N. The epitaxial source/drain regions 92 may include any acceptable material appropriate for n-type nano-FETs. For example, if the second nanostructures 54 are silicon, the epitaxial source/drain regions 92 may include materials exerting a tensile strain on the second nanostructures 54, such as silicon, silicon carbide, phosphorous doped silicon carbide, silicon phosphide, arsenic doped silicon, or the like. Other materials are possible. The epitaxial source/drain regions 92 may have surfaces raised from respective upper surfaces of the nanostructures 55 and may have facets.

The epitaxial source/drain regions 92 in the p-type region 50P, e.g., the PMOS region, may be formed by masking the n-type region 50N, e.g., the NMOS region. Then, the epitaxial source/drain regions 92 are epitaxially grown in the first recesses 86 in the p-type region 50P. The epitaxial source/drain regions 92 may include any acceptable material appropriate for p-type nano-FETs. For example, if the first nanostructures 52 are silicon-germanium, the epitaxial source/drain regions 92 may comprise materials exerting a compressive strain on the first nanostructures 52, such as silicon-germanium, boron doped silicon-germanium, germanium, boron doped silicon-germanium carbide, germanium tin, born doped silicon, or the like. Other materials are possible. The epitaxial source/drain regions 92 may also have surfaces raised from respective surfaces of the multilayer stack 56 and may have facets.

The epitaxial source/drain regions 92, the first nanostructures 52, the second nanostructures 54, and/or the substrate 50 may be implanted with dopants to form source/drain regions, similar to the process previously discussed for forming lightly-doped source/drain regions, followed by an anneal. The source/drain regions may have an impurity concentration of between about $10^{19}$ atoms/cm$^3$ and about $10^{21}$ atoms/cm$^3$. The n-type and/or p-type impurities for source/drain regions may be any of the impurities previously discussed or other impurities. In some embodiments, the epitaxial source/drain regions 92 may be in situ doped during growth.

As a result of the epitaxy processes used to form the epitaxial source/drain regions 92 in the n-type region 50N and the p-type region 50P, upper surfaces of the epitaxial source/drain regions 92 have facets which expand laterally outward beyond sidewalls of the nanostructures 55. In some embodiments, these facets cause adjacent epitaxial source/drain regions 92 of a same nano-FET to merge as illustrated by FIG. 12A. In other embodiments, adjacent epitaxial source/drain regions 92 remain separated after the epitaxy process is completed as illustrated by FIG. 12C. In the embodiments illustrated in FIGS. 12A and 12C, the first spacers 81 may be formed to a top surface of the STI regions 68 thereby blocking the epitaxial growth. In some other embodiments, the first spacers 81 may cover portions of the sidewalls of the nanostructures 55 further blocking the epitaxial growth. In some other embodiments, the spacer etch used to form the first spacers 81 may be adjusted to remove the spacer material to allow the epitaxially grown region to extend to the surface of the STI region 58.

The epitaxial source/drain regions 92 may comprise one or more semiconductor material layers. For example, the epitaxial source/drain regions 92 may comprise a first semiconductor material layer 92A, a second semiconductor material layer 92B, and a third semiconductor material layer 92C. Any number of semiconductor material layers may be used for the epitaxial source/drain regions 92. Each of the first semiconductor material layer 92A, the second semiconductor material layer 92B, and the third semiconductor material layer 92C may be formed of different semiconductor materials and may be doped to different dopant concentrations. In some embodiments, the first semiconductor material layer 92A may have a dopant concentration less than the second semiconductor material layer 92B and greater than the third semiconductor material layer 92C. In embodiments in which the epitaxial source/drain regions 92 comprise three semiconductor material layers, the first semiconductor material layer 92A may be deposited, the second semiconductor material layer 92B may be deposited over the first semiconductor material layer 92A, and the third semiconductor material layer 92C may be deposited over the second semiconductor material layer 92B.

Figure 12D:
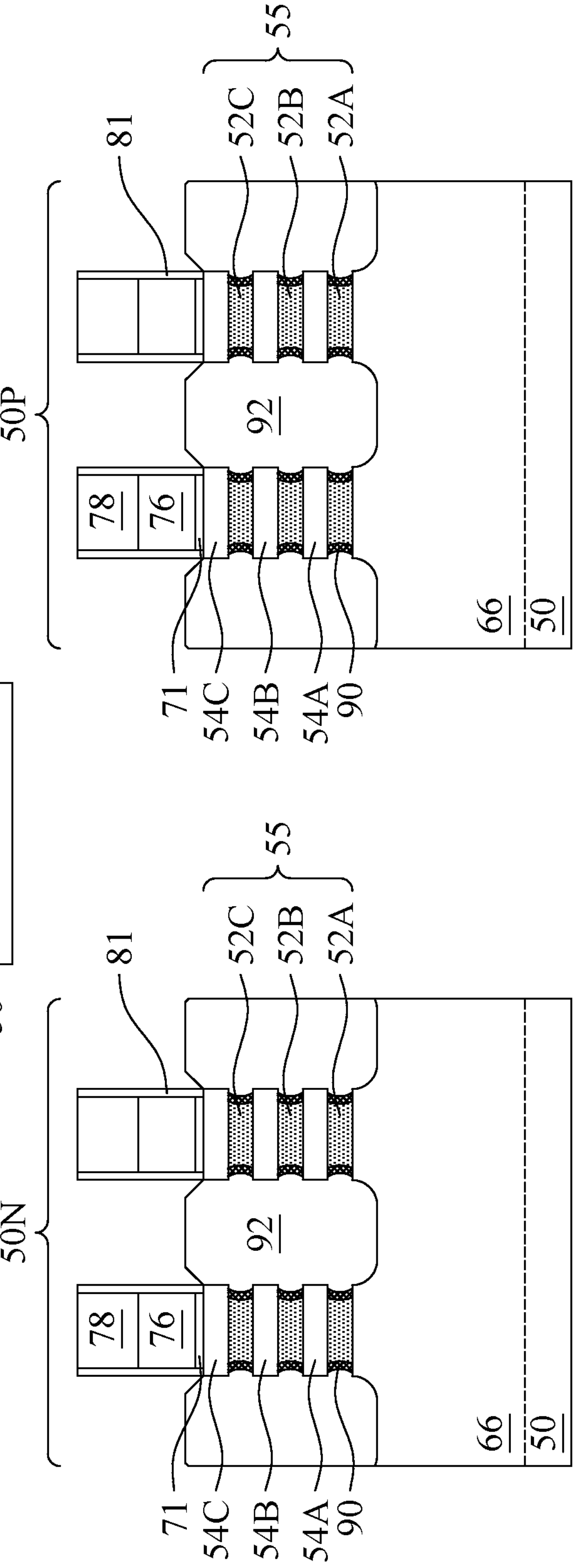

FIG. 12D illustrates an embodiment in which sidewalls of the first nanostructures 52 in the n-type region 50N and sidewalls of the second nanostructures 54 in the p-type region 50P are concave, outer sidewalls of the first inner spacers 90 are concave, and the first inner spacers 90 are recessed from sidewalls of the second nanostructures 54 and the first nanostructures 52, respectively. As illustrated in FIG. 12D, the epitaxial source/drain regions 92 may be formed in contact with the first inner spacers 90 and may extend past sidewalls of the second nanostructures 54 in the n-type region 50N and past sidewalls of the first nanostructures 52 in the p-type region 50P.

Figure 13A:
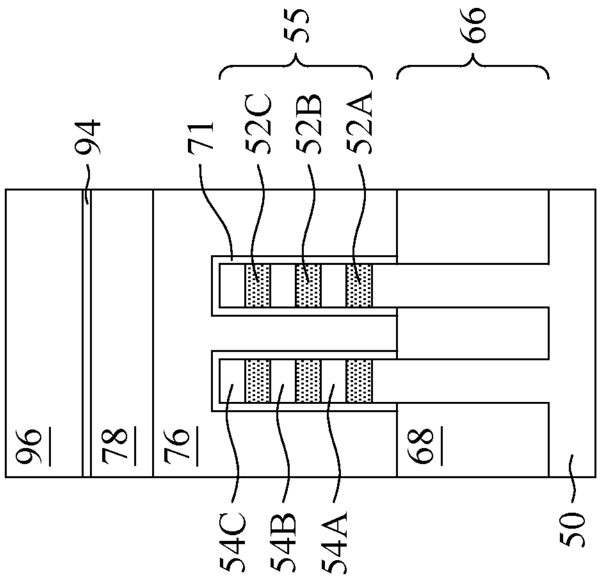
Figure 13B:
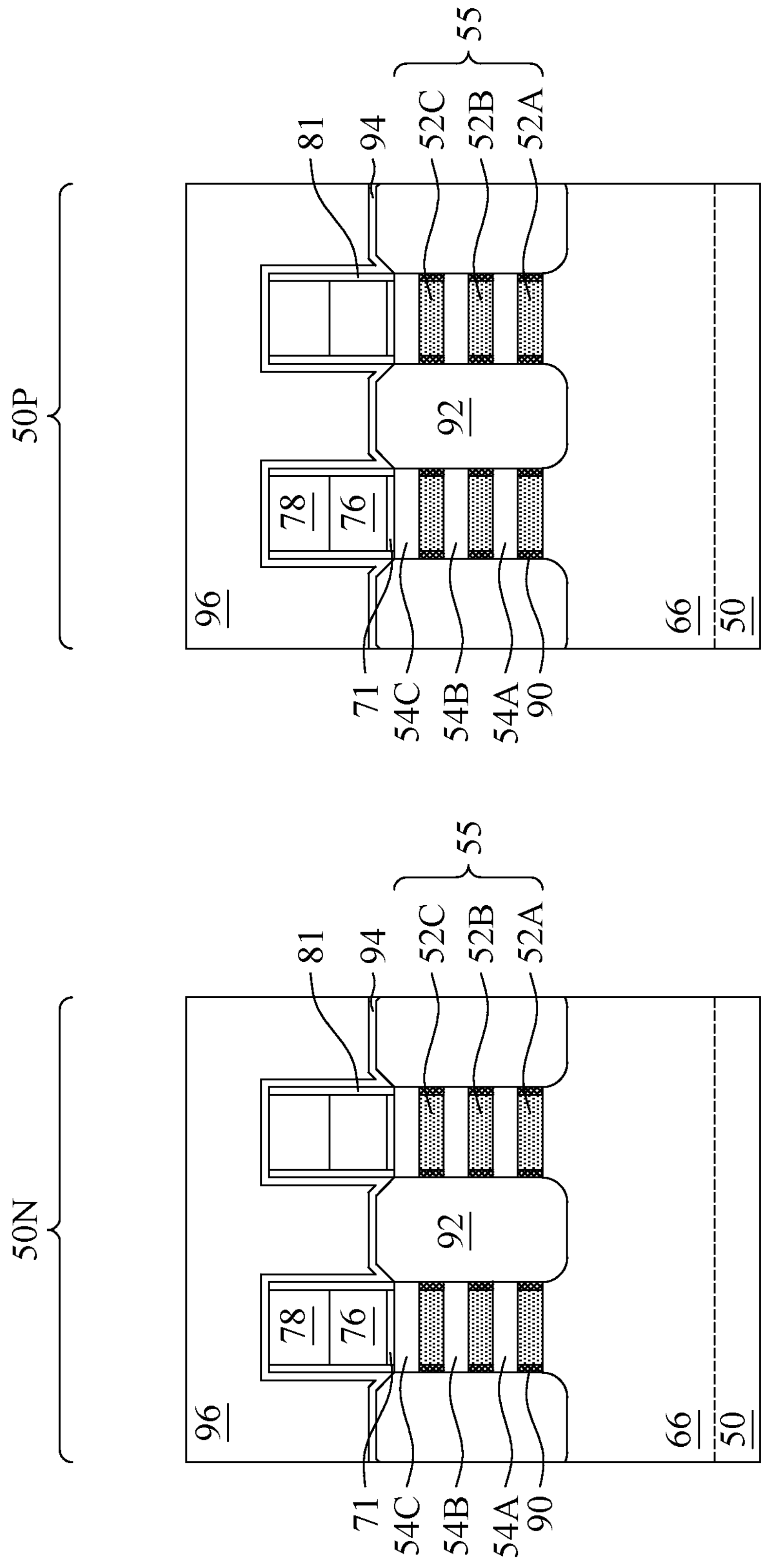
Figure 13C:
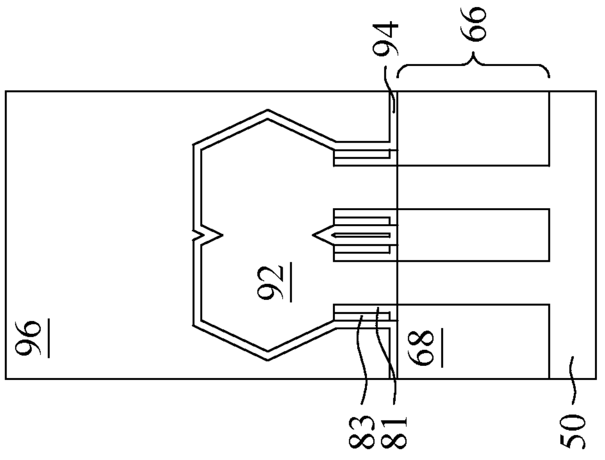

In FIGS. 13A-13C, a first interlayer dielectric (ILD) 96 is deposited over the structure illustrated in FIGS. 6A, 12B, and 12A (the processes of FIGS. 7A-12D do not alter the cross-section illustrated in FIGS. 6A), respectively. The first ILD 96 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. In some embodiments, a contact etch stop layer (CESL) 94 is disposed between the first ILD 96 and the epitaxial source/drain regions 92, the masks 78, and the first spacers 81. The CESL 94 may comprise a dielectric material, such as, silicon nitride, silicon oxide, silicon oxynitride, or the like, having a different etch rate than the material of the overlying first ILD 96.

Figure 14A:
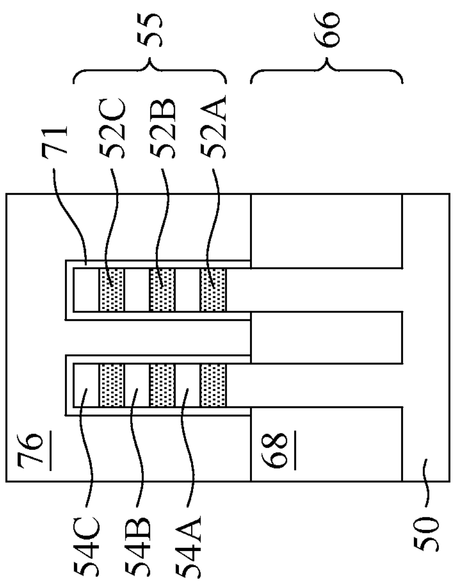
Figure 14B:
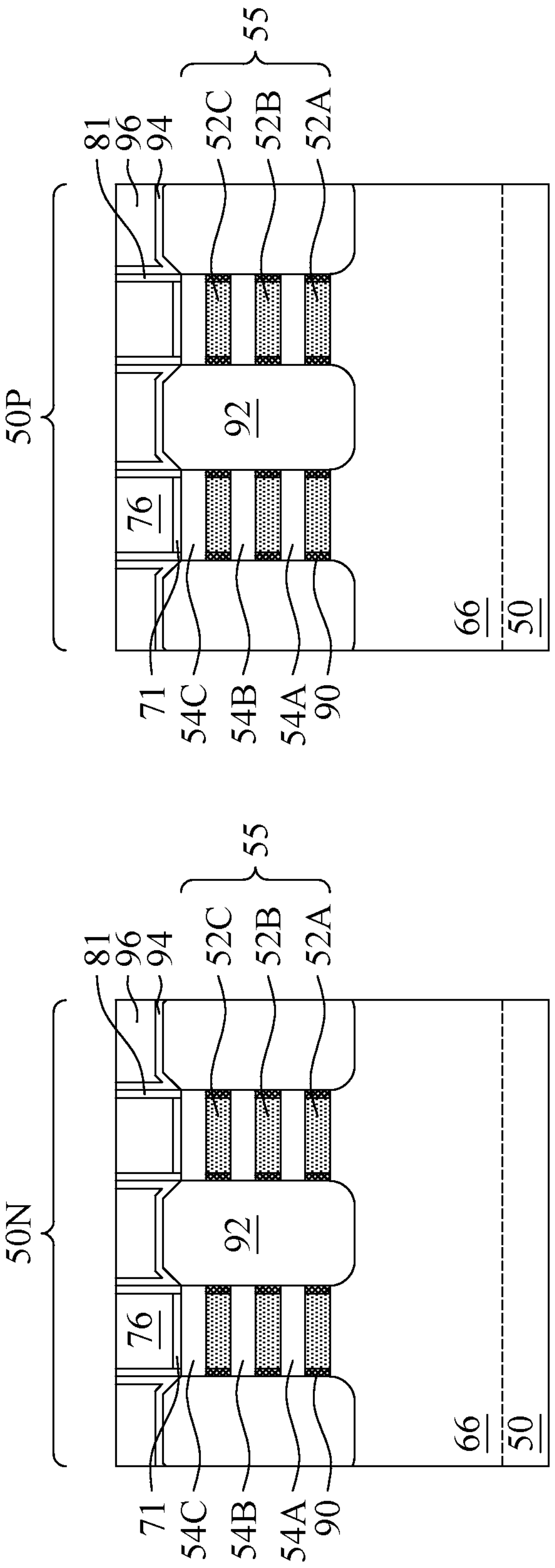

In FIGS. 14A-14B, a planarization process, such as a CMP, may be performed to level the top surface of the first ILD 96 with the top surfaces of the dummy gates 76 or the masks 78. The planarization process may also remove the masks 78 on the dummy gates 76, and portions of the first spacers 81 along sidewalls of the masks 78. After the planarization process, top surfaces of the dummy gates 76, the first spacers 81, and the first ILD 96 are level within process variations. Accordingly, the top surfaces of the dummy gates 76 are exposed through the first ILD 96. In some embodiments, the masks 78 may remain, in which case the planarization process levels the top surface of the first ILD 96 with top surface of the masks 78 and the first spacers 81.

In FIGS. 15A-B and FIGS. 16A-B, isolation structures 99 (see FIGS. 16A-16B) are formed, in accordance with some embodiments. One or more isolation structures 99 may be formed to electrically isolate adjacent nano-FETs or adjacent devices comprising nano-FETs. In some embodiments, the isolation structures 99 can also "cut" a single fin or a single fin structure into separate fins 66 of respective nano-FETs. In some cases, forming fins 66 by patterning a continuous fin structure and then cutting it into separate fins 66 can allow for improved patterning of the fins 66, such as when the separate fins 66 have different widths. In some embodiments, the isolation structures 99 may be considered "dielectric dummy gates," "dummy gate structures," or "gate isolation structures."

Figure 15A:
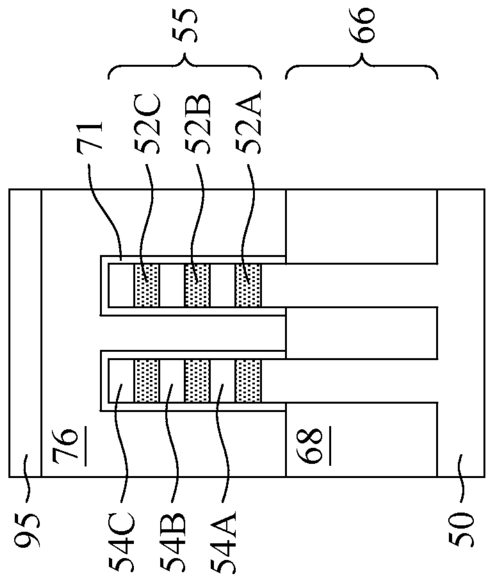
Figure 15B:
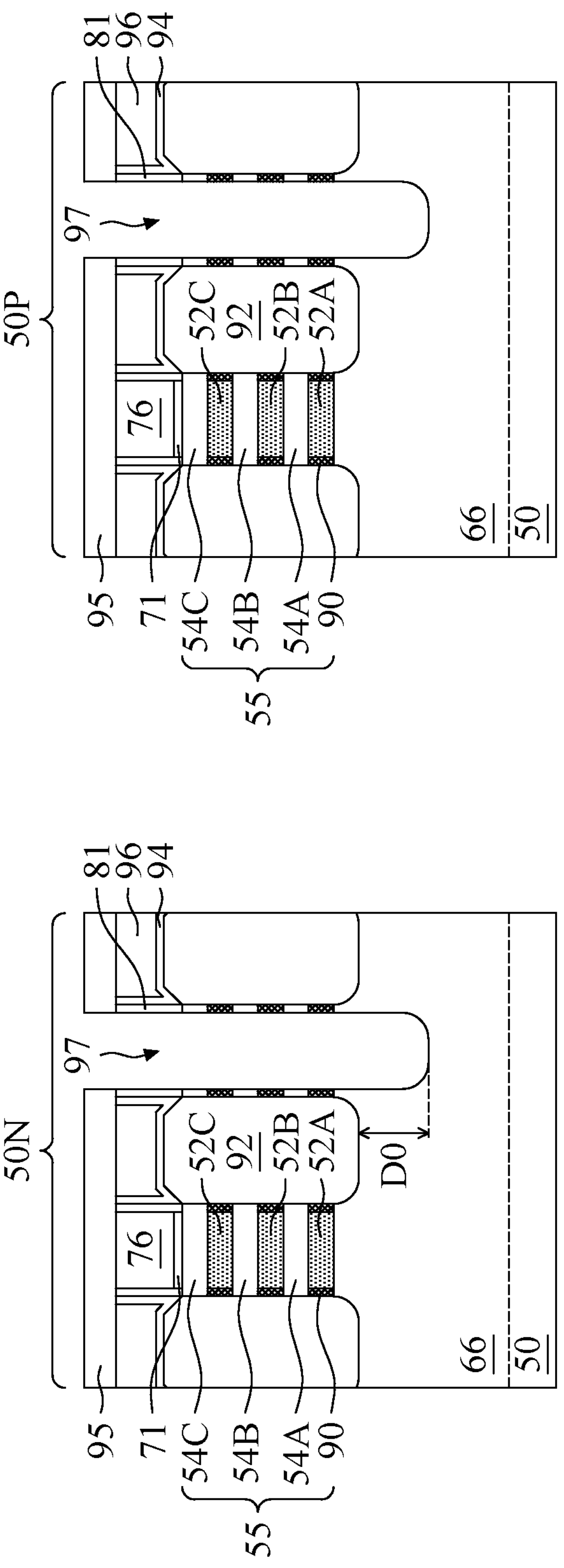

In FIGS. 15A and 15B, recesses 97 are formed in the dummy gates 76, the dummy gate dielectrics 71, the fins 66, the nanostructures 55, and the substrate 50, in accordance with some embodiments. Isolation structures 99 will be subsequently formed in the recesses 97. The recesses 97 may extend through the first nanostructures 52 and the second nanostructures 54, and may extend into the substrate 50. The recesses 97 may be formed by forming a photoresist 95 or other mask structure and patterning the photoresist 95 using acceptable photolithography techniques. The recesses 97 may be formed by then using the patterned photoresist 95 as an etch mask while etching the dummy gates 76, the fins 66, the nanostructures 55, and the substrate 50 using anisotropic etching processes, such as RIE, NBE, or the like. A single etch process or multiple etch processes may be used to etch the various materials or layers when forming the recesses 97. Timed etch processes may be used to stop the etching of the recesses 97 after the recesses 97 reach a desired depth. In some embodiments, the recesses 97 may extend below the epitaxial source/drain regions 92 a depth Do that is in the range of about 5 nm to about 150 nm, though other depths are possible. In some embodiments, the etching of the recesses 97 may remove some or all of the second nanostructures 54, the first inner spacers 90, and/or the first spacers 81. In some embodiments, after forming the recesses 97, portions of the second nanostructures 54, the first inner spacers 90, and/or the first spacers 81 may remain, as shown in FIG. 15B. The recesses 97 may extend between corresponding pairs of first spacers 81, and may have a length Lo that is approximately the same as a length of the replacement gates (see FIGS. 19A-19B). After forming the recesses 97, the photoresist 95 may be removed using suitable techniques. This is an example process for forming the recesses 97, and other processes are possible. For example, in other embodiments, some or all of the recesses 97 may be etched simultaneously with other features such as the recesses 98 (see FIGS. 17A-18B) or the recesses 104 (see FIGS. 20A-20B).

Figures 16A, 16B:
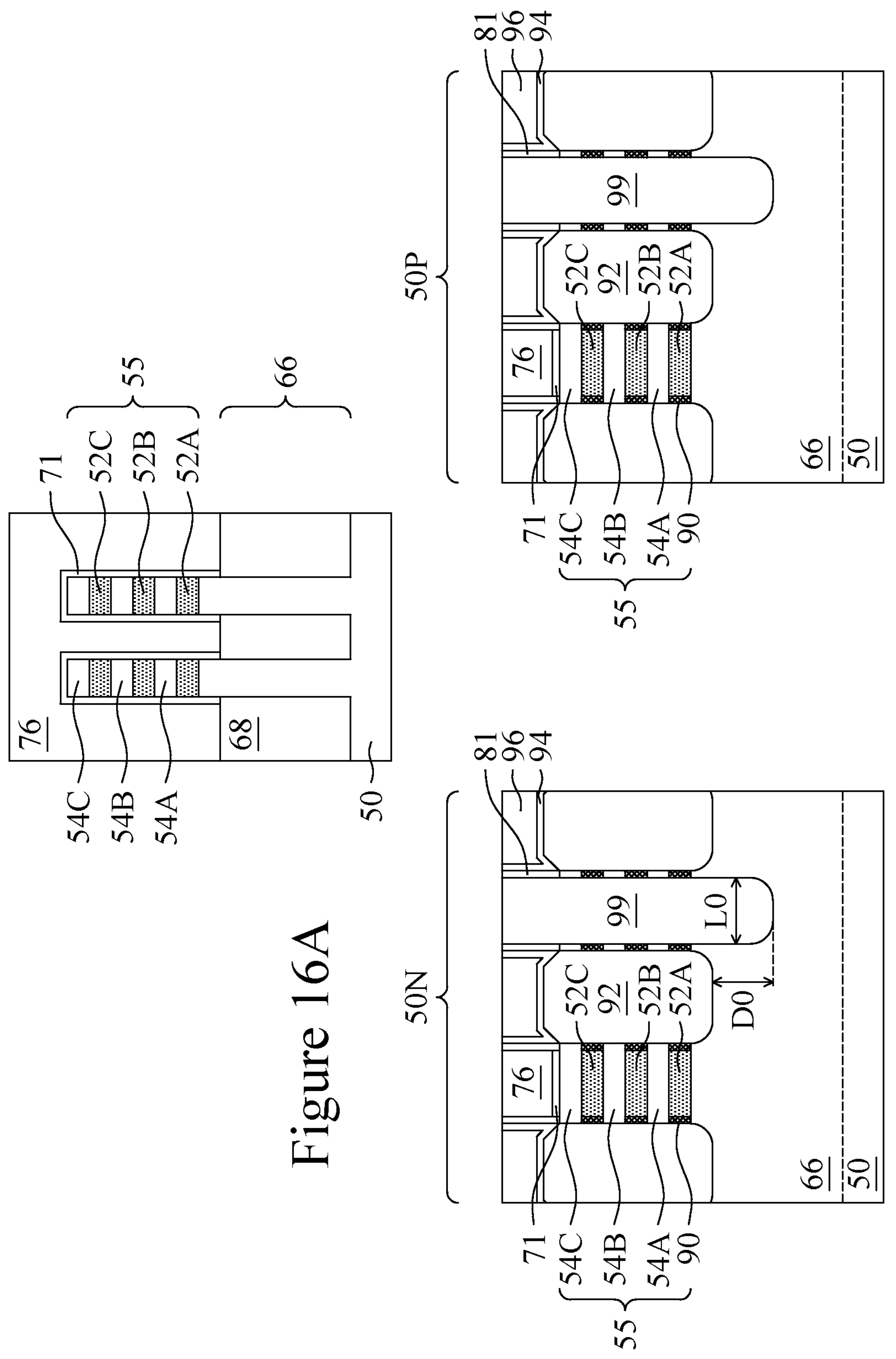

In FIGS. 16A and 16B, dielectric material is deposited into the recesses 97 to form isolation structures 99, in accordance with some embodiments. The dielectric material may comprise one or more layers of one or more different materials, in some cases. In some embodiments, the dielectric material comprises one or more materials such as silicon oxide; silicon nitride; silicon oxycarbide; silicon oxycarbonitride; a metal oxide such as hafnium oxide, tantalum oxide, titanium oxide, zirconium oxide, aluminum oxide, yttrium oxide, or the like; a combination thereof; or the like. Other materials or combinations of materials are possible. The dielectric material may be deposited using one or more suitable techniques such as ALD, CVD, PVD, or the like. The dielectric material may be different from the material of the first ILD 96, in some embodiments. After filling the recesses 97 with the dielectric material, excess dielectric material may be removed using, for example, a CMP process or the like, which may leave top surfaces of the isolation structures 99 and the first ILD 96 substantially level.

In other embodiments, the isolation structures 99 may be formed by depositing a conductive material within the recesses 97. The conductive material may be subsequently electrically connected to an appropriate voltage to provide electrical isolation for nano-FETs or devices. The conductive material may comprise, for example, polysilicon, a metal, or the like. In some embodiments, the conductive material may be the same as a subsequently formed gate electrode (see FIGS. 19A-19B) and may be deposited using the same deposition steps as the gate electrode.

Figure 17A:
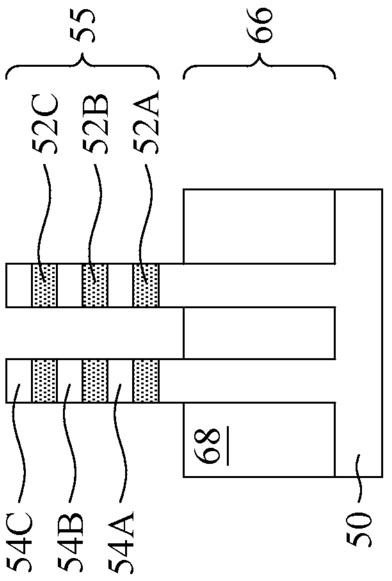
Figure 17B:
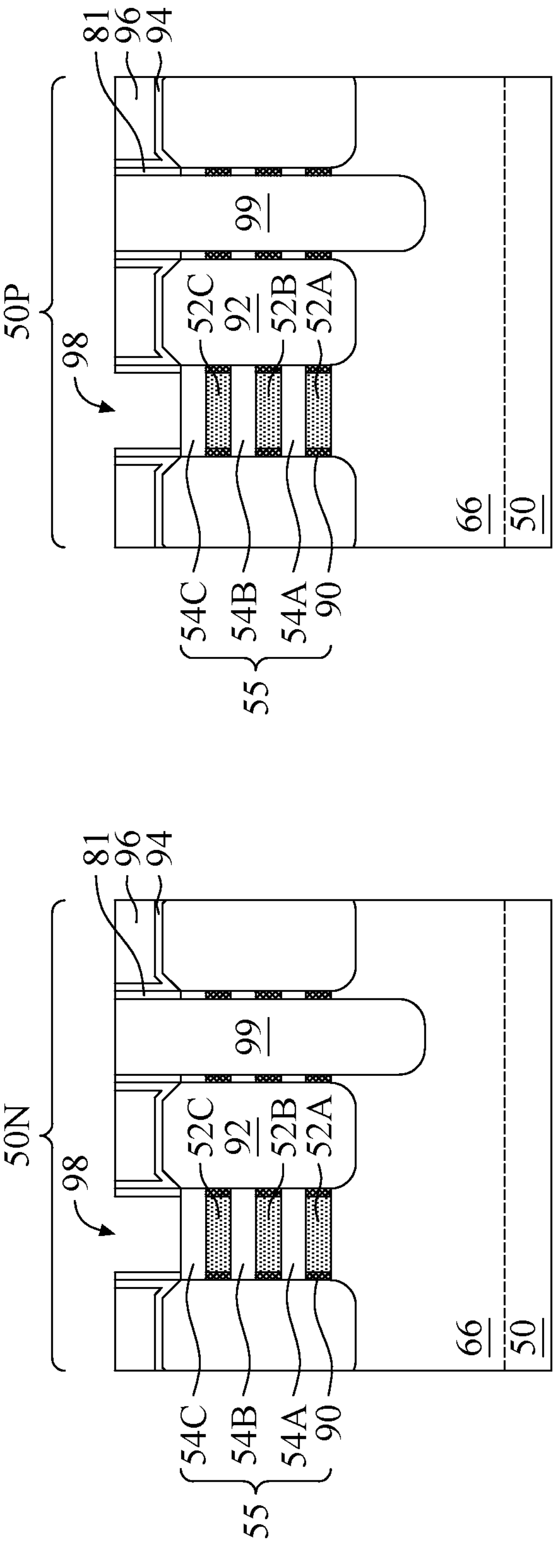

In FIGS. 17A and 17B, the dummy gates 76, and the masks 78 if present, are removed in one or more etching steps, so that second recesses 98 are formed. Portions of the dummy gate dielectrics 71 in the second recesses 98 are also be removed. In some embodiments, the dummy gates 76 and the dummy gate dielectrics 71 are removed by an anisotropic dry etch process. For example, the etching process may include a dry etch process using reaction gas(es) that selectively etch the dummy gates 76 at a faster rate than the first ILD 96 or the first spacers 81. Each second recess 98 exposes and/or overlies portions of nanostructures 55, which act as channel regions in subsequently completed nano-FETs. Portions of the nanostructures 55 which act as the channel regions are disposed between neighboring pairs of the epitaxial source/drain regions 92. During the removal, the dummy gate dielectrics 71 may be used as etch stop layers when the dummy gates 76 are etched. The dummy gate dielectrics 71 may then be removed after the removal of the dummy gates 76. In other embodiments, the second recesses 98 are formed as part of the formation of the recesses 97, or vice versa.

Figure 18A:
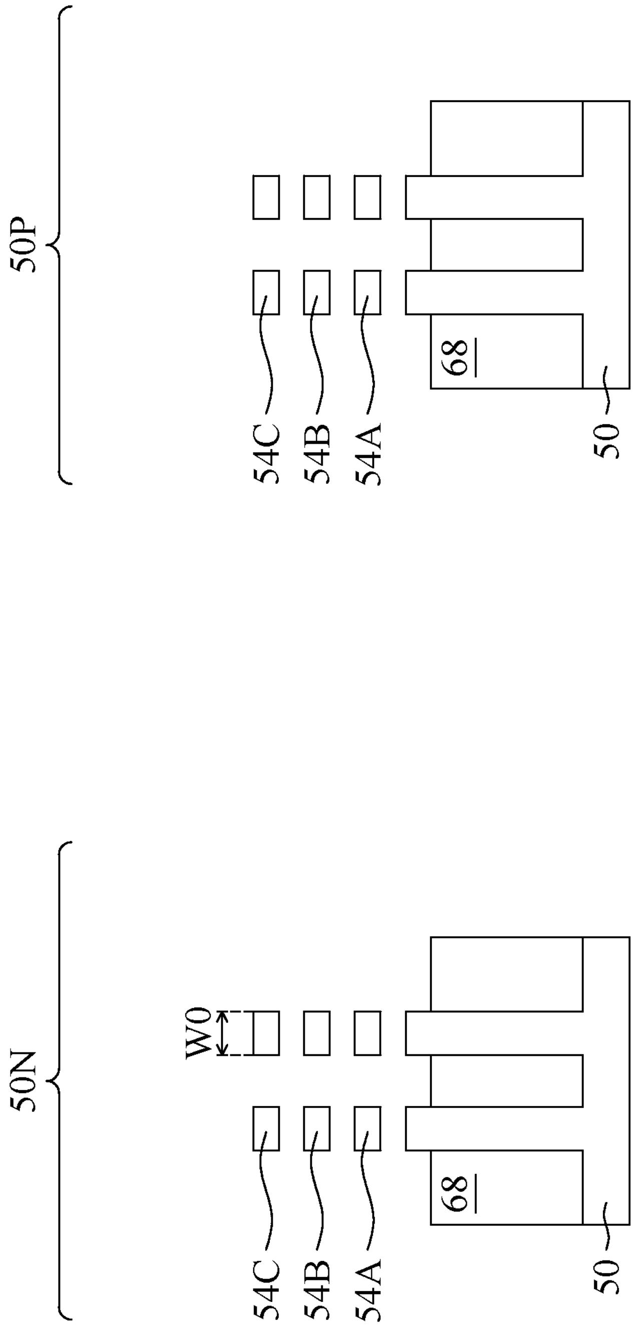
Figure 18B:
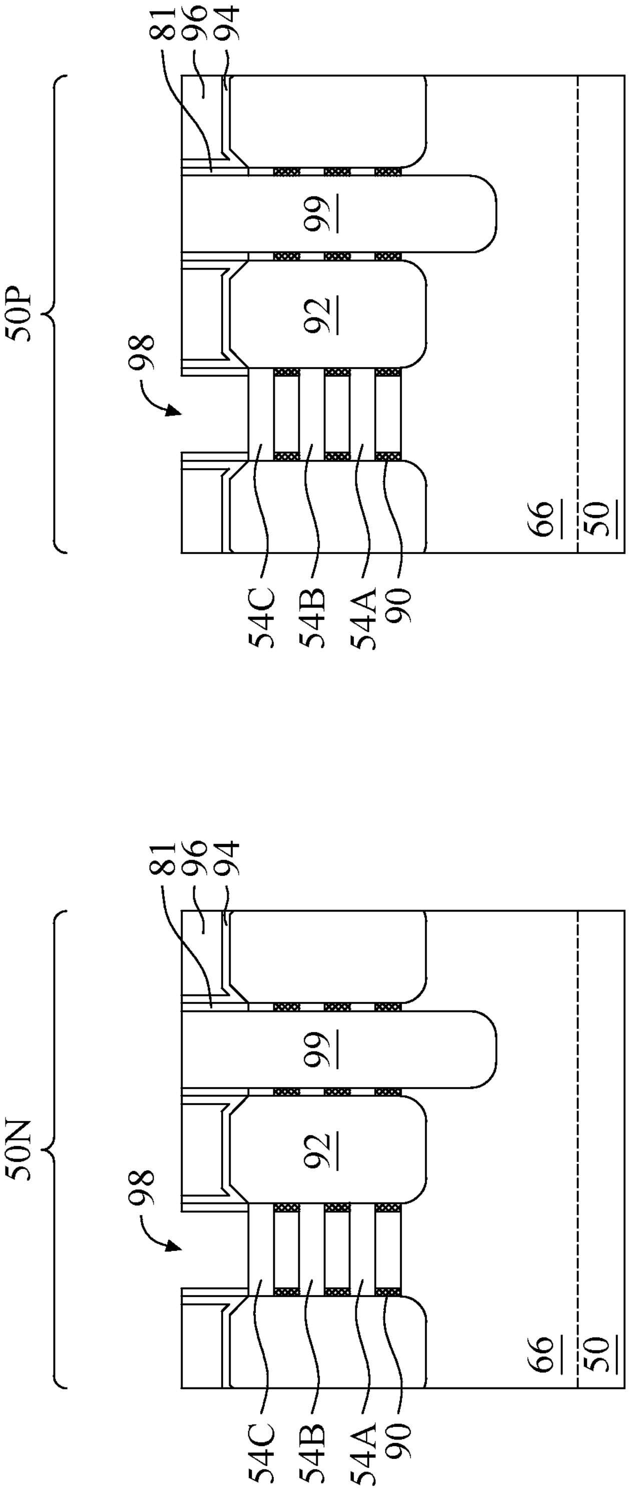

In FIGS. 18A and 18B, the first nanostructures 52 in the n-type region 50N and the p-type region 50P are removed, extending the second recesses 98. The first nanostructures 52 may be removed by performing an isotropic etching process such as wet etching or the like using etchants which are selective to the materials of the first nanostructures 52, while the second nanostructures 54, the substrate 50, the STI regions 58 remain relatively unetched as compared to the first nanostructures 52. In embodiments in which the first nanostructures 52 include, e.g., silicon-germanium, and the second nanostructures 54A-54C include, e.g., silicon or silicon carbide, then tetramethylammonium hydroxide (TMAH), ammonium hydroxide ($NH_4OH$), or the like may be used to remove the first nanostructures 52 in the n-type region 50N. Other materials or etchants are possible.

The remaining second nanostructures 54 are used to provide channel regions for the n-type region 50N and the p-type region 50P, and thus may also be referred to as channel regions 54 or channels 54 herein. In some embodiments, the channel regions 54 may have a width W0 (e.g., a "channel width") that is in the range of about 5 nm to about 100 nm, though other widths are possible. The channel regions 54 may have a thickness in the range of about 4 nm to about 10 nm, though other thicknesses are possible. Adjacent channel regions 54 may have a vertical separation in the range of about 6 nm to about 20 nm and may have a vertical pitch in the range of about 10 nm to about 30 nm, though other distances are possible.

Figure 19A:
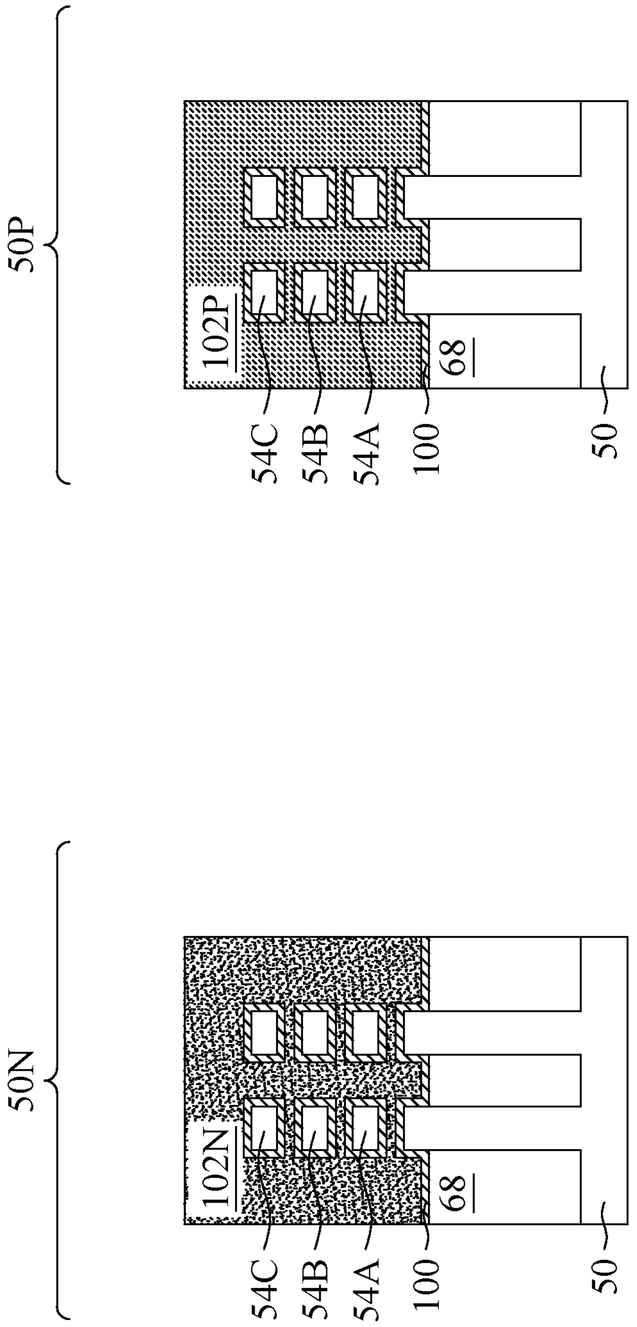
Figure 19B:
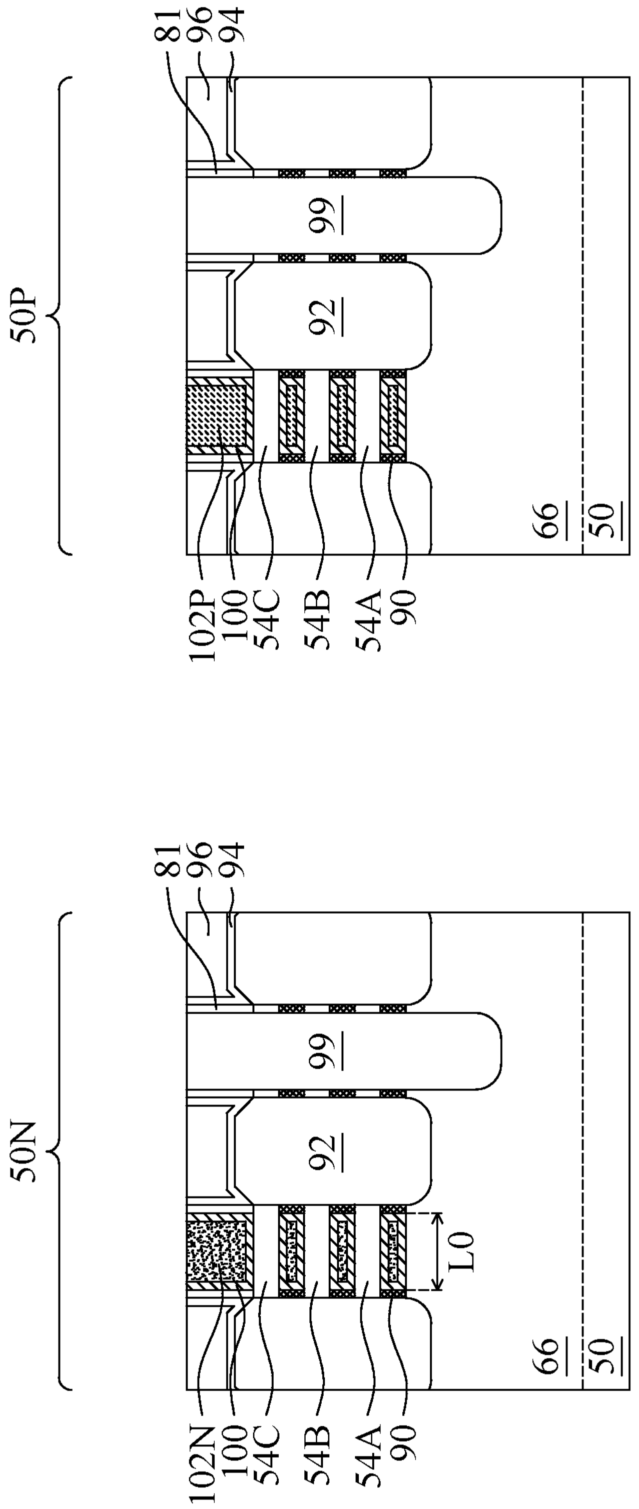

In FIGS. 19A and 19B, gate dielectric layers 100 and gate electrodes 102 are formed for replacement gates. The gate electrodes 102 include gate electrodes 102N formed in the n-type region 50N and gate electrodes 102P formed in the p-type region 50P. The gate dielectric layers 100 are deposited conformally in the second recesses 98. In the n-type region 50N and the p-type region 50P, the gate dielectric layers 100 may be formed on top surfaces and sidewalls of the substrate 50 and on top surfaces, sidewalls, and bottom surfaces of the second nanostructures 54. The gate dielectric layers 100 may also be deposited on top surfaces of the first ILD 96, the CESL 94, the first spacers 81, and the STI regions 58.

In accordance with some embodiments, the gate dielectric layers 100 comprise one or more dielectric layers, such as an oxide, a metal oxide, the like, or combinations thereof. For example, in some embodiments, the gate dielectrics may comprise a silicon oxide layer and a metal oxide layer over the silicon oxide layer. In some embodiments, the gate dielectric layers 100 include a high-k dielectric material, and in these embodiments, the gate dielectric layers 100 may have a k value greater than about 7.0, and may include a metal oxide or a silicate of hafnium, aluminum, zirconium, lanthanum, manganese, barium, titanium, lead, and combinations thereof. The structure of the gate dielectric layers 100 may be the same or different in the n-type region 50N and the p-type region 50P. The formation methods of the gate dielectric layers 100 may include molecular-beam deposition (MBD), ALD, PECVD, or the like.

The gate electrodes 102 are deposited over the gate dielectric layers 100, respectively, and fill the remaining portions of the second recesses 98. The gate electrodes 102 may include a metal-containing material such as titanium nitride, titanium oxide, tantalum nitride, tantalum carbide, cobalt, ruthenium, aluminum, tungsten, combinations thereof, or multi-layers thereof. For example, although single layer gate electrodes 102 are illustrated in FIGS. 19A and 19B, the gate electrodes 102 may comprise any number of liner layers, any number of work function tuning layers, and a fill material. Any combination of the layers which make up the gate electrodes 102 may be deposited in the n-type region 50N and in the p-type region 50P between adjacent ones of the second nanostructures 54 and between the second nanostructure 54A and the substrate 50.

The formation of the gate dielectric layers 100 in the n-type region 50N and the p-type region 50P may occur simultaneously such that the gate dielectric layers 100 in each region are formed from the same materials. The formation of the gate electrodes 102N and the gate electrodes 102P may occur simultaneously such that the gate electrodes 102 in each region are formed from the same materials. In some embodiments, the gate dielectric layers 100 in each region may be formed by distinct processes, such that the gate dielectric layers 100 may be different materials and/or have a different number of layers, and/or the gate electrodes 102 in each region may be formed by distinct processes, such that the gate electrodes 102 may be different materials and/or have a different number of layers. Various masking steps may be used to mask and expose appropriate regions when using distinct processes.

After the filling of the second recesses 98, a planarization process, such as a CMP, may be performed to remove the excess portions of the gate dielectric layers 100 and the material of the gate electrodes 102, which excess portions are over the top surface of the first ILD 96. The remaining portions of material of the gate electrodes 102 and the gate dielectric layers 100 thus form replacement gate structures of the resulting nano-FETs. The gate electrodes 102 and the gate dielectric layers 100 may be collectively referred to as "gate stacks" or "gate structures."

In FIGS. 20A-B and FIGS. 21A-B, gate cut regions 107 (see FIGS. 21A-21B) are formed, in accordance with some embodiments. One or more gate cut regions 107 may be formed to electrically isolate adjacent nano-FETs or adjacent devices comprising nano-FETs. In some embodiments, the gate cut regions 107 can also "cut" a single gate structure into separate gate structures of respective nano-FETs. The gate cut regions 107 may also be referred to as "gate end dielectrics," "gate end isolation structures," or "gate end structures." A region of a gate structure between a channel region 54 and a gate cut region 107 may be referred to as a "gate end" or "gate cap."

Figure 20A:
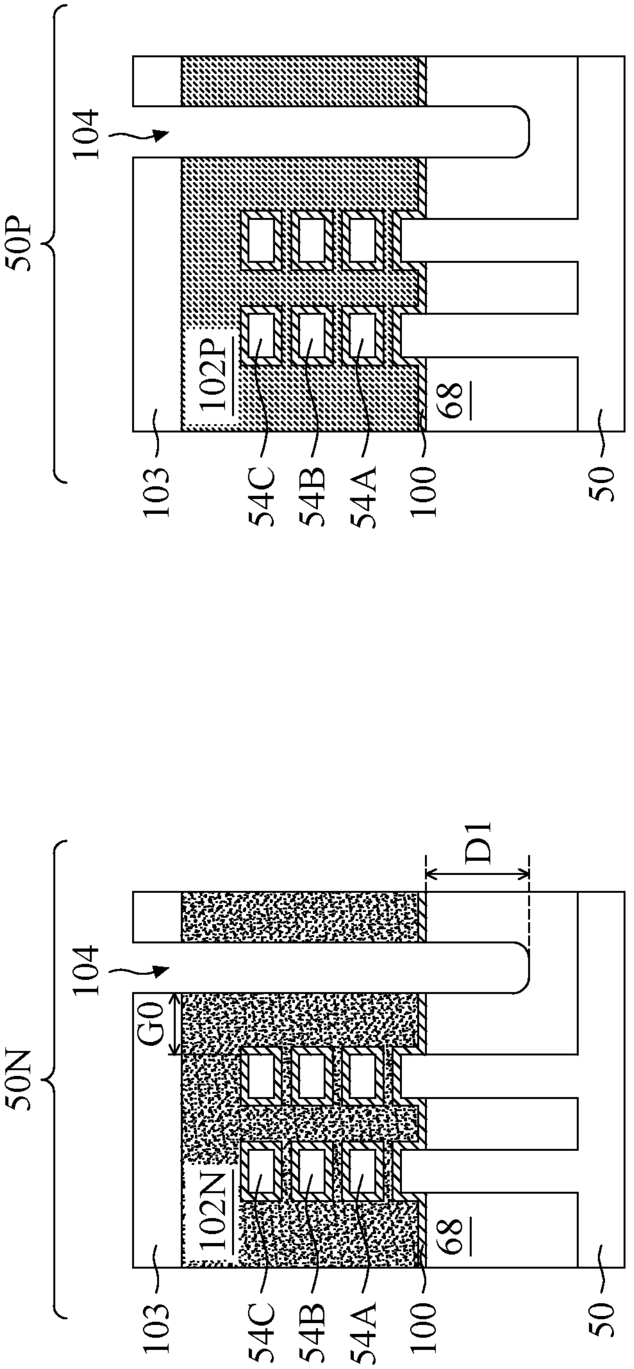
Figure 20B:
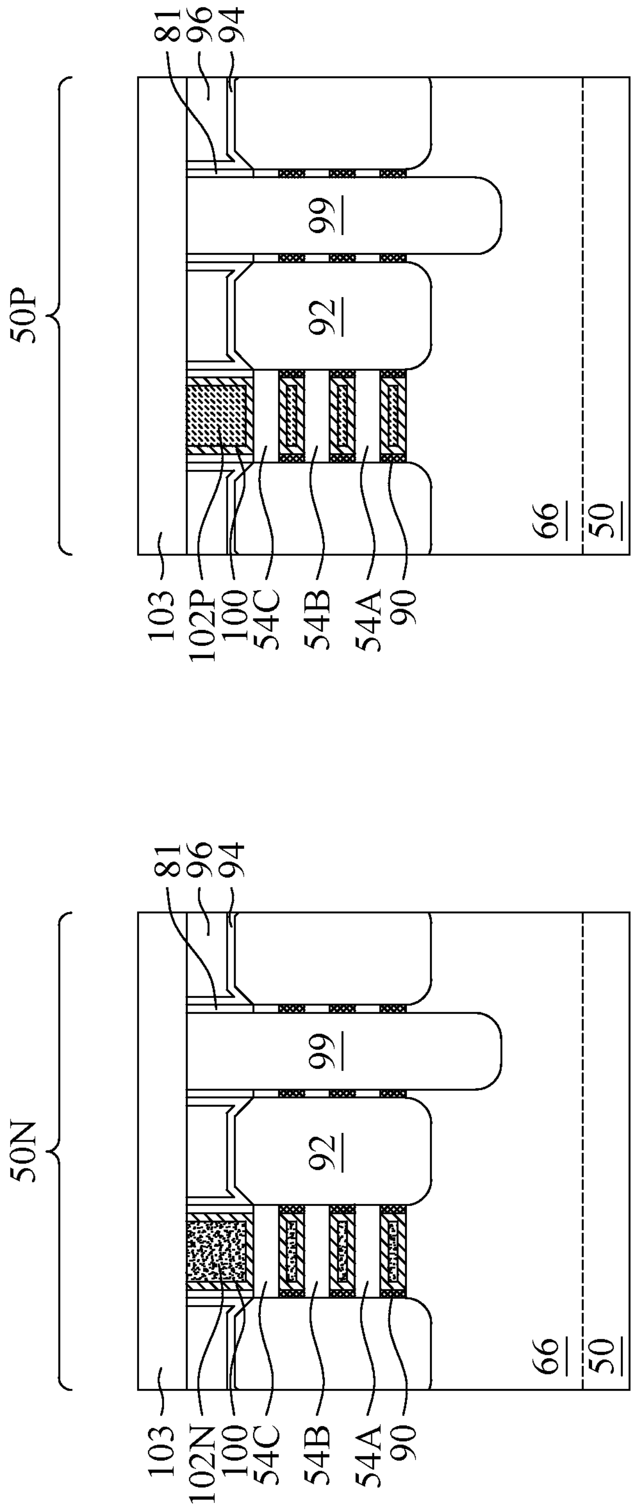

In FIGS. 20A and 20B, recesses 104 are formed in the gate structures (e.g., in the gate electrodes 102 and the gate dielectric layers 100) and in the isolation regions 68, in accordance with some embodiments. Gate cut regions 107 will be subsequently formed in the recesses 104. The recesses 104 may extend through the gate electrodes 102 and the gate dielectric layers 100, and may extend into the isolation regions 68. The recesses 104 may be formed by forming a photoresist 103 or other mask structure and patterning the photoresist 103 using acceptable photolithography techniques. The recesses 104 may be formed by then using the patterned photoresist 103 as an etch mask while etching the gate structures and the isolation regions 68 using anisotropic etching processes, such as RIE, NBE, or the like. A single etch process or multiple etch processes may be used to etch the various materials or layers when forming the recesses 104. Timed etch processes may be used to stop the etching of the recesses 104 after the recesses 104 reach a desired depth. In some embodiments, the recesses 104 may extend below the gate structure and into the isolation regions 68 a depth Di that is in the range of about 10 nm to about 150 nm, though other depths are possible. In some embodiments, a recess 104 may be separated from an adjacent channel region 54 by a separation distance Go (e.g., the "gate end distance") that is in the range of about 3 nm to about 60 nm, though other separation distances are possible. After forming the recesses 104, the photoresist 103 may be removed using suitable techniques. This is an example process for forming the recesses 104, and other processes are possible.

Figure 21A:
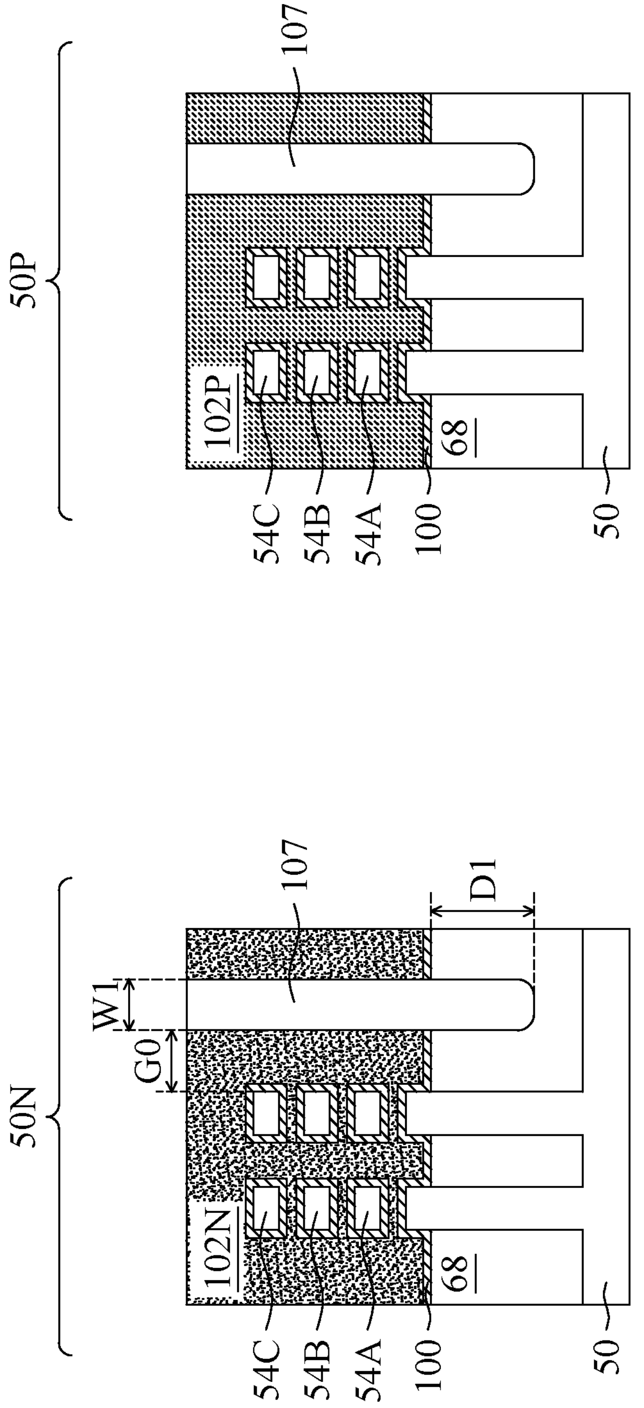
Figure 21B:
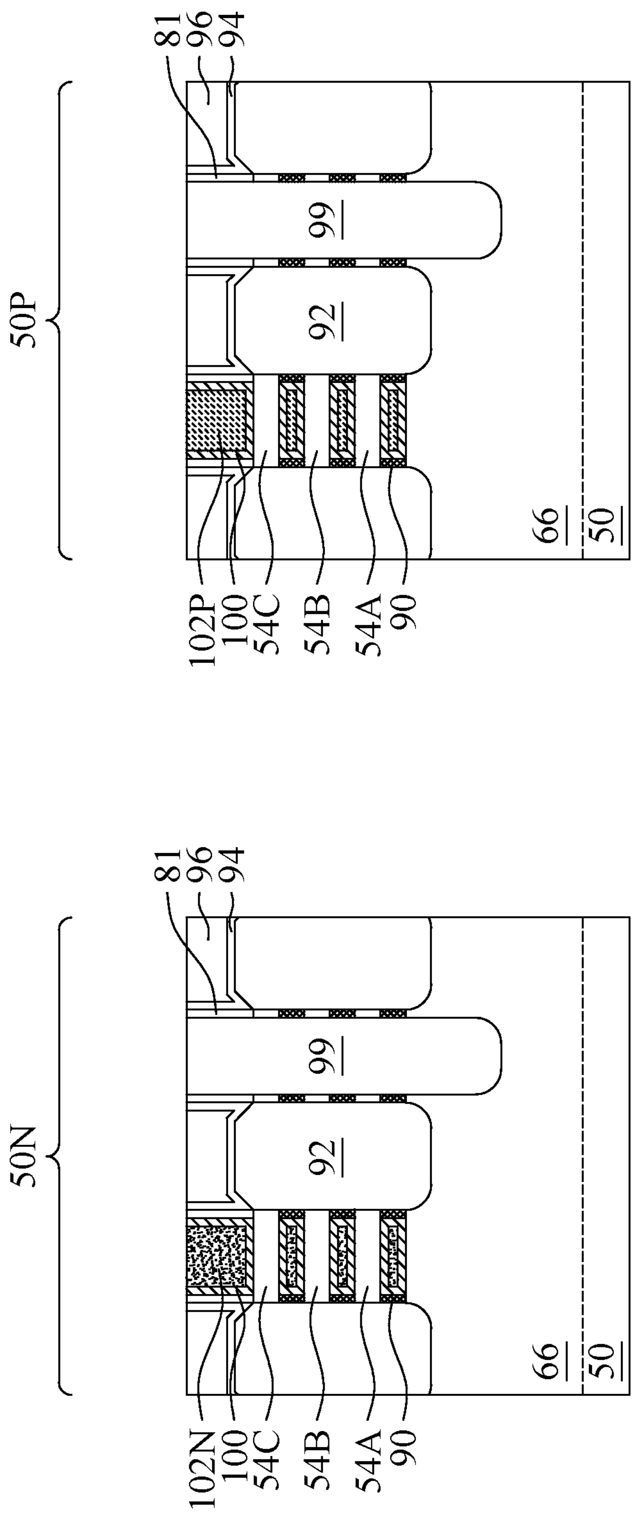

In FIGS. 21A and 21B, dielectric material is deposited into the recesses 104 to form gate cut regions 107, in accordance with some embodiments. The dielectric material may comprise one or more layers of one or more different materials, in some cases. In some embodiments, the dielectric material comprises one or more materials such as silicon oxide; silicon nitride; silicon oxycarbide; silicon oxycarbonitride; a metal oxide such as hafnium oxide, tantalum oxide, titanium oxide, zirconium oxide, aluminum oxide, yttrium oxide, or the like; a combination thereof; or the like. Other materials or combinations of materials are possible. The dielectric material may be deposited using one or more suitable techniques such as ALD, CVD, PVD, or the like. The dielectric material may be different from the material of the first ILD 96 and/or the material of the isolation structures 99, in some embodiments. After filling the recesses 104 with the dielectric material, excess dielectric material may be removed using, for example, a CMP process or the like, which may leave top surfaces of the gate cut regions 107 and the gate structures substantially level. In some embodiments the gate cut regions 107 may have a width W1 that is in the range of about 5 nm to about 60 nm, though other widths are possible. A gate cut region 107 may be separated from a channel region 54 by the gate end distance Go. In some embodiments, the gate end distance Go may be controlled by controlling the width W1 and/or the location of the corresponding gate cut region 107. In some cases, the gate end distance Go may affect characteristics of the gate structure, such as the gate structure's capacitance or resistance. Embodiments in which the gate end distances of different nano-FETs are controlled to control certain characteristics of the nano-FETs are described below for FIGS. 25 through 35.

Figure 22A:
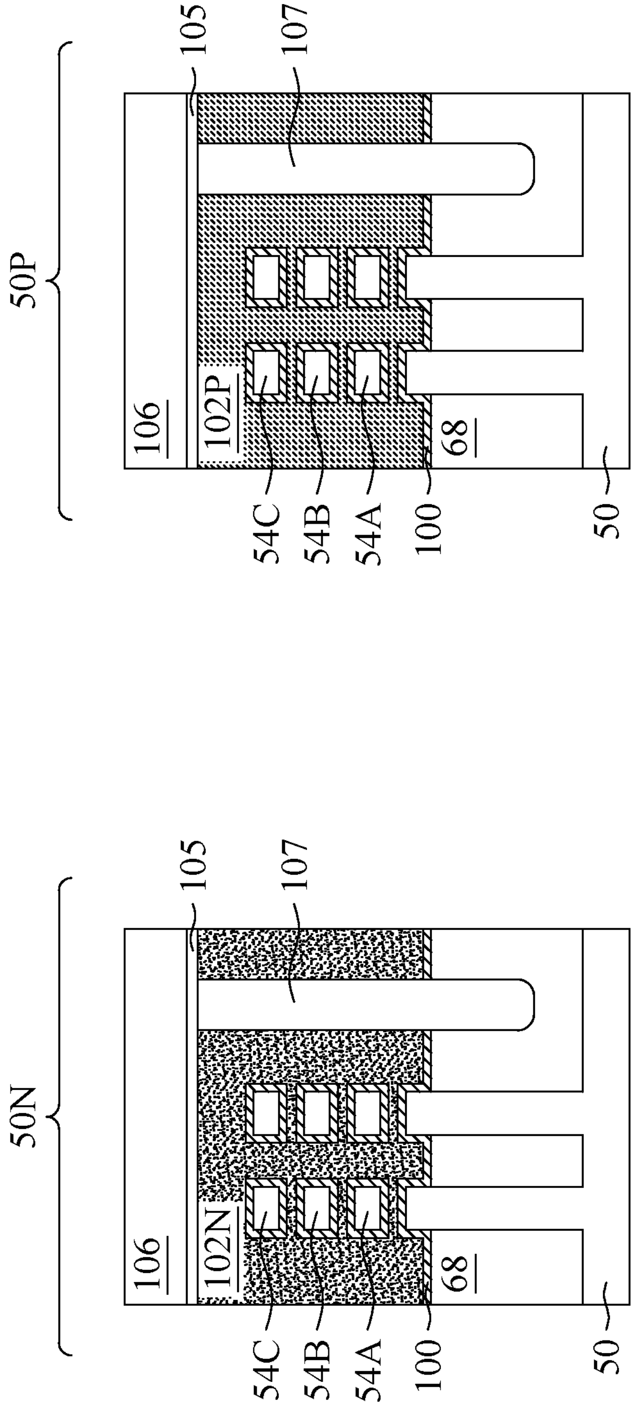
Figure 22B:
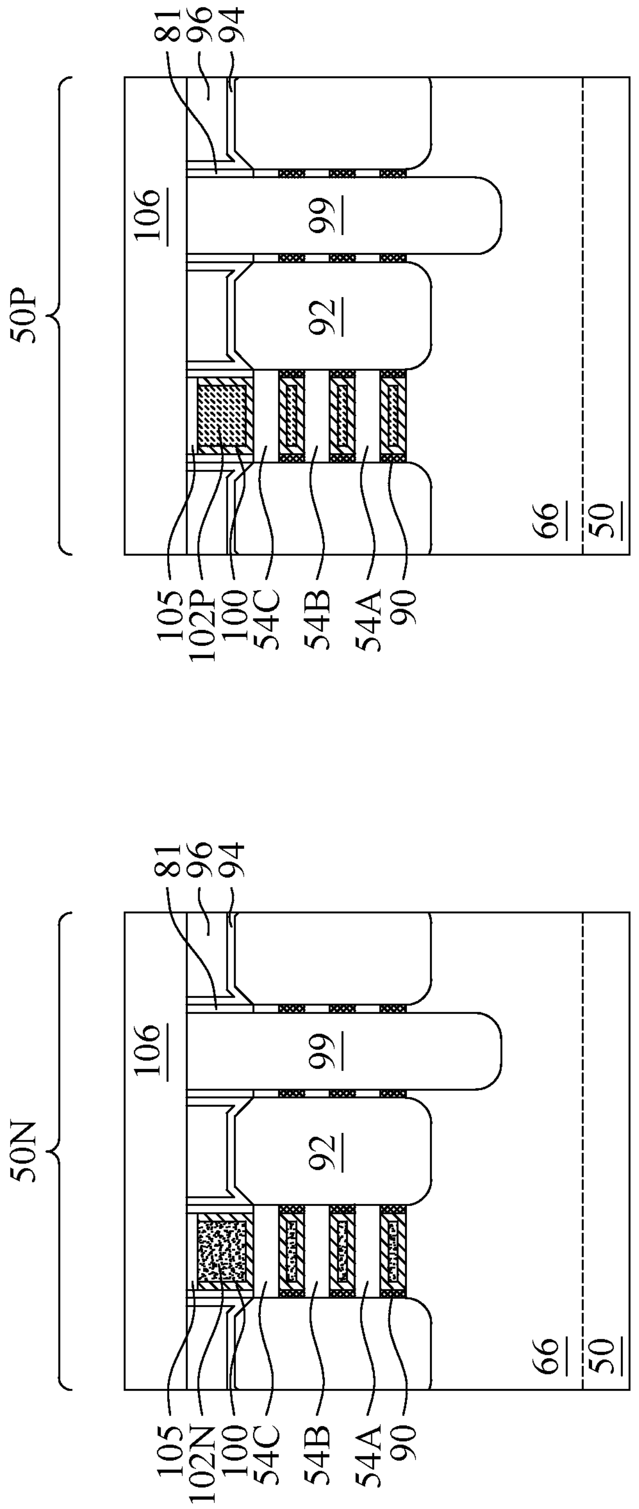
Figure 22C:
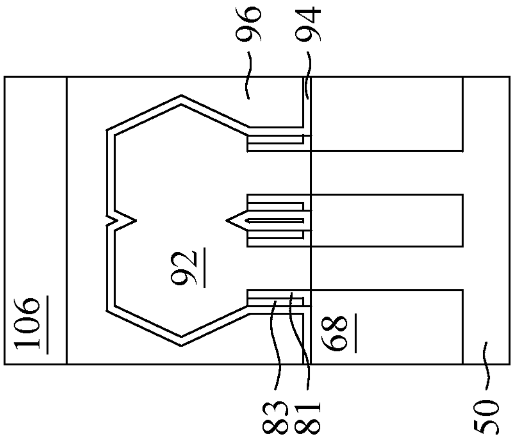

In FIGS. 22A-22C, the gate structures (including the gate dielectric layers 100 and the corresponding overlying gate electrodes 102) are recessed, such that a recess is formed directly over each gate structure and between opposing portions of first spacers 81. A gate mask 105 comprising one or more layers of dielectric material, such as silicon nitride, silicon oxynitride, or the like, is filled in the recess, followed by a planarization process to remove excess portions of the dielectric material extending over the first ILD 96. Subsequently formed gate contacts (such as the gate contacts 114, discussed below with respect to FIGS. 24A-24C) penetrate through the gate mask 105 to contact the top surface of the recessed gate electrodes 102.

As further illustrated by FIGS. 22A-22C, a second ILD 106 is deposited over the first ILD 96 and over the gate mask 105. In some embodiments, the second ILD 106 is a flowable film formed by FCVD. In some embodiments, the second ILD 106 is formed of a dielectric material such as PSG, BSG, BPSG, USG, or the like, and may be deposited by any suitable method, such as CVD, PECVD, or the like.

Figure 23A:
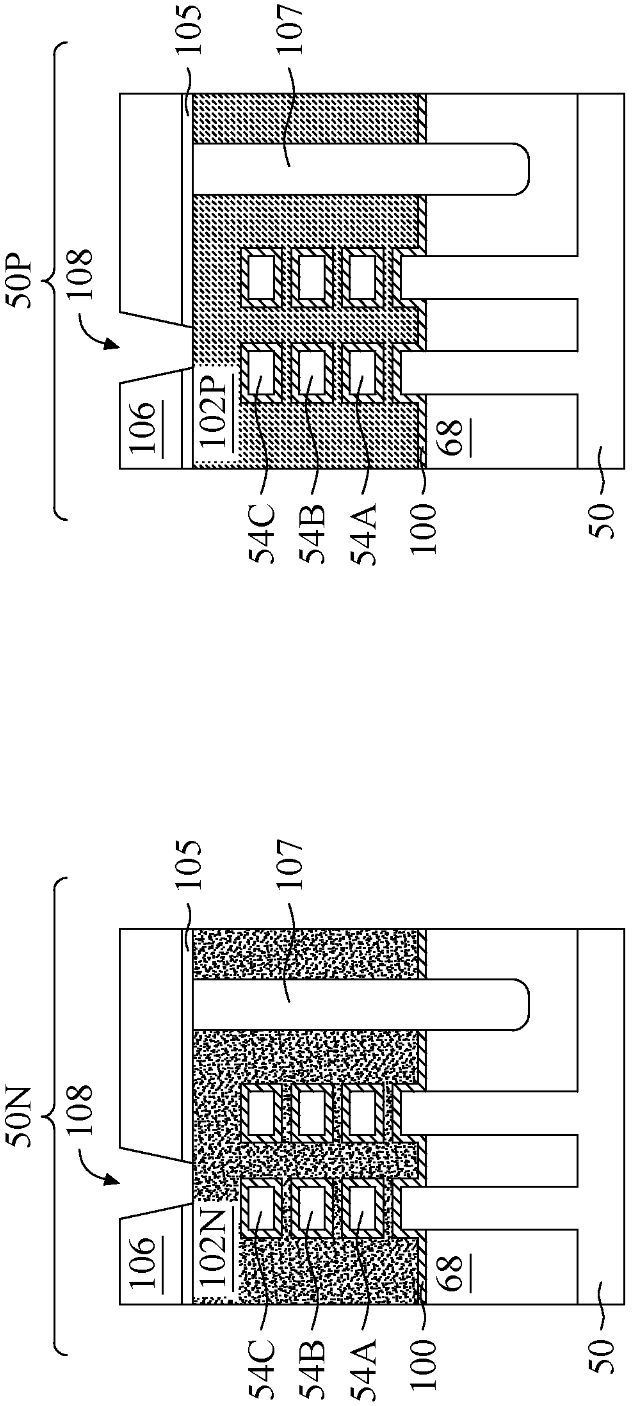
Figure 23B:
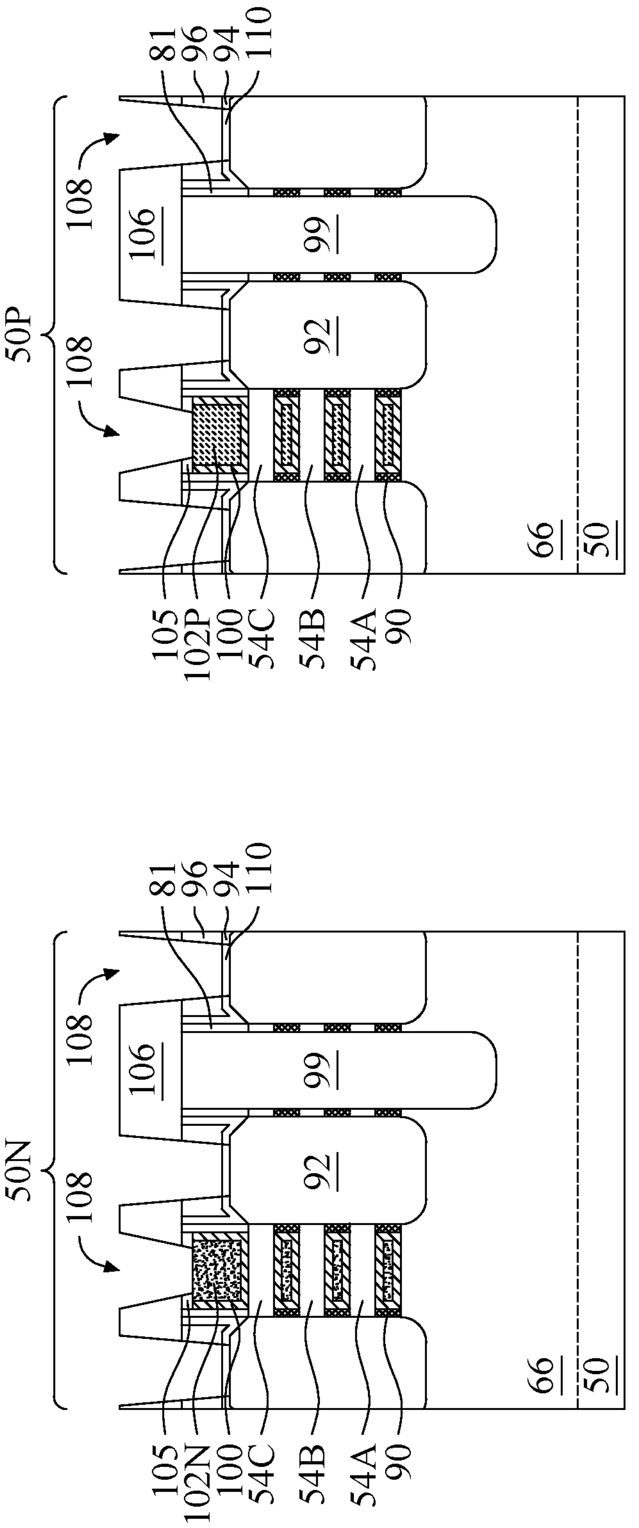
Figure 23C:
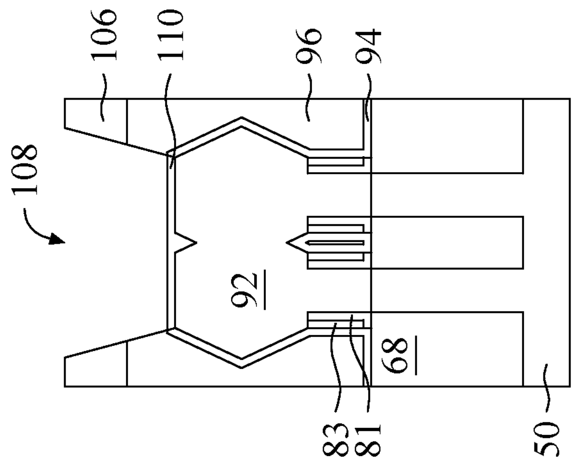

In FIGS. 23A-23C, the second ILD 106, the first ILD 96, the CESL 94, and the gate masks 105 are etched to form third recesses 108 exposing surfaces of the epitaxial source/drain regions 92 and/or the gate structures. The third recesses 108 may be formed by etching using an anisotropic etching process, such as RIE, NBE, or the like. In some embodiments, the third recesses 108 may be etched through the second ILD 106 and the first ILD 96 using a first etching process; may be etched through the gate masks 105 using a second etching process; and may then be etched through the CESL 94 using a third etching process. A mask, such as a photoresist, may be formed and patterned over the second ILD 106 to mask portions of the second ILD 106 from the first etching process and the second etching process. In some embodiments, the etching process may over-etch, and therefore, the third recesses 108 extend into the epitaxial source/drain regions 92 and/or the gate structure, and a bottom of the third recesses 108 may be level with (e.g., at a same level, or having a same distance from the substrate), or lower than (e.g., closer to the substrate) the epitaxial source/drain regions 92 and/or the gate structure. Although FIG. 23B illustrate the third recesses 108 as exposing the epitaxial source/drain regions 92 and the gate structure in a same cross section, in various embodiments, the epitaxial source/drain regions 92 and the gate structure may be exposed in different cross-sections, thereby reducing the risk of shorting subsequently formed contacts. After the third recesses 108 are formed, silicide regions 110 are formed over the epitaxial source/drain regions 92. In some embodiments, the silicide regions 110 are formed by first depositing a metal (not shown) capable of reacting with the semiconductor materials of the underlying epitaxial source/drain regions 92 (e.g., silicon, silicon-germanium, germanium) to form silicide or germanide regions, such as nickel, cobalt, titanium, tantalum, platinum, tungsten, other noble metals, other refractory metals, rare earth metals or their alloys, over the exposed portions of the epitaxial source/drain regions 92, then performing a thermal anneal process to form the silicide regions 110. The un-reacted portions of the deposited metal are then removed, e.g., by an etching process. Although silicide regions 110 are referred to as silicide regions, silicide regions 110 may also be germanide regions, or silicon-germanide regions (e.g., regions comprising silicide and germanide). In an embodiment, the silicide region 110 comprises TiSi, and has a thickness in a range between about 2 nm and about 10 nm.

Figure 24A:
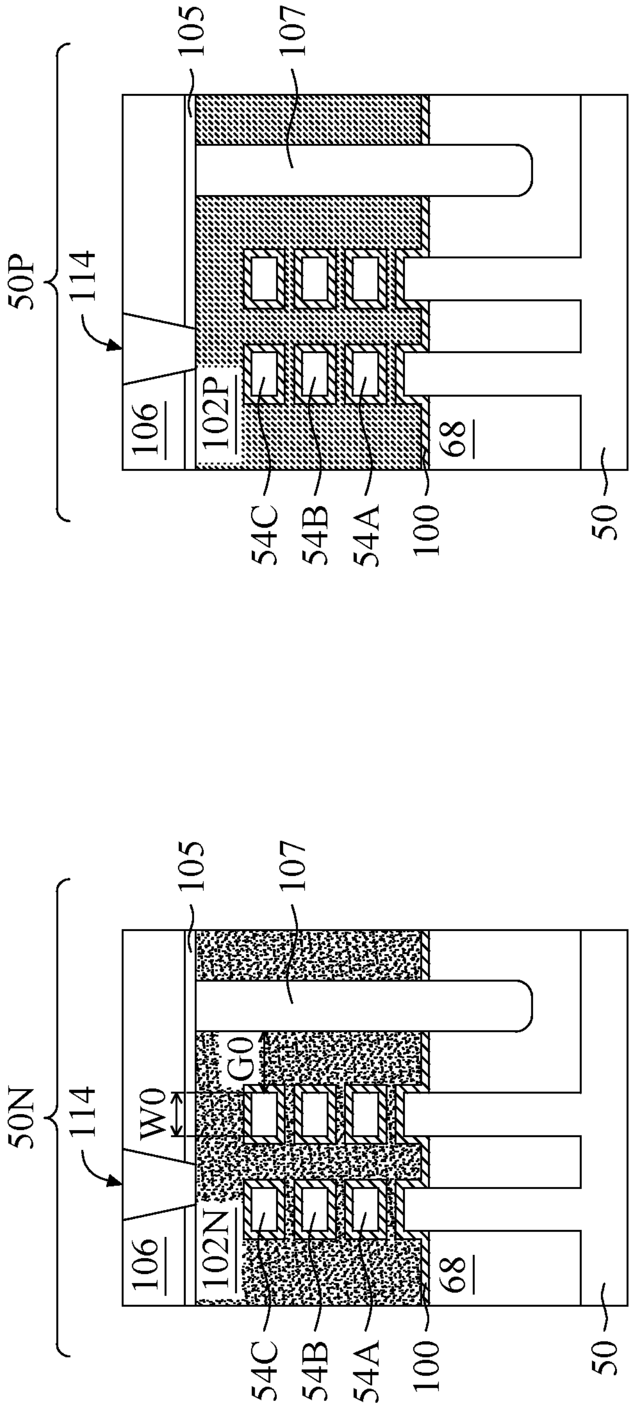
Figure 24B:
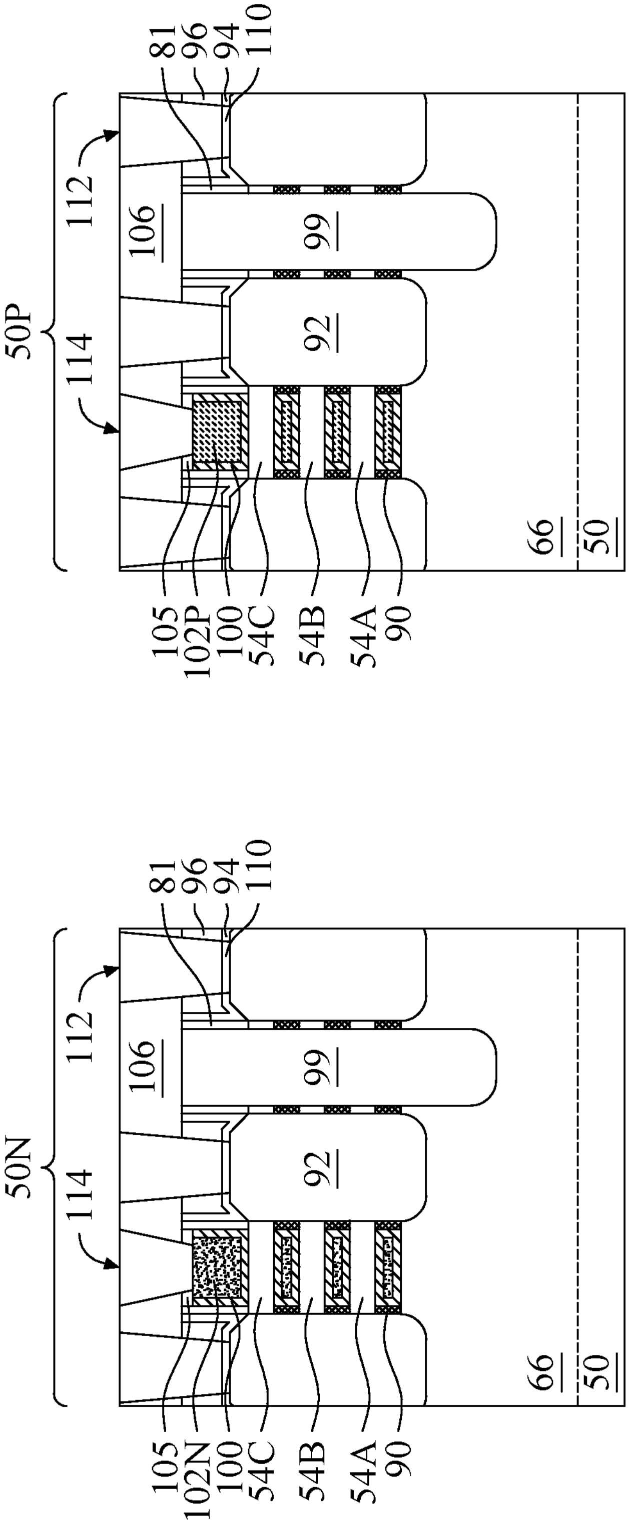
Figure 24C:
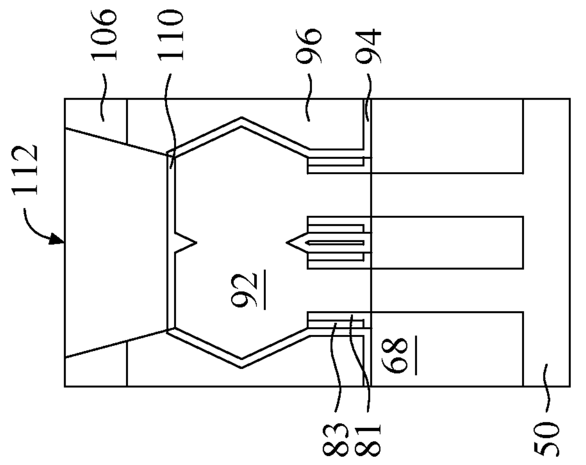

Next, in FIGS. 24A-24C, contacts 112 and 114 (which may also be referred to as contact plugs) are formed in the third recesses 108. The contacts 112 and 114 may each comprise one or more layers, such as barrier layers, diffusion layers, and fill materials. For example, in some embodiments, the contacts 112 and 114 each include a barrier layer and a conductive material, and is electrically coupled to the underlying conductive feature (e.g., the gate structure and/or silicide region 110 in the illustrated embodiment). The contacts 114 are electrically coupled to the gate structure and may be referred to as gate contacts, and the contacts 112 are electrically coupled to the silicide regions 110 and may be referred to as source/drain contacts. The barrier layer(s) may comprise titanium, titanium nitride, tantalum, tantalum nitride, or the like. The conductive material may comprise copper, a copper alloy, silver, gold, tungsten, cobalt, aluminum, nickel, ruthenium, or the like. A planarization process, such as a CMP, may be performed to remove excess material from a surface of the second ILD 106. Further processing may be performed, such as the formation of Inter-Metal Dielectric (IMD) layers over the contacts 112/114, through which vias or other conductive features may be formed that electrically connect to the contacts 112/114.

FIGS. 25 through 34B illustrate plan views and cross-sectional views of devices 200, 300, and 400 that each comprise multiple nano-FETs having different gate end distances, in accordance with some embodiments. The devices 200/300/400 include n-type nano-FETs and p-type nano-FETs that may be similar to the n-type nano-FETs of the n-type region 50N and the p-type nano-FETs of the p-type region 50P shown in FIG. 24B. The devices 200/300/400 include nano-FETs formed in a "CMOS" configuration, in which the gate structure of an n-type nano-FET physically and electrically contacts the gate structure of a p-type nano-FET. In this manner, the devices 200/300/400 include "CMOS devices" comprising one or more sets of nano-FETs in a CMOS configuration. In some cases, one CMOS device may be formed of nano-FETS having different channel widths than another CMOS device. For example, a first CMOS device may have relatively large channel widths and a second CMOS device may have relatively small channel widths. In some embodiments, a first CMOS device may have a channel width that is in the range of about 1.1 to about 5 times larger than a channel width of a second CMOS device.

The CMOS devices of the devices 200/300/400 may be separated and isolated by one or more isolation structures 99 and/or one or more gate cut regions 107. In some embodiments, the gate cut regions 107 may be formed having sidewall offsets (e.g., "jogs") and/or width variations that allow the nano-FETs of one CMOS device to have a different gate end distance than the nano-FETs of another CMOS device. The gate cut regions 107 may be formed as described above for FIGS. 20A-21B, with the offsets or width variations being determined by the pattern of the recesses 104. In some embodiments, a first CMOS device may have a gate end distance that is in the range of about 2 nm to about 20 nm larger than a channel width of a second CMOS device. In some cases, the gate end distances may also be controlled by controlling the locations of the channel regions 54 relative to the gate cut regions 107.

As mentioned previously, in some cases, some nano-FET characteristics can be controlled by controlling the gate end distance (e.g., Go shown in FIG. 24A). For example, reducing the gate end distance of a gate structure also reduces the size of the gate structure, which can reduce capacitance of the gate structure. In some cases, nano-FETs having a smaller channel width (e.g., W0 shown in FIG. 24A) are more sensitive to gate structure capacitance, and thus reducing the gate end distance can reduce gate structure capacitance and improve performance. Additionally, increasing the gate end distance of a gate structure can reduce current crowding in that gate end region of the gate structure, which can reduce resistance of the gate structure. In some cases, nano-FETs having a larger channel width, such as high-current nano-FETs, are more sensitive to gate structure resistance, and thus increasing the gate end distance can reduce gate structure resistance and improve performance. Embodiments described herein, such as those described for FIGS. 25 through 34B, allow for devices to be formed that include both nano-FETs having smaller channel widths with smaller gate end distances and nano-FETs having larger channel widths with larger gate end distances. In this manner, the overall performance of such devices can be improved by forming nano-FETs having different gate end distances. The embodiments shown are for illustrative purposes, and other numbers, configurations, or arrangements of nano-FETs or CMOS devices are possible and considered within the scope of the present disclosure.

Figure 25:
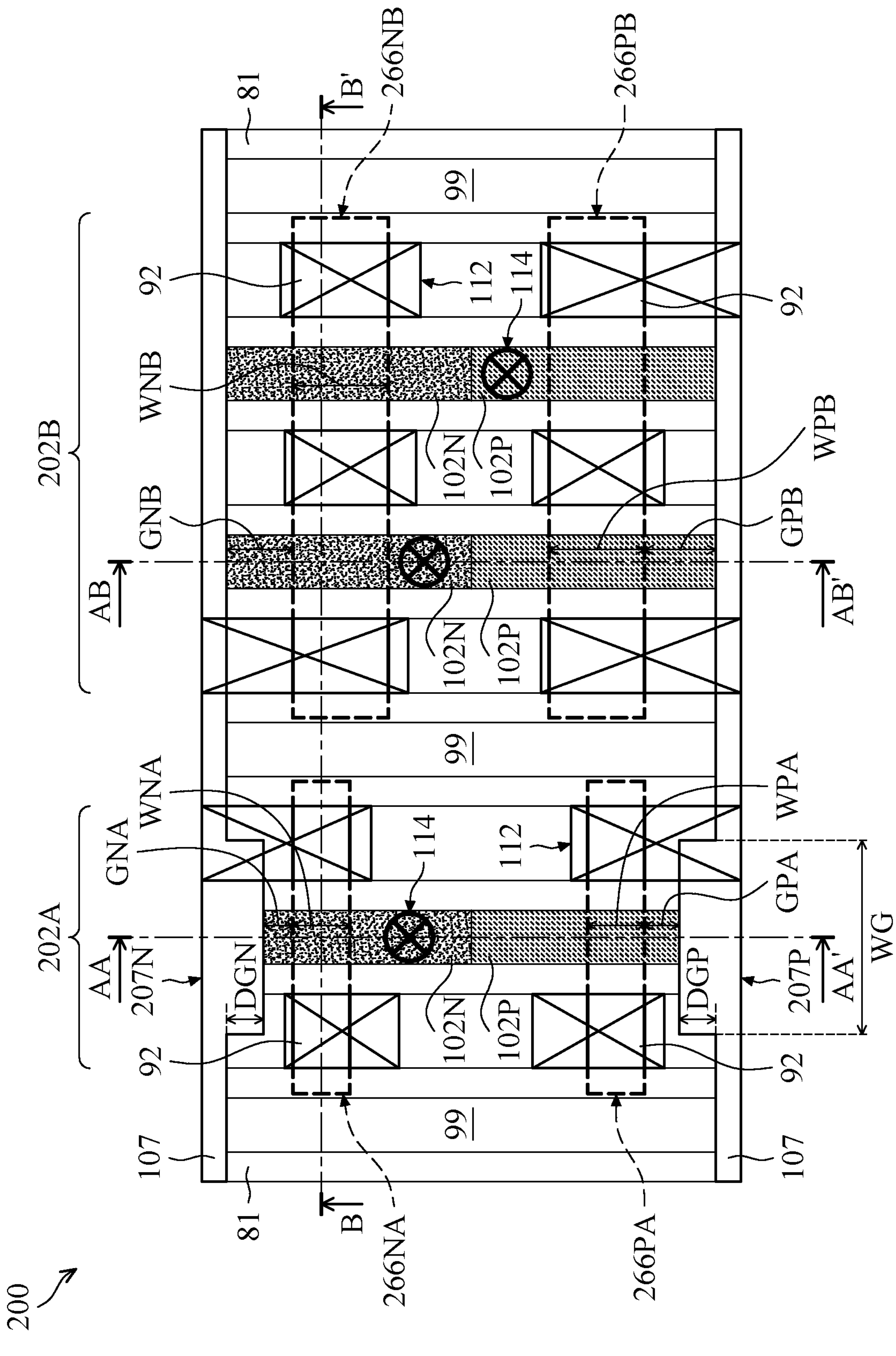
FIGS. 25, 26A, and 26B are a plan view and cross-sectional views of a device comprising nano-FETs, in accordance with some embodiments.
Figure 26A:
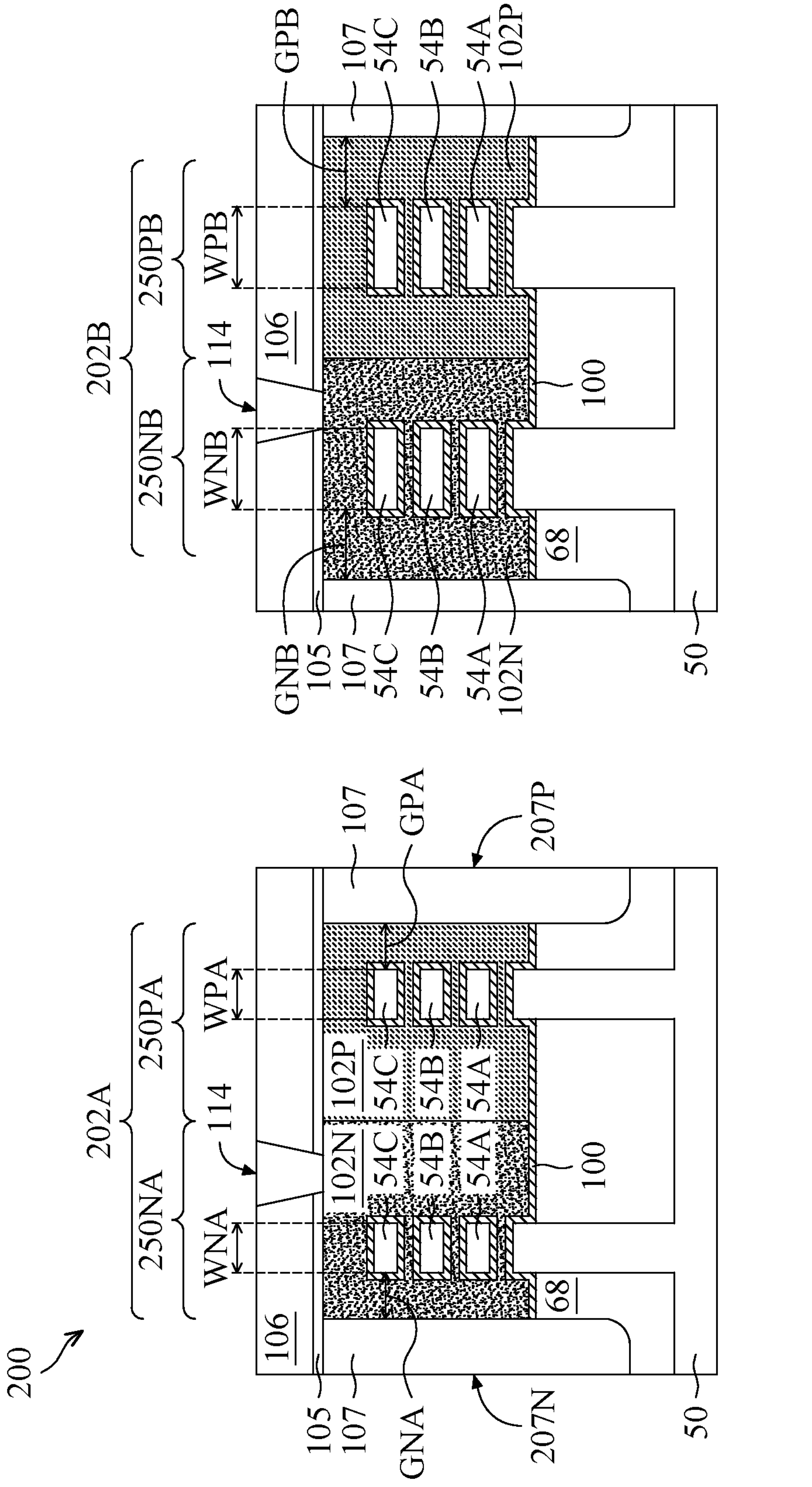
Figure 26B:
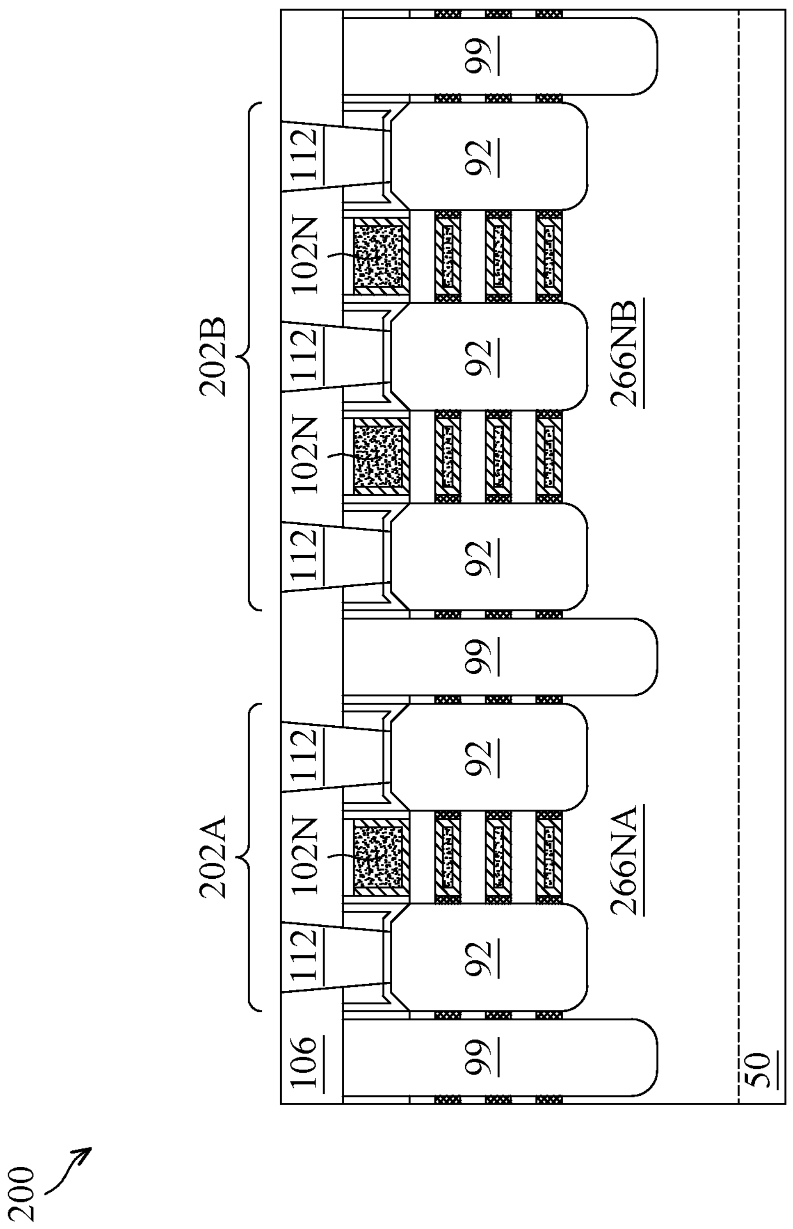

FIGS. 25, 26A, and 26B illustrate a plan view and cross-sectional views of a device 200, in accordance with some embodiments. The device 200 includes a first CMOS device 202A and a neighboring second CMOS device 202B. In some cases, the first CMOS device 202A may be considered a "first cell" of the device 200 and the second CMOS device 202B may be considered a "second cell" of the device 200. FIG. 25 illustrates a plan view (e.g., a "top down view") of the device 200, with some features omitted for clarity. FIG. 26A illustrates a cross-sectional view of first CMOS device 202A along cross-section AA-AA' and a cross-sectional view of second CMOS device 202B along cross-section AB-AB'. Cross-sections AA-AA' and AB-AB' are similar to the cross-section A-A' of FIG. 1. FIG. 26B illustrates a cross-sectional view of first CMOS device 202A and second CMOS device 202B along cross-section B-B', which is similar to the cross-section B-B' of FIG. 1.

The first CMOS device 202A includes n-type nano-FET 250NA and p-type nano-FET 250PA, and the second CMOS device 202B includes n-type nano-FETs 250NB and p-type nano-FETs 250PB, in accordance with some embodiments. The n-type nano-FET 250NA is formed on a fin 266NA and has a channel width WNA, and the p-type nano-FET 250PA is formed on a fin 266PA and has a channel width WPA. The n-type nano-FETs 250NB are formed on a fin 266NB and have a channel width WNB, and the p-type nano-FETs 250PB are formed on a fin 266PB and have a channel width WPB. In this manner, the channel widths WNA and WPA of the first CMOS device 202A are smaller than the channel widths WNB and WPB of the second CMOS device 202B. The channel widths WNA and WPA may be about the same width or different widths, and the channel widths WNB and WPB may be about the same width or different widths. In some embodiments, the fins 266NA and 266NB may be formed as a single fin structure that is "cut" by the isolation structure 99 that isolates the first CMOS device 202A from the second CMOS device 202B. The fins 266PA and 266PB may similarly be formed as a single fin structure that is subsequently "cut" by the isolation structure 99 into separate fins 66. In other embodiments, the first CMOS device 202A is isolated from the second CMOS device 202B by more than one isolation structure 99.

Within the first CMOS device 202A, the n-type nano-FET 250NA has a gate end distance GNA and the p-type nano-FET 250PA has a gate end distance GPA. Within the second CMOS device 202B, the n-type nano-FETs 250NB have a gate end distance GNB and the p-type nano-FETs 250PB have a gate end distance GPB. In other words, the gate end distances GNA and GPA of the first CMOS device 202A are smaller than the gate end distances GNB and GPB of the second CMOS device 202B, in some embodiments. In some embodiments, the gate end distances GNB and/or GPB may be between about 2 nm and about 20 nm larger than the gate end distances GNA and/or GPA. In this manner, because the channel widths of the first CMOS device 202A are smaller than the channel widths of the second CMOS device 202B, the performance of the device 200 may be improved by the use of different gate end distances, as described previously. The gate end distances GNA and GPA may be about the same distance or different distances, and the gate end distances GNB and GPB may be about the same distance or different distances.

The different gate end distances within the device 200 are achieved by forming gate cut regions 107 having offset regions 207. A larger offset region 207 of the gate cut region 107 corresponds to a smaller gate end distance. For example, the gate cut regions 107 of the first CMOS device 202A comprise offset regions 207N and 207P that protrude from the gate cut regions 107 of the second CMOS device 202B. The offset region 207N for the n-type nano-FET 250NA has an offset distance DGN (relative to the gate cut region 107 for the n-type nano-FETs 250NB), and the offset region 207P for the p-type nano-FET 250PA has an offset distance DGP (relative to the gate cut region 107 for the p-type nano-FETs 250PB). The offset distances DGN and DGP may be in the range of about 2 nm to about 20 nm, though other distances are possible. The offset distances DGN and DGP may be similar or different. An offset region 207 may have a width WG in the range of about 15 nm to about 900 nm. Other widths are possible. In some embodiments, the width WG may be similar to a width of the neighboring gate structure, or may be larger than a width of the neighboring gate structure, as shown in FIG. 25. In some cases, the offset regions 207 may be formed by forming the gate cut regions 107 with varying widths, such that offset regions 207 correspond to portions of the gate cut regions 107 having relatively larger widths. In other embodiments, the gate cut regions 107 of the second CMOS device 202B also have offset regions, but that have a smaller offset distance than the offset regions of the first CMOS device 202A.

Figure 27:
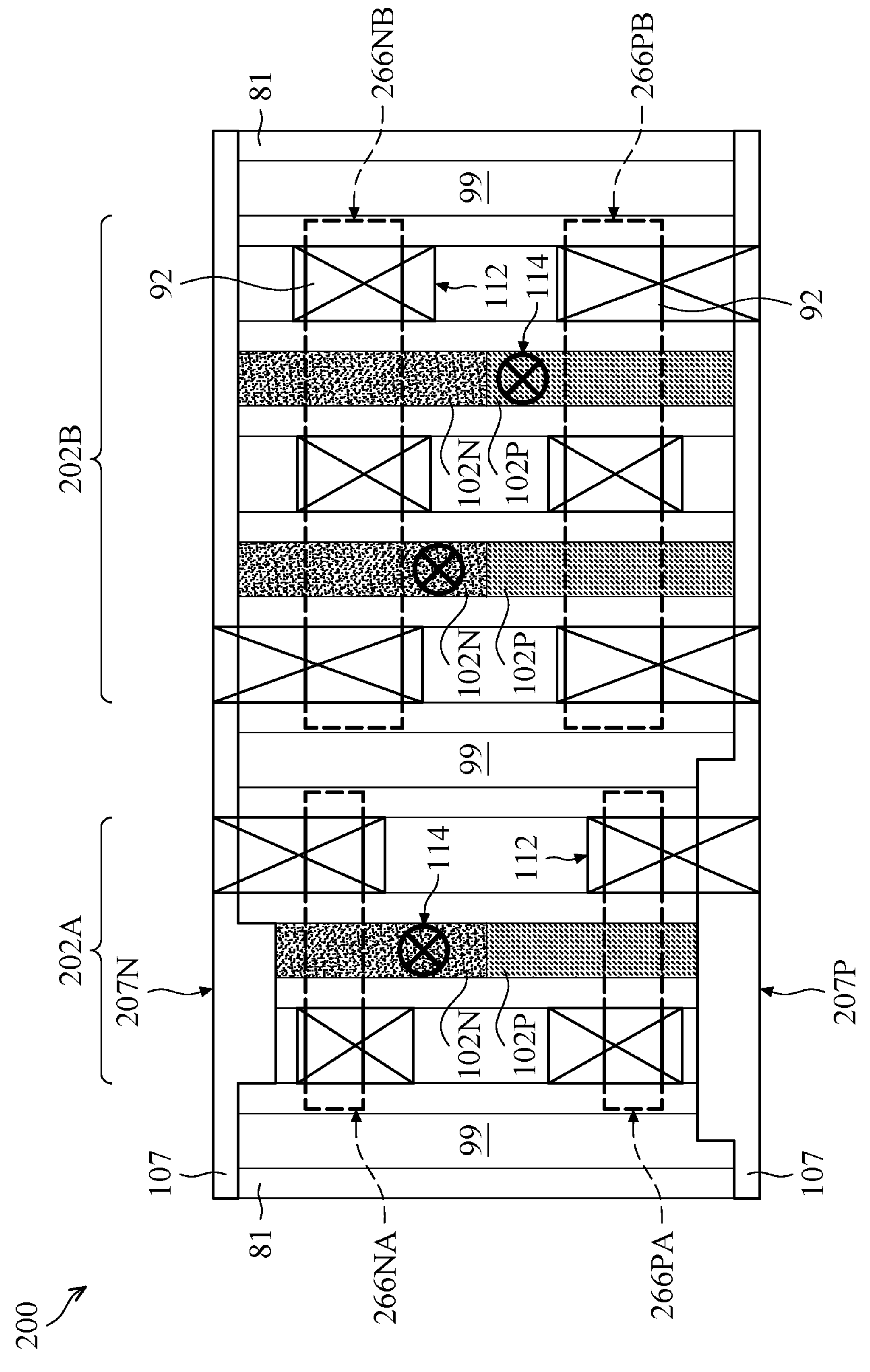
FIG. 27 is a plan view of a device comprising nano-FETs, in accordance with some embodiments.

FIG. 27 shows a plan view of a device 200 that is similar to the device 200 of FIG. 25, except that the offset regions 207 of the gate cut regions 107 have different locations, widths, and offset differences. The offset regions 207 of FIG. 27 are shown as an illustrative example, and other configurations, arrangements, or dimensions of offset regions 207 are possible. In FIG. 27, the offset region 207N is not centered on the gate structure. For example, one side of the offset region 207N is aligned with a sidewall of a first spacer 81 adjacent a gate structure, and the opposite side of the offset region 207N is aligned with a sidewall of a first spacer 81 adjacent an isolation structure 99. As another example, the offset region 207P is wide enough to extend partially into the neighboring isolation structures 99.

Figure 28:
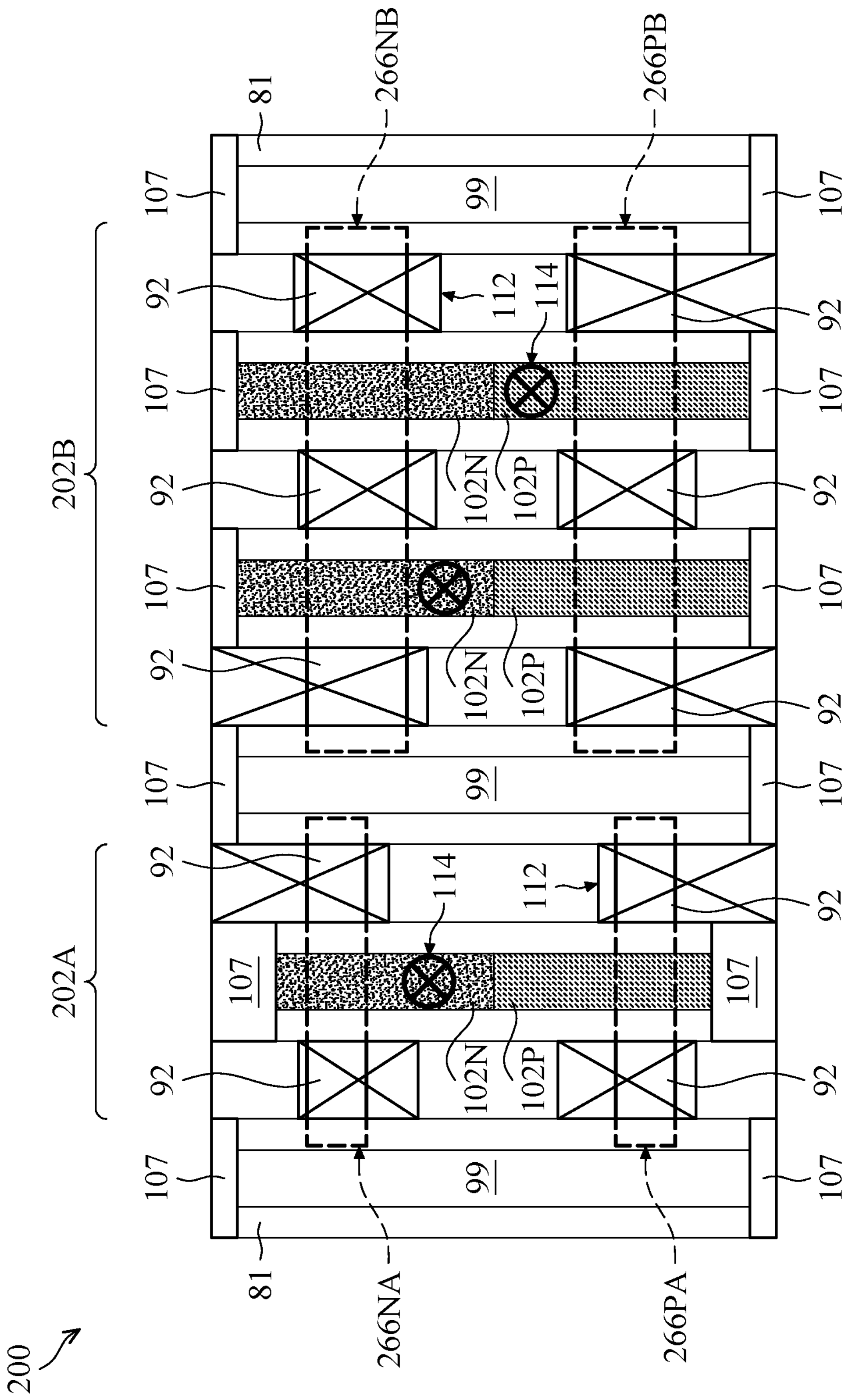
FIG. 28 is a plan view of a device comprising nano-FETs, in accordance with some embodiments.

FIG. 28 shows a plan view of a device 200 that is similar to the device 200 of FIG. 25, except that the gate cut regions 107 are formed as multiple sections rather than as a continuous structure. The individual gate cut regions 107 may have a different width than shown. For example, in other embodiments, sidewalls of the individual gate cut regions 107 may be covered by the first spacers 81 or may protrude beyond the first spacers 81. The gate end distances may be controlled by controlling the sizes of the individual gate cut regions 107. For example, as shown in FIG. 28, the gate cut regions 107 at the nano-FETs of the first CMOS device 202A are larger than the gate cut regions 107 at the nano-FETs of the second CMOS device 202B.

FIGS. 29, 30A-30B, and 31A-31B illustrate a plan view and cross-sectional views of a device 300, in accordance with some embodiments. The device 300 includes two first CMOS devices 302A and a neighboring second CMOS device 302B. The first CMOS devices 302A are separated from the second CMOS device 302B by two isolation structures 99, though in other embodiments more than two isolation structures 99 may be utilized. The first CMOS devices 302A are separated from each other by a gate cut region 107. In some cases, the first CMOS devices 302A and the second CMOS device 302B may be considered a "cells" of the device 300. In some embodiments, the length of the second CMOS device 302B along a direction parallel to the gate structures may be about twice the length of a first CMOS device 302A along the same direction, though other lengths are possible. In some embodiments, the nano-FETs of the first CMOS devices 302A have smaller channel widths and smaller gate end distances than the nano-FETs of the second CMOS device 302B.

Figure 29:
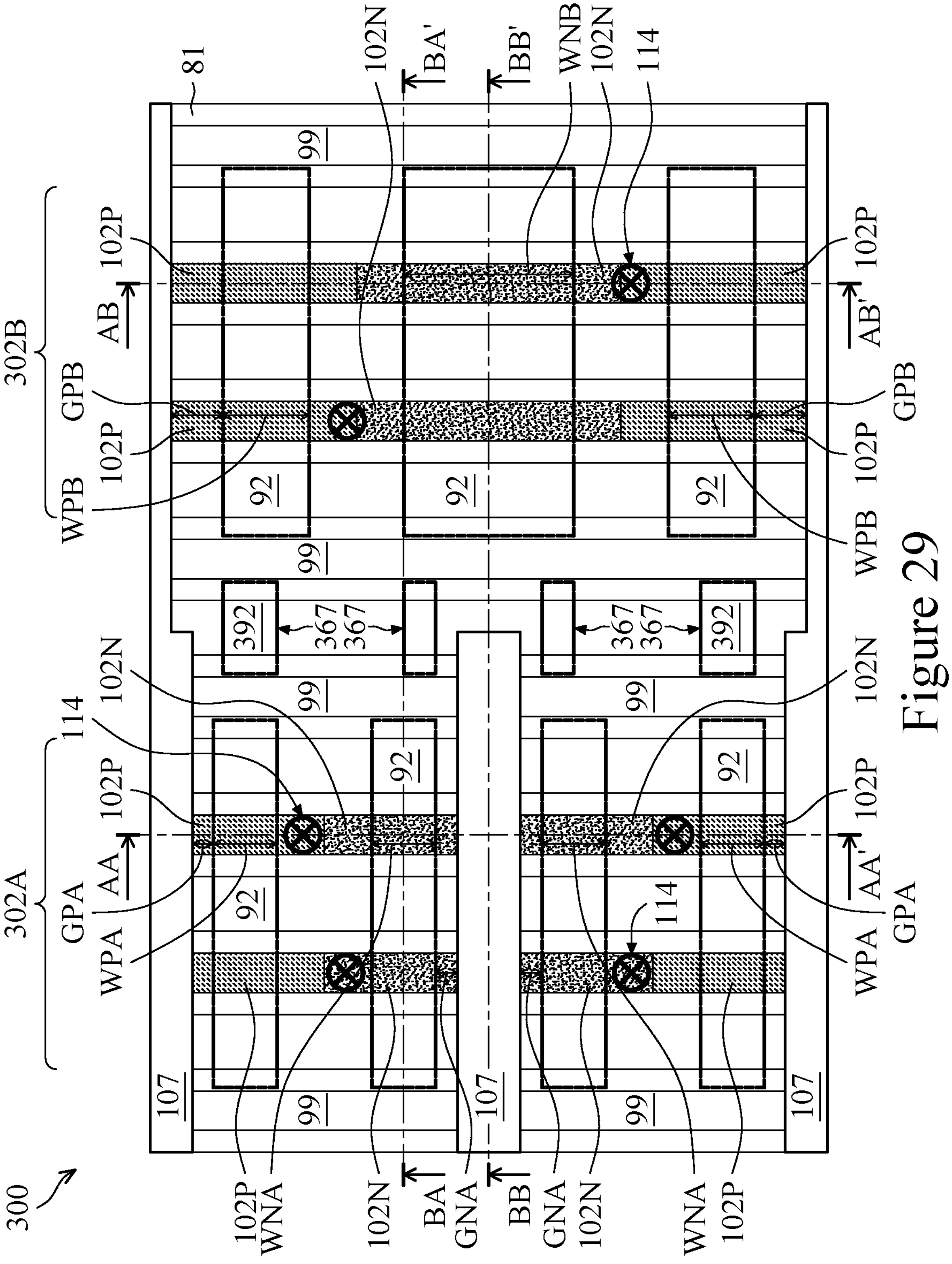
FIGS. 29, 30A, 30B, 31A, and 31B are a plan view and cross-sectional views of a device comprising nano-FETs, in accordance with some embodiments.
Figure 30A:
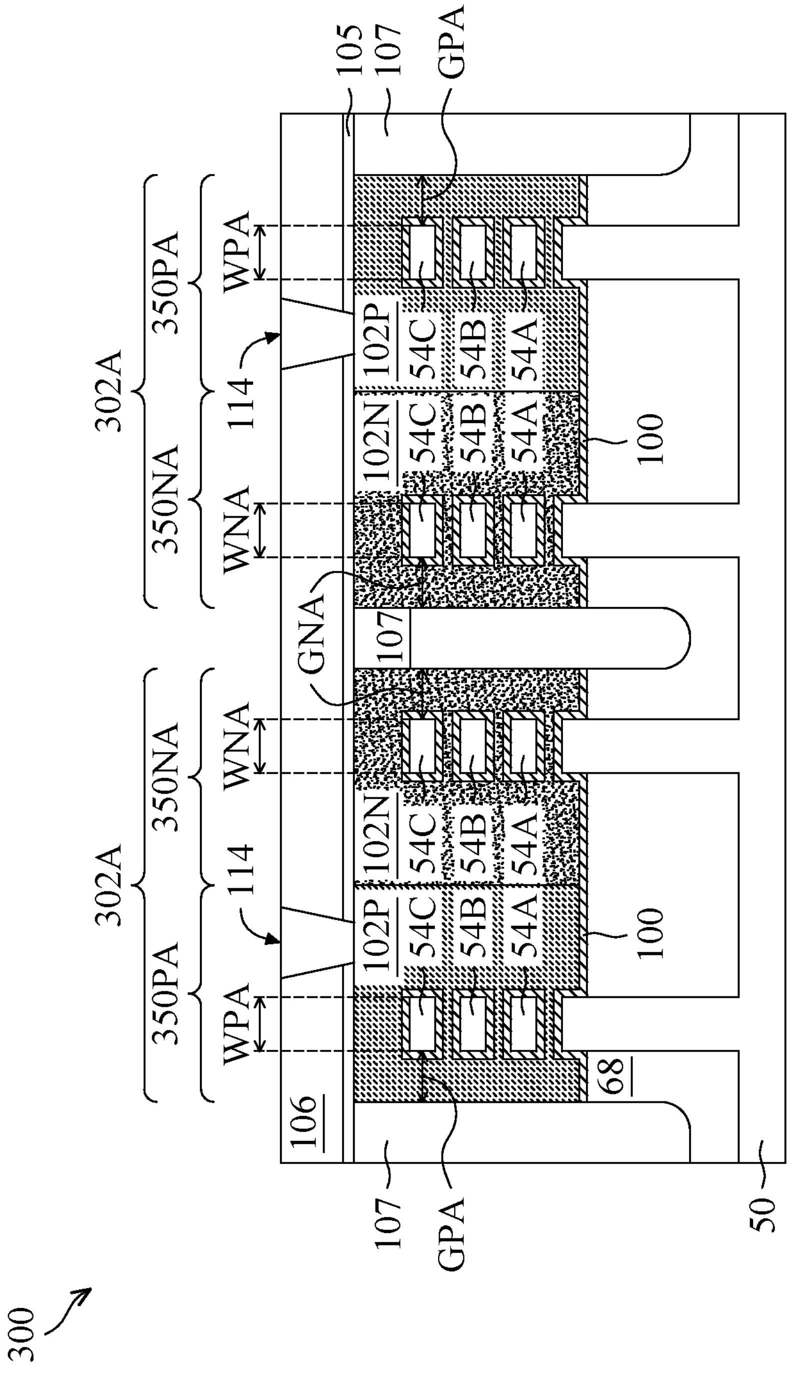
Figure 30B:
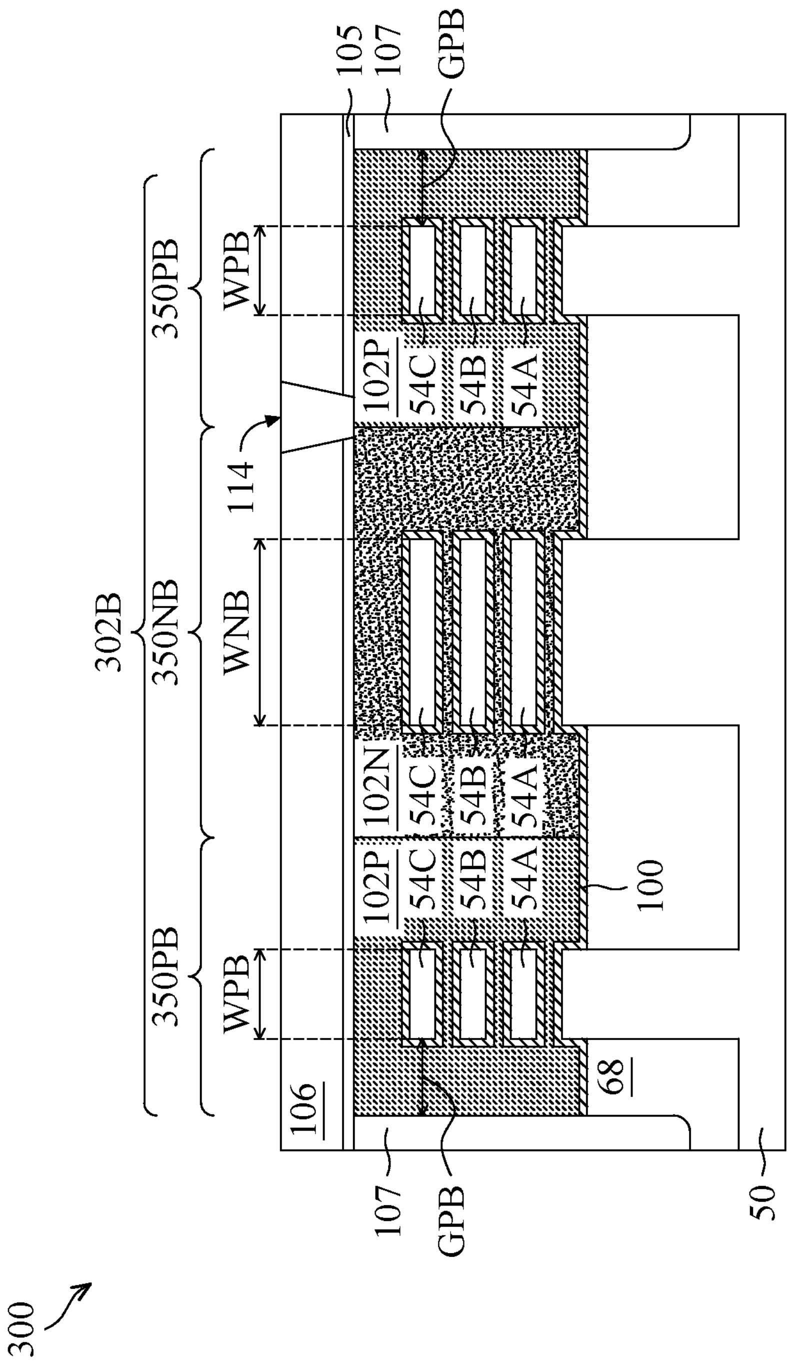

FIG. 29 illustrates a plan view (e.g., a "top down view") of the device 300, with some features omitted for clarity. FIG. 30A illustrates a cross-sectional view of the first CMOS devices 302A along cross-section AA-AA', and FIG. 30B illustrates a cross-sectional view of second CMOS device 302B along cross-section AB-AB'. Cross-sections AA-AA' and AB-AB' are similar to the cross-section A-A' of FIG. 1. FIG. 30A illustrates a cross-sectional view of a first CMOS device 302A and the second CMOS device 302B along cross-section BA-BA', and FIG. 30B illustrates a cross-sectional view of the second CMOS device 302B along cross-section BB-BB'. Cross-sections BA-BA' and BB-BB' are similar to the cross-section B-B' of FIG. 1.

The first CMOS devices 302A each include an n-type nano-FET 350NA and a p-type nano-FET 350PA, in accordance with some embodiments. The n-type nano-FETs 350NA have a channel width WNA, and the p-type nano-FETs 350PA have a channel width WPA. The channel widths WNA and WPA may be about the same width or different widths. The n-type nano-FETs 350NA have a gate end distance GNA and the p-type nano-FETs 350PA have a gate end distance GPA. The gate end distances GNA and GPA may be controlled by controlling the sizes and/or offsets of the various gate cut regions 107, in some embodiments.

The second CMOS device 302B includes n-type nano-FETs 350NB and p-type nano-FETs 350PB. Each n-type nano-FET 350NB is sandwiched between two p-type nano-FETs 350PB such that the gate structure of the n-type nano-FET 350NB is sandwiched between the gate structures of the p-type nano-FETs 350PB. In some cases, each n-type nano-FETs 350NB may be considered a single n-type nano-FET formed from two "merged" n-type nano-FETs. In this manner, in some cases, the second CMOS device 302B comprises a configuration of two "merged" n-type nano-FETs (e.g., n-type nano-FET 350NB) between two p-type nano-FETs, with the gate structures of the two "merged" n-type nano-FETs physically and electrically contacting the gate structures of the p-type nano-FETs.

The n-type nano-FETs 350NB have a channel width WNB, and the p-type nano-FETs 350PB have a channel width WPB. The channel widths WNB and WPB may be about the same width or different widths. The channel widths WNA and WPA of the first CMOS devices 302A are smaller than the channel widths WNB and WPB of the second CMOS device 302B. In some embodiments, the channel width WNB is greater than twice the channel width WNA or the channel width WPA. For example, in some embodiments, the channel width WNB may be in the range of about 1.2 times to about ten times the channel width WNA. In some embodiments, the channel width WNB is about twice the channel width WPB. Other proportions of channel widths are possible.

In the second CMOS device 302B, because the gate structure of each n-type nano-FET 350NB is between the gate structures of two p-type nano-FETs 350PB, only the p-type nano-FETs 350PB have a gate end distance GPB. In some embodiments, the gate end distance GPB is greater than the gate end distance GNA and/or the gate end distance GPA. In some embodiments, the gate end distance GPB may be between about 2 nm and about 20 nm larger than the gate end distances GNA and/or GPA. In this manner, because the channel widths of the first CMOS device 302A are smaller than the channel widths of the second CMOS device 302B, the performance of the device 300 may be improved by forming smaller gate end distances for the first CMOS device 302A than for the second CMOS device 302B.

Figure 31A:
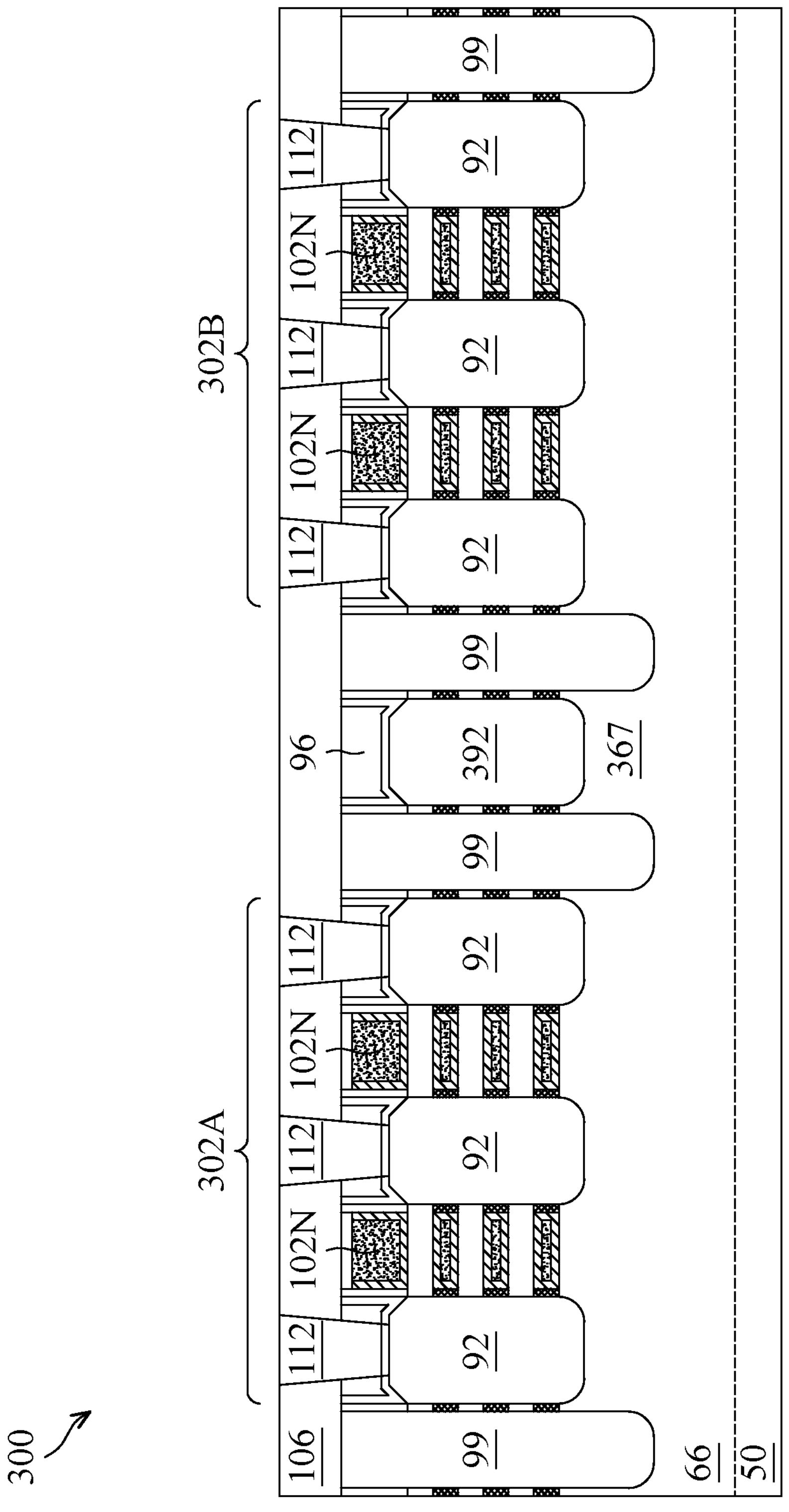
Figure 31B:
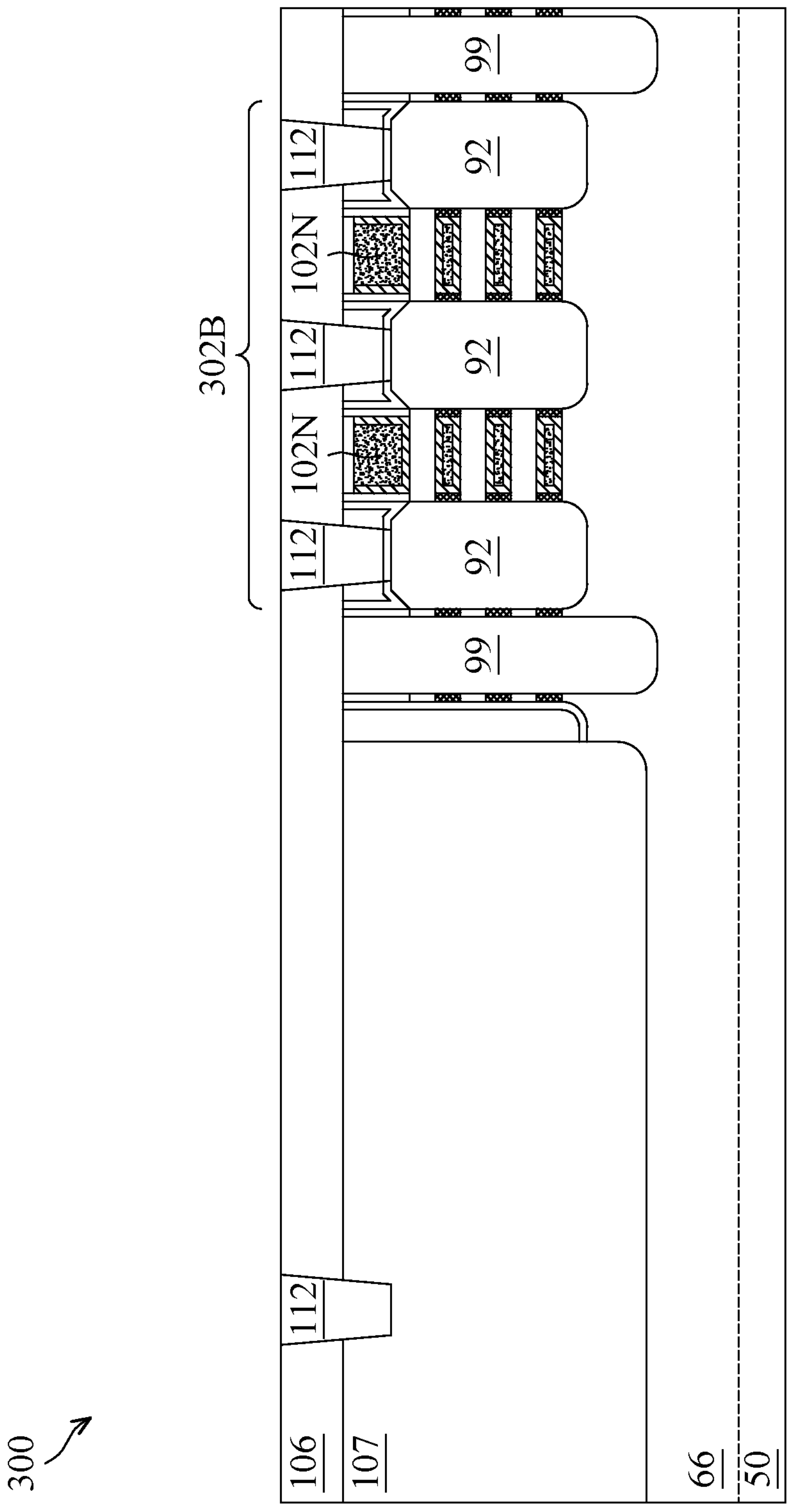

In some embodiments, the fins 66 of the device 300 may be formed as single fin structures that are "cut" by the isolation structures 99 that isolate the first CMOS devices 302A from the second CMOS device 302B. In some embodiments, dummy fins 367 and/or dummy epitaxial regions 392 may be formed between isolation structures 99. In other embodiments, the first CMOS devices 302A are isolated from the second CMOS device 302B by more than two isolation structures 99. In some cases, isolating adjacent CMOS devices with two or more isolation structures 99 can improve the electrical isolation of the CMOS devices and reduce leakage or parasitic capacitances. As shown in FIG. 31B, in some cases, a contact 112 may be formed in a gate cut region 107. The contact 112 may also extend on and electrically connect to one or more epitaxial source/drain regions 92 that are adjacent to the gate cut region 107.

Figure 32:
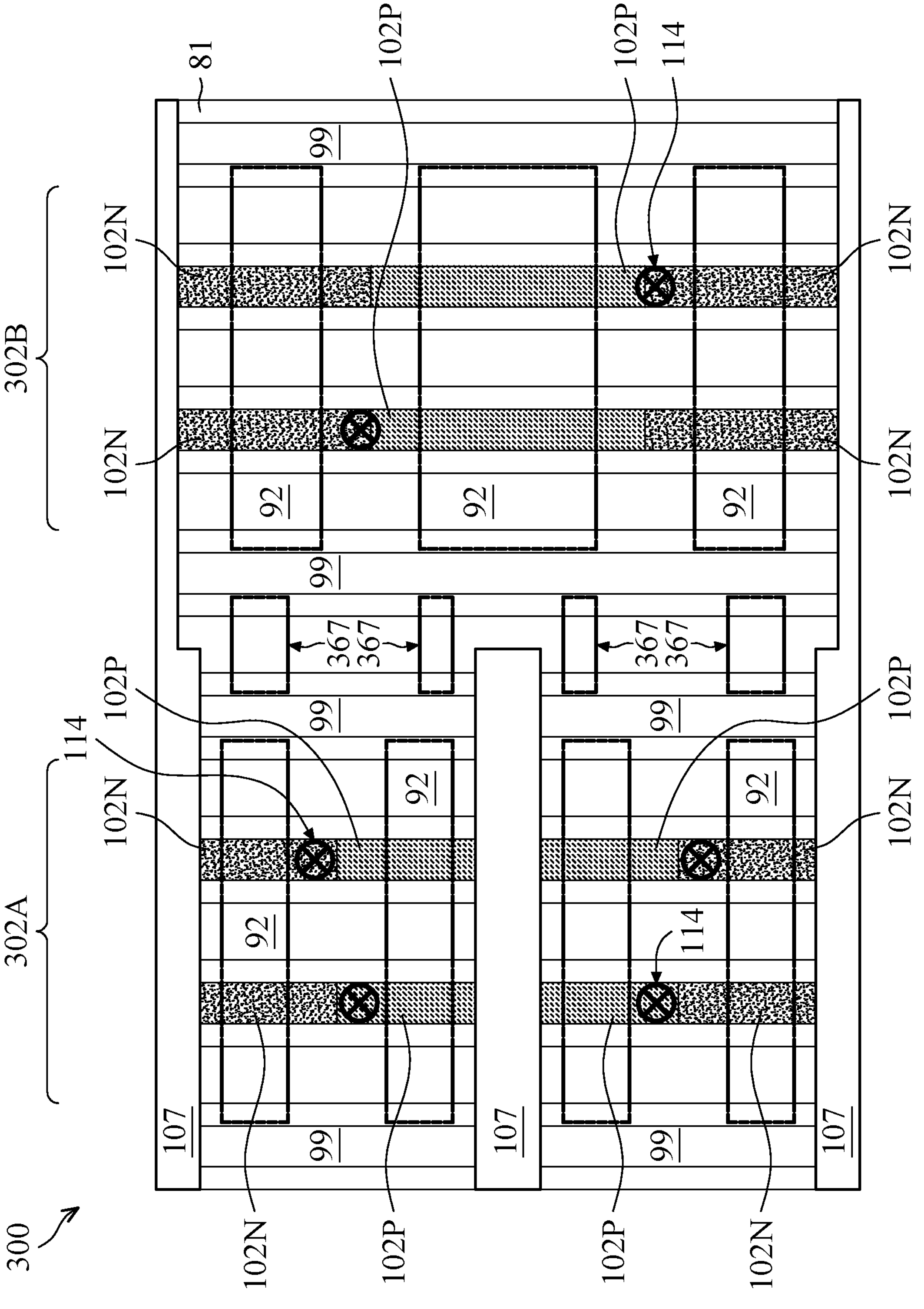
FIG. 32 is a plan view of a device comprising nano-FETs, in accordance with some embodiments.

FIG. 32 illustrates a plan view of a device 300, in accordance with some embodiments. The device 300 of FIG. 32 is similar to the device 300 of FIG. 29, except that the n-type nano-FETs have been changed to p-type nano-FETs and the p-type nano-FETs have been changed to n-type nano-FETs. For example, the second CMOS device 302B of FIG. 32 comprises p-type nano-FETs that are sandwiched between two n-type nano-FETs such that the gate structure of each p-type nano-FET is sandwiched between the gate structures of the n-type nano-FETs. In some cases, each p-type nano-FET of the second CMOS device 302B may be considered a single p-type nano-FET formed from two "merged" p-type nano-FETs. Other configurations are possible. In some embodiments, the nano-FETs of the first CMOS devices 302A have smaller channel widths and smaller gate end distances than the nano-FETs of the second CMOS devices 302B.

Figure 33:
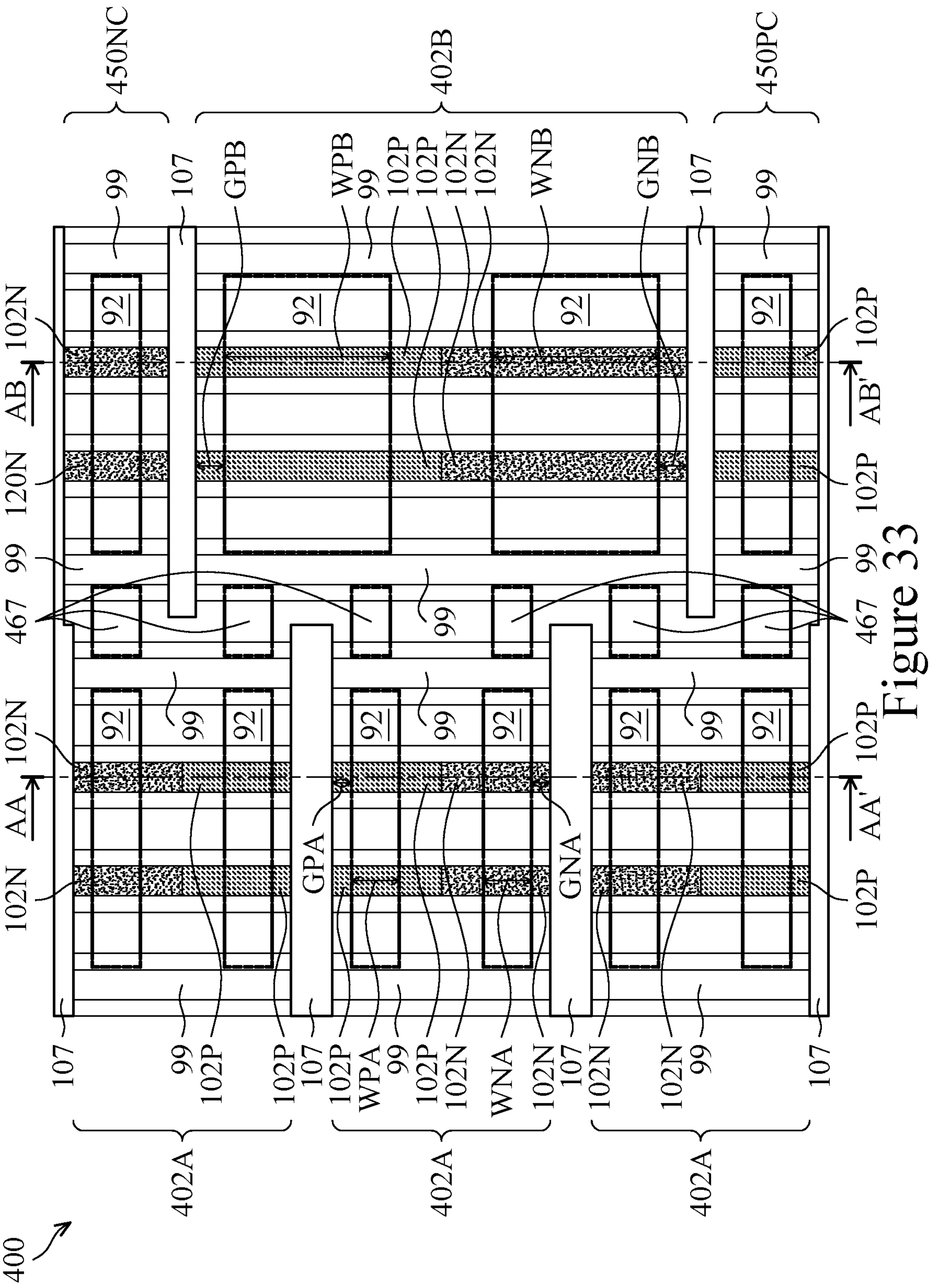
FIGS. 33, 34A, and 34B are a plan view and cross-sectional views of a device comprising nano-FETs, in accordance with some embodiments.
Figure 34A:
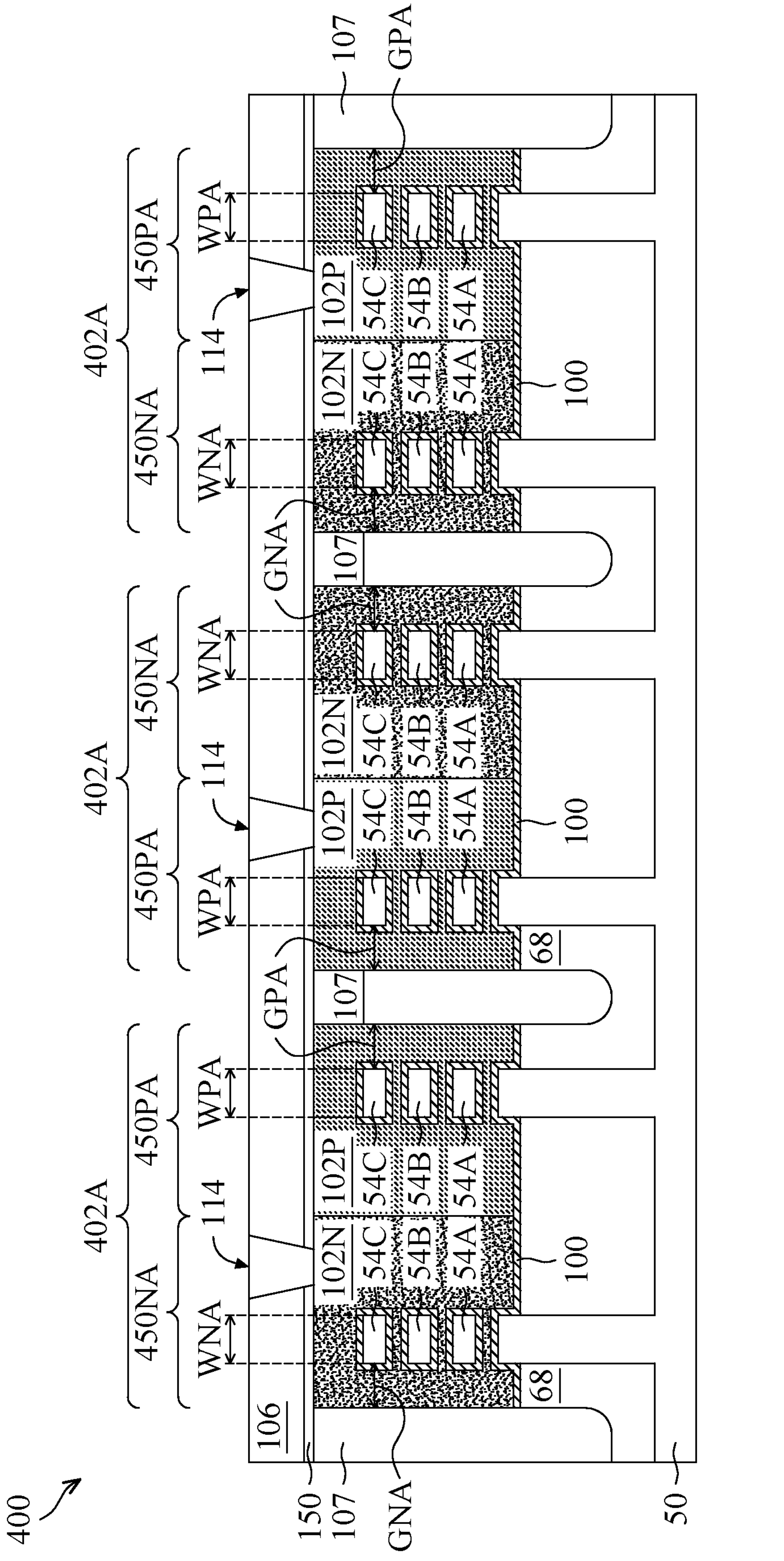
Figure 34B:
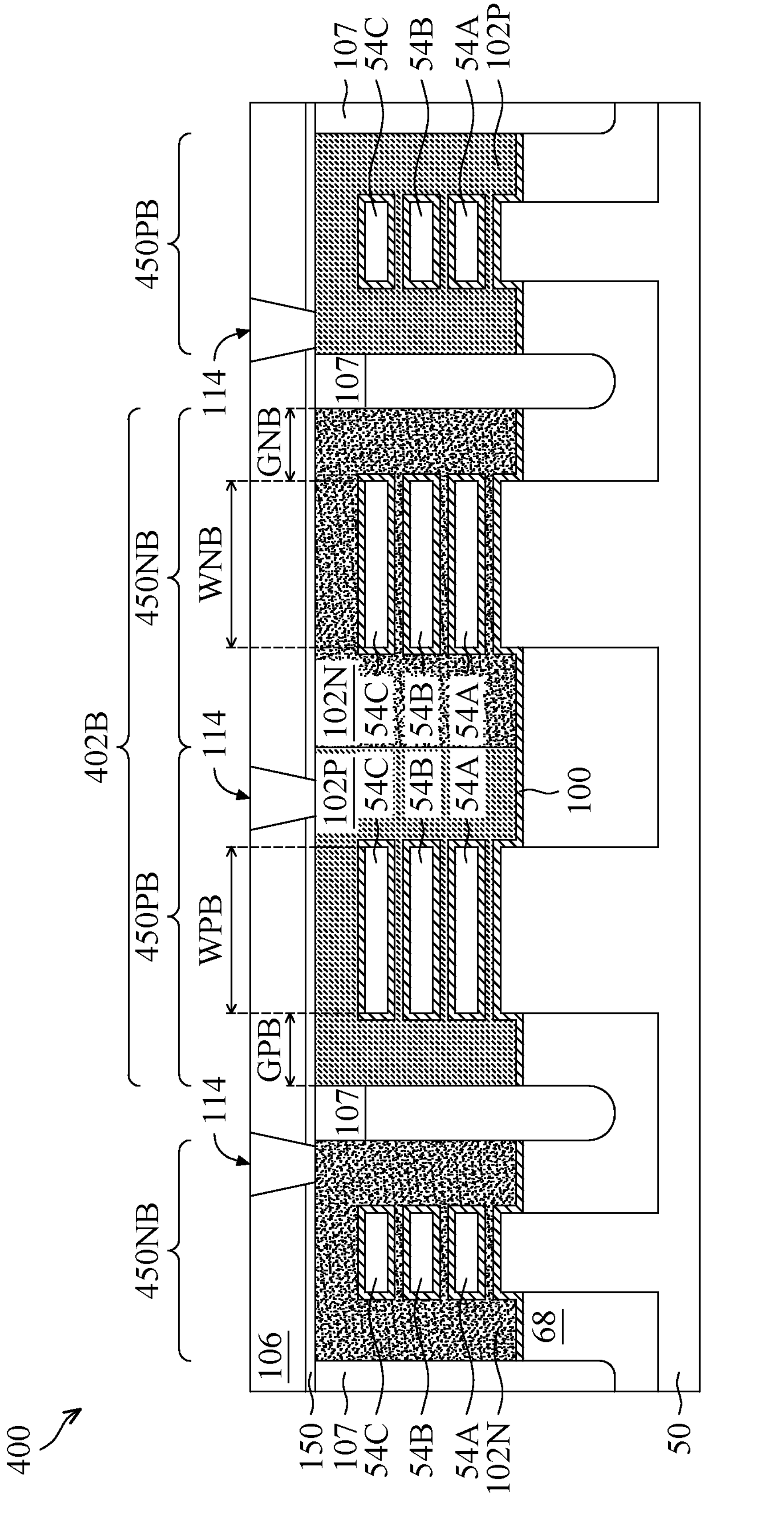

FIGS. 33 and 34A-34B illustrate a plan view and cross-sectional views of a device 400, in accordance with some embodiments. The device 400 includes three first CMOS devices 402A and a neighboring second CMOS device 402B. The device 400 also includes two individual nano-FETs 450C: an n-type nano-FET 450NC and a p-type nano-FET 450PC. The first CMOS devices 402A are separated from the second CMOS device 402B and the nano-FETs 450C by two isolation structures 99, though in other embodiments more than two isolation structures 99 may be utilized. The first CMOS devices 402A are separated from each other by gate cut regions 107, and the second CMOS device 402B is separated from the nano-FETs 450C by gate cut regions 107. In some embodiments, the nano-FETs of the first CMOS devices 402A have smaller channel widths and smaller gate end distances than the nano-FETs of the second CMOS device 402B.

FIG. 33 illustrates a plan view (e.g., a "top down view") of the device 400, with some features omitted for clarity. FIG. 34A illustrates a cross-sectional view of the first CMOS devices 402A along cross-section AA-AA', and FIG. 34B illustrates a cross-sectional view of second CMOS device 402B and nano-FETs 450C along cross-section AB-AB'. Cross-sections AA-AA' and AB-AB' are similar to the cross-section A-A' of FIG. 1.

The first CMOS devices 402A each include an n-type nano-FET 450NA and a p-type nano-FET 450PA, in accordance with some embodiments. The n-type nano-FETs 450NA have a channel width WNA, and the p-type nano-FETs 450PA have a channel width WPA. The channel widths WNA and WPA may be about the same width or different widths. The n-type nano-FETs 450NA have a gate end distance GNA and the p-type nano-FETs 450PA have a gate end distance GPA. The gate end distances GNA and GPA may be controlled by controlling the sizes and/or offsets of the various gate cut regions 107, in some embodiments.

The second CMOS device 402B includes n-type nano-FETs 450NB and p-type nano-FETs 450PB. In some cases, each n-type nano-FET 450NB may be considered a single n-type nano-FET formed from two "merged" n-type nano-FETs, and each p-type nano-FET 450PB may be considered a single p-type nano-FET formed from two "merged" p-type nano-FETs.

The n-type nano-FETs 450NB have a channel width WNB, and the p-type nano-FETs 450PB have a channel width WPB. The channel widths WNB and WPB may be about the same width or different widths. The channel widths WNA and WPA of the first CMOS devices 402A are smaller than the channel widths WNB and WPB of the second CMOS device 402B. In some embodiments, the channel width WNB or the channel width WPB is greater than three times the channel width WNA or the channel width WPA. For example, in some embodiments, the channel widths WNB and WPB may be in the range of about three to about ten times the channel widths WNA and WPA.

In the second CMOS device 402B, the n-type nano-FETs 450NB have a gate end distance GNB, and the p-type nano-FETs 450PB have a gate end distance GPB. In some embodiments, the gate end distances GMN and GPB are greater than the gate end distances GNA and GPA. In some embodiments, the gate end distances GNB and/or GPB may be between about 2 nm and about 20 nm larger than the gate end distances GNA and/or GPA. In this manner, because the channel widths of the first CMOS device 402A are smaller than the channel widths of the second CMOS device 402B, the performance of the device 400 may be improved by forming smaller gate end distances for the first CMOS device 402A than for the second CMOS device 402B.

In some embodiments, optional nano-FETs 450C (e.g., 450NC and 450PC) may be formed adjacent the second CMOS device 402B. In other embodiments, the nano-FETs 450C may have a different configuration or different dimensions than shown, or the nano-FETs 450C may be part of other devices such as other CMOS devices. In some embodiments, the nano-FETs 450C may have channel widths that are about the same as the nano-FETs of the first CMOS device 402A, though other channel widths are possible.

In some embodiments, the fins 66 of the device 400 may be formed as single fin structures that are "cut" by the isolation structures 99 that isolate the first CMOS devices 402A, the second CMOS device 402B, and the nano-FETs 450C. In some embodiments, dummy fins 467 and/or dummy epitaxial regions may be formed between isolation structures 99. In other embodiments, the first CMOS devices 402A are isolated from the second CMOS device 402B by more than two isolation structures 99. In some cases, isolating adjacent CMOS devices with two or more isolation structures 99 can improve the electrical isolation of the CMOS devices and reduce leakage or parasitic capacitances.

Figure 35:
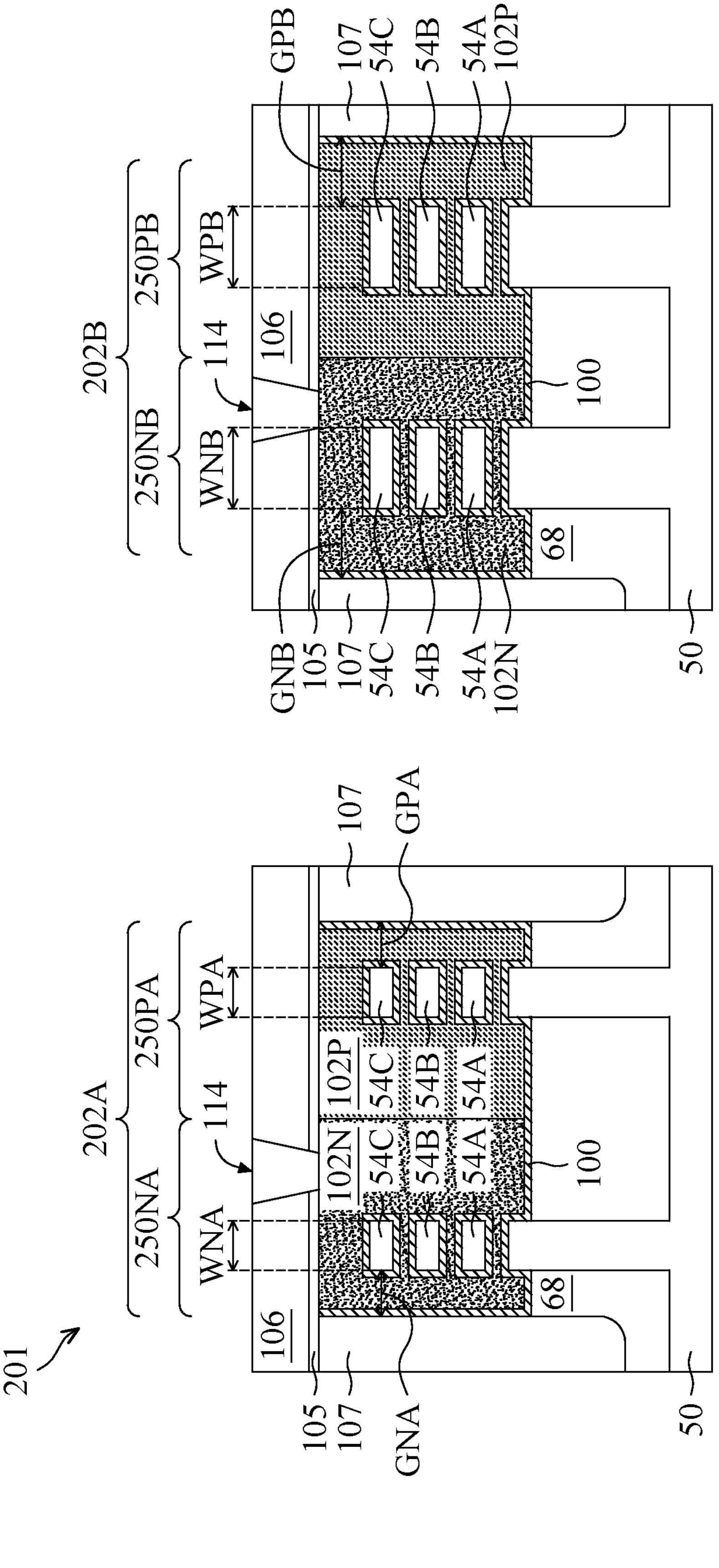
FIG. 35 is a cross-sectional view of a device comprising nano-FETs, in accordance with some embodiments.

FIG. 35 illustrates a cross-sectional view of a device 201 formed using a gate-last process, in accordance with some embodiments. The device 201 of FIG. 35 is similar to the device 200 of FIGS. 25-26B, except that the device 200 is formed using a gate-first process and the device 201 is formed using a gate-last process. The cross-sectional view of FIG. 35 is similar to the cross-sectional view of FIG. 26A. For example, in a gate-last process, the gate cut regions 107 of the device 201 may be formed before the replacement gate structures are formed. Because the gate cut regions 107 are formed before the replacement gate structures, the gate dielectric layers 100 may be deposited on sidewalls of the gate cut regions 107, as shown in FIG. 36. The devices, CMOS devices, or nano-FETs described herein may be formed using a gate-last process, in some embodiments.

Embodiments may achieve advantages. For example, embodiments described herein allow for the formation of nano-FETs having both narrower and wider widths within a device or circuit array, with improved performance, such as improved speed, improved current, reduced leakage, or reduced power consumption. Embodiments described herein include a variable gate end cutting scheme that allows the gate structures of different nano-FETs in the same device to have different gate end distances based on the characteristics of the nano-FETs. For example, nano-FETs having a narrow channel width can have a smaller gate end distance to reduce capacitance and improve speed, and nano-FETs having a wide channel width can have a larger gate end distance to reduce resistance and improve drive current. Techniques Embodiments described herein allow for the formation of nano-FETs in a CMOS configuration. In this manner, embodiments described herein allow for improved performance of nano-FETs having a large range of channel widths within the same device.

In some embodiments of the present disclosure, a device includes a stack of first nanostructures on a substrate, wherein each first nanostructure includes a channel region having a first width; a first gate structure on the stack of first nanostructures, wherein each first nanostructure is surrounded by the first gate structure, wherein a distance from a first end of the first gate structure to an adjacent first nanostructure is a first distance; a stack of second nanostructures on the substrate, wherein each second nanostructure includes a channel region having a second width that is greater than the first width; a second gate structure on the stack of second nanostructures, wherein each second nanostructure is surrounded by the second gate structure, wherein a distance from a first end of the second gate structure to an adjacent second nanostructure is a second distance that is greater than the first distance; and a first isolation structure extending continuously from the first end of the first gate structure to the first end of the second gate structure. In an embodiment, the second distance is between 2 nm and 20 nm greater than the first distance. In an embodiment, the first gate structure and the second gate structure are on the same side of the first isolation structure. In an embodiment, the device includes a second isolation structure between the first gate structure and the second gate structure, wherein the second isolation structure is a dummy gate structure. In an embodiment, the second width is between 1.1 and 10 times the first width. In an embodiment, the device includes a stack of third nanostructures, wherein each third nanostructure is surrounded by the second gate structure, wherein a distance from a second end of the second gate structure to an adjacent third nanostructure is a third distance that is greater than the first distance. In an embodiment, the stack of second nanostructures is doped n-type and the stack of third nanostructures is doped p-type. In an embodiment, the first gate structure extends in a first direction and the first isolation structure extends in a second direction that is perpendicular to the first direction. In an embodiment, a first portion of the first isolation structure at the first end of the first gate structure protrudes from a second portion of the first isolation structure at the first end of the second gate structure.

In some embodiments of the present disclosure, a semiconductor device includes a first CMOS device including a first nanostructure, wherein the first nanostructure is a first type and has a first width; a second nanostructure adjacent a first side of the first nanostructure, wherein the second nanostructure is a second type and has a second width that is less than the first width; a third nanostructure adjacent a second side of the first nanostructure, wherein the second nanostructure is the second type and has the second width; and a first gate structure extending over and surrounding the first nanostructure, the second nanostructure, and the third nanostructure; a second CMOS device adjacent the first CMOS device, the second CMOS device including a fourth nanostructure having a third width that is less than the second width; and a second gate structure extending over and surrounding third nanostructure; isolation structures separating the first gate structure from the second gate structure; and a gate end isolation region physically contacting the first gate structure and the second gate structure, wherein the gate end isolation region is adjacent the second nanostructure and the fourth nanostructure, wherein a first distance from the second nanostructure to the gate end isolation region is greater than a second distance from the fourth nanostructure to the gate end isolation region. In an embodiment, the gate end isolation region extends below the first gate structure and the second gate structure a depth in the range of 10 nm to 150 nm. In an embodiment, the first type is n-type and the second type is p-type. In an embodiment, the fourth nanostructure is the second type. In an embodiment, the first width is at least twice the third width. In an embodiment, the isolation structures are parallel to the first gate structure and the second gate structure. In an embodiment, the semiconductor device includes a dummy fin between respective pairs of adjacent isolation structures.

In some embodiments of the present disclosure, a method includes forming a first fin structure on a substrate, wherein a first portion of the fin structure has a first width and a second portion of the fin structure has a second with that is larger than the first width; forming a first nanostructure on a first portion of the fin and a second nanostructure on the second portion of the fin; forming a first isolation structure perpendicular to the fin structure, wherein the first isolation structure separates the first portion of the fin from the second portion of the fin; forming a first gate stack on the first nanostructure and a second gate stack on the second nanostructure; and forming a second isolation structure comprising a first region in the first gate stack and a second region in the second gate stack, wherein the first region is a first distance from the first portion of the fin and the second region is a second distance from the second portion of the fin, wherein the first distance is less than the second distance. In an embodiment, the second isolation structure is parallel to the fin structure. In an embodiment, the first isolation structure includes a first dielectric material and the second isolation structure includes a second dielectric material that is different from the first dielectric material. In an embodiment, the method includes forming a third nanostructure on the second portion of the fin adjacent the second nanostructure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device, comprising:

a first stack of first nanostructures on a substrate, wherein the first stack extends lengthwise along a first direction and each first nanostructure comprises a channel region having a first width along a second direction different than the first direction;

a first gate structure on the first stack of first nanostructures, wherein each first nanostructure is surrounded by the first gate structure, wherein a distance from a first end of the first gate structure to an adjacent first nanostructure along the second direction is a first distance;

a second stack of second nanostructures on the substrate, wherein the second stack extends lengthwise along the first direction, the second stack and the first stack are arranged end-to-end along the first direction, and each second nanostructure comprises a channel region having a second width along the second direction that is greater than the first width;

a second gate structure on the second stack of second nanostructures, wherein each second nanostructure is surrounded by the second gate structure, wherein a distance from a second end of the second gate structure to an adjacent second nanostructure along the second direction is a second distance that is greater than the first distance; and a first isolation structure extending lengthwise along the first direction, and extending continuously from the first end of the first gate structure to the second end of the second gate structure, wherein the first end and the second end face in a same direction.

2. The device of claim 1, wherein the second distance is between 2 nm and 20 nm greater than the first distance.

3. The device of claim 1, wherein the first gate structure and the second gate structure are on the same side of the first isolation structure.

4. The device of claim 1 further comprising a second isolation structure between the first gate structure and the second gate structure, wherein the second isolation structure is a dummy gate structure.

5. The device of claim 1, wherein the second width is between 1.1 and 10 times the first width.

6. The device of claim 1 further comprising a stack of third nanostructures, wherein each third nanostructure is surrounded by the second gate structure, wherein a distance from a second end of the second gate structure to an adjacent third nanostructure is a third distance that is greater than the first distance.

7. The device of claim 6, wherein the stack of second nanostructures is doped n-type and the stack of third nanostructures is doped p-type.

8. The device of claim 1, wherein the first gate structure extends in the second direction.

9. The device of claim 1, wherein a first portion of the first isolation structure at the first end of the first gate structure protrudes from a second portion of the first isolation structure at the second end of the second gate structure.

10. A semiconductor device, comprising:

a first CMOS device, comprising:

a first nanostructure extending lengthwise along a first direction, wherein the first nanostructure is a first type and has a first width along a second direction different than the first direction;

a second nanostructure adjacent a first side of the first nanostructure along the second direction, wherein the second nanostructure is a second type and has a second width along the second direction that is less than the first width;

a third nanostructure adjacent a second side of the first nanostructure along the second direction, wherein the third nanostructure is the second type and has the second width, and the first side and the second side face in opposite directions; and a first gate structure extending over and surrounding the first nanostructure, the second nanostructure, and the third nanostructure;

a second CMOS device adjacent the first CMOS device, the second CMOS device comprising:

a fourth nanostructure extending lengthwise along the first direction, being adjacent the second nanostructure along the first direction, and having a third width along the second direction that is less than the second width; and a second gate structure extending over and surrounding the fourth nanostructure;

a plurality of isolation structures separating the first gate structure from the second gate structure; and a gate end isolation region physically contacting a first sidewall of the first gate structure and a second sidewall of the second gate structure, wherein the gate end isolation region is adjacent the second nanostructure and the fourth nanostructure, wherein a first distance from the second nanostructure to the gate end isolation region is greater than a second distance from the fourth nanostructure to the gate end isolation region, and the first sidewall and the second sidewall face in a same direction.

11. The semiconductor device of claim 10, wherein the gate end isolation region extends below the first gate structure and the second gate structure a depth in the range of 10 nm to 150 nm.

12. The semiconductor device of claim 10, wherein the first type is n-type and the second type is p-type.

13. The semiconductor device of claim 10, wherein the fourth nanostructure is the second type.

14. The semiconductor device of claim 10, wherein the first width is at least twice the third width.

15. The semiconductor device of claim 10, wherein the plurality of isolation structures are parallel to the first gate structure and the second gate structure.

16. The semiconductor device of claim 10 further comprising a dummy fin between respective pairs of adjacent isolation structures of the plurality of isolation structures.

17. A device comprising:

a fin extending lengthwise in a first direction, protruding from a substrate along a second direction different than the first direction, and comprising:

a first portion extending lengthwise in the first direction and having a first width along a third direction different than the first direction and the second direction; and a second portion extending lengthwise in the first direction and having a second width along the third direction that exceeds the first width, wherein the first portion and the second portion are arranged end-to-end along the first direction;

a first nanostructure on the first portion of the fin;

a second nanostructure on the second portion of the fin;

a first isolation structure extending in the second direction, the first isolation structure separating the first portion of the fin from the second portion of the fin along the first direction;

a first gate stack on the first nanostructure;

a second gate stack on the second nanostructure; and a second isolation structure extending lengthwise along the first direction and comprising:

a first region in the first gate stack; and a second region in the second gate stack;

wherein a first sidewall of the first region is separated from the first portion of the fin by a first distance, and a second sidewall of the second region is separated from the second portion of the fin by a second distance, wherein the second distance exceeds the first distance and the first sidewall and the second sidewall face in a same direction.

18. The device of claim 17, wherein the second isolation structure extends continuously in the first direction from a first position adjacent the first portion of the fin to a second position adjacent the second portion of the fin.

19. The device of claim 17, wherein the first isolation structure comprises a first dielectric material and the second isolation structure comprises a second dielectric material that is different from the first dielectric material.

20. The device of claim 17, further comprising a third nanostructure on the second portion of the fin and adjacent the second nanostructure.

* * * * *